United States Patent
Kyogoku et al.

(10) Patent No.: US 7,262,480 B2
(45) Date of Patent: Aug. 28, 2007

(54) SEMICONDUCTOR DEVICE, AND METHOD AND APPARATUS FOR MANUFACTURING SEMICONDUCTOR DEVICE

(75) Inventors: Toshihiko Kyogoku, Komoro (JP); Tadashi Kodu, Saku (JP); Kiyoharu Mochiduki, Komoro (JP); Sakae Kikuchi, Yachiho (JP); Akio Ishidu, Maruko (JP); Yoshihiko Kobayashi, Tateshina (JP); Masashi Maruyama, Komoro (JP); Iwamichi Kojiro, Komoro (JP); Susumu Sato, Komoro (JP)

(73) Assignees: Hitachi, Ltd., Tokyo (JP); Eastern Japan Semiconductor Technologies, Tokyo (JP); Akita Electronics Co., Ltd., Akita (JP)

( * ) Notice: Subject to any disclaimer, the term of this patent is extended or adjusted under 35 U.S.C. 154(b) by 146 days.

(21) Appl. No.: 10/433,986

(22) PCT Filed: Mar. 21, 2001

(86) PCT No.: PCT/JP01/02224

§ 371 (c)(1),
(2), (4) Date: Oct. 22, 2003

(87) PCT Pub. No.: WO02/052589

PCT Pub. Date: Jul. 4, 2002

(65) Prior Publication Data

US 2004/0075515 A1    Apr. 22, 2004

(30) Foreign Application Priority Data

Dec. 25, 2000  (WO) .................. PCT/JP00/09206

(51) Int. Cl.
*H01L 29/00* (2006.01)

(52) U.S. Cl. ................................................ 257/531
(58) Field of Classification Search ................ 524/403; 438/106; 361/782, 277; 205/122; 257/531
See application file for complete search history.

(56) References Cited

U.S. PATENT DOCUMENTS 6,023,406 A * 2/2000 Kinoshita et al. ........... 361/277

(Continued)

FOREIGN PATENT DOCUMENTS

JP        6-64743         3/1994

(Continued)

OTHER PUBLICATIONS

Matsushita Technical Journal, vol. 45, No. 4, Aug. 1999, pp. 86-90 (with English Abstract).

*Primary Examiner*—Carl Whitehead, Jr.
*Assistant Examiner*—Monica D. Harrison
(74) *Attorney, Agent, or Firm*—Mattingly, Stanger, Malur & Brundidge, P.C.

(57) ABSTRACT

A high frequency power amplifying device has two amplifying lines. Each amplifying line has a configuration in which a plurality of amplifying stages are connected in cascade having two source voltage terminals, of which one is connected to the first amplifying stage of one amplifying line and to the remaining amplifying stages of the other amplifying line, and the other, to the first amplifying stage of the latter amplifying line and to the remaining amplifying stages of the former amplifying line. An air core coil with a low D.C. resistance, formed by spirally winding a copper wire of about 0.1 mm in diameter, is connected in series between the final amplifying stage of each amplifying line and the source voltage terminal.

6 Claims, 33 Drawing Sheets

U.S. PATENT DOCUMENTS 6,346,564 B1 *  2/2002  Kubota et al. .............. 524/403

FOREIGN PATENT DOCUMENTS

| JP | 6-204038 | 7/1994 |
| JP | 7-154159 | 6/1995 |
| JP | 10-98295 | 4/1998 |
| JP | 3059461 | 3/1999 |
| JP | 11-274795 | 10/1999 |
| JP | 2000-151310 | 5/2000 |
| JP | 2000-183590 | 6/2000 |
| JP | 2000-196292 | 7/2000 |
| JP | 2000-269831 | 9/2000 |
| JP | 2000-299548 | 10/2000 |
| JP | 2002-170710 | 6/2002 |

* cited by examiner

FIG. 12
(a)
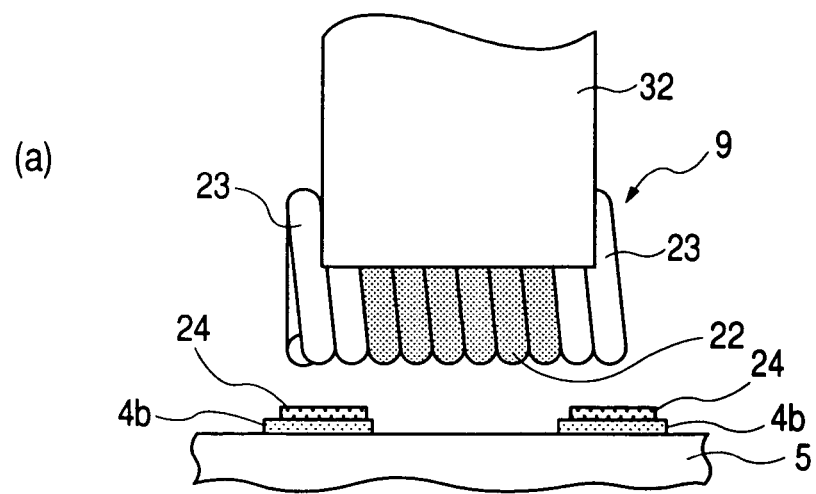
(b)
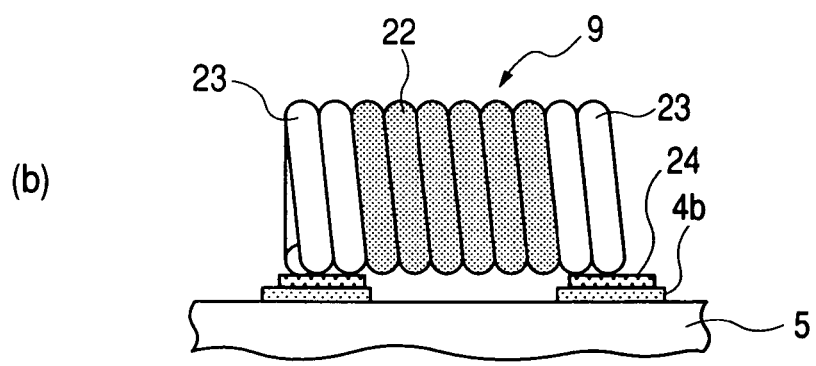
(c)
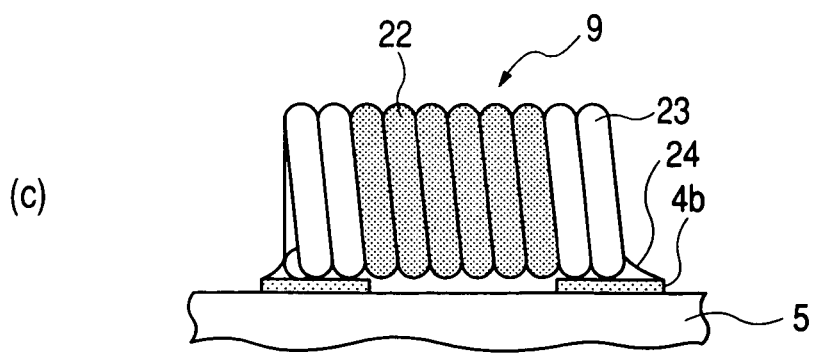

FIG. 31
(a)
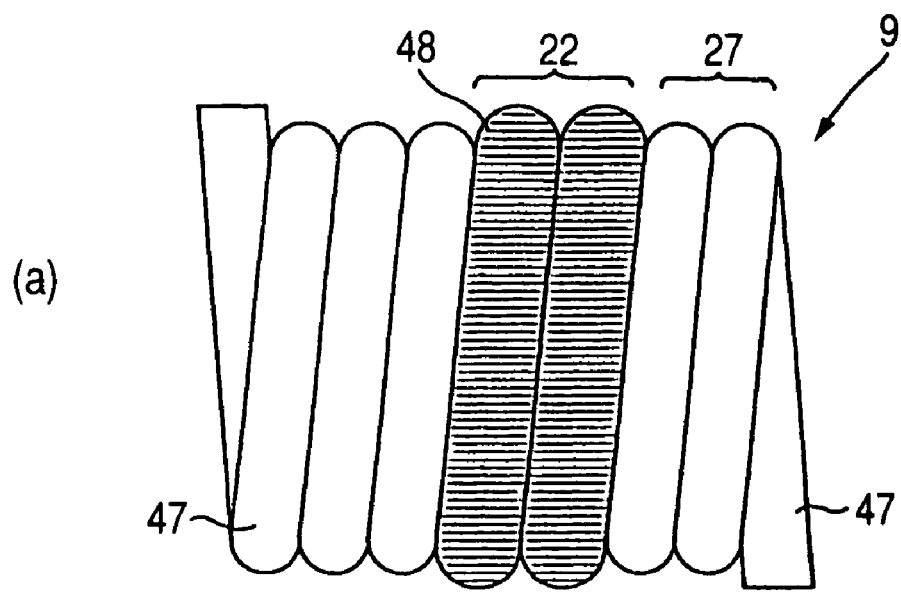
(b)
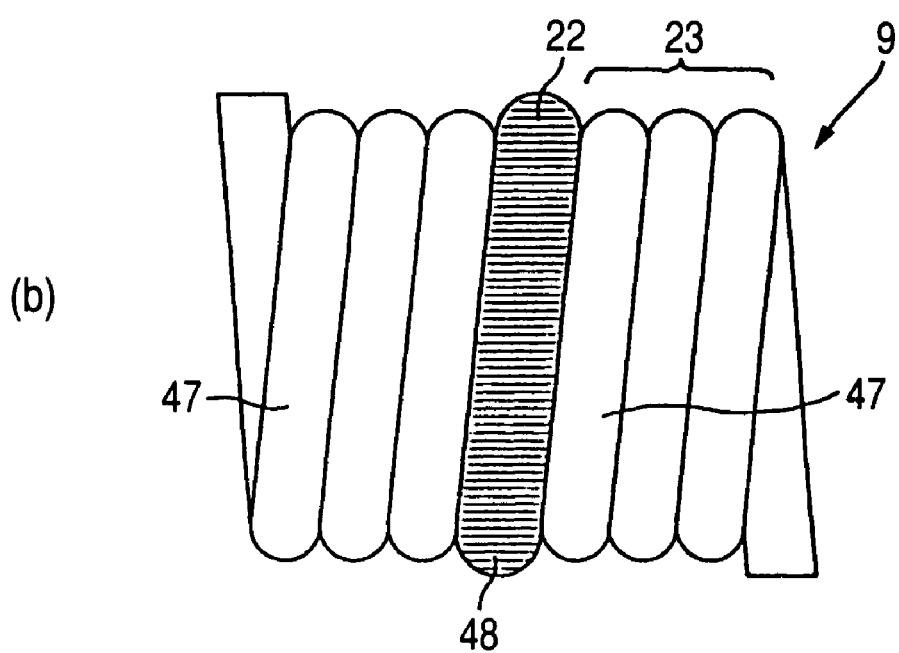

FIG. 43
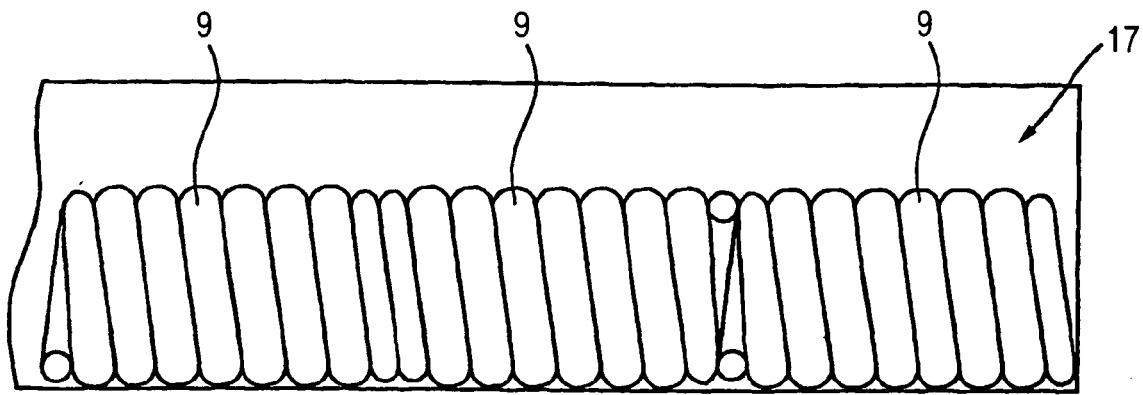
FIG. 44
(a)
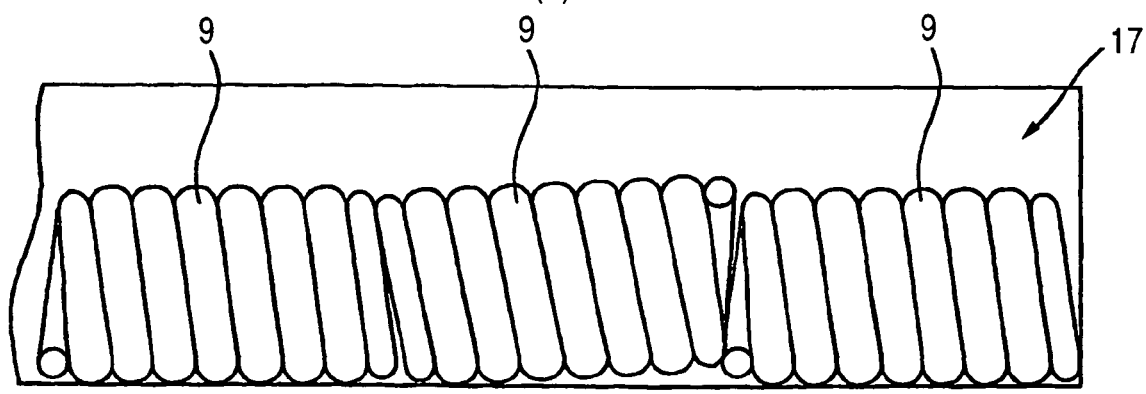
(b)
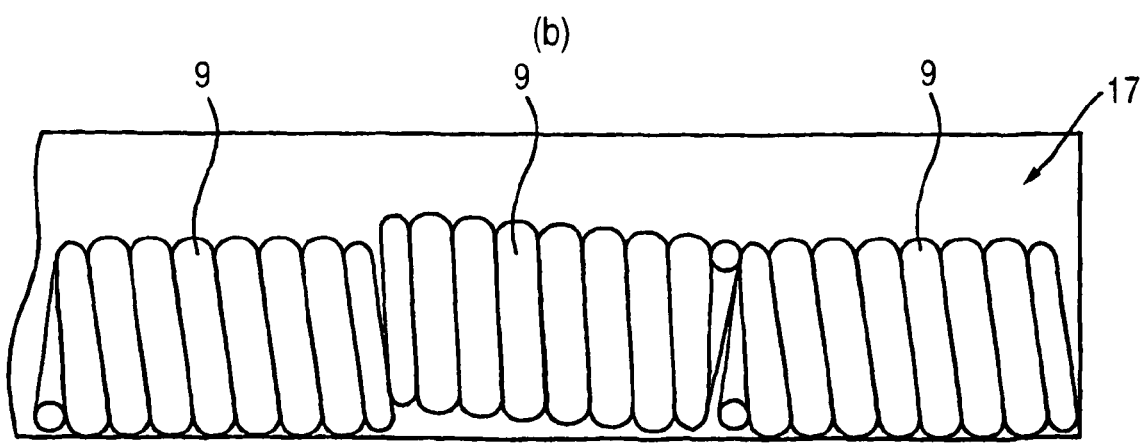

FIG. 47
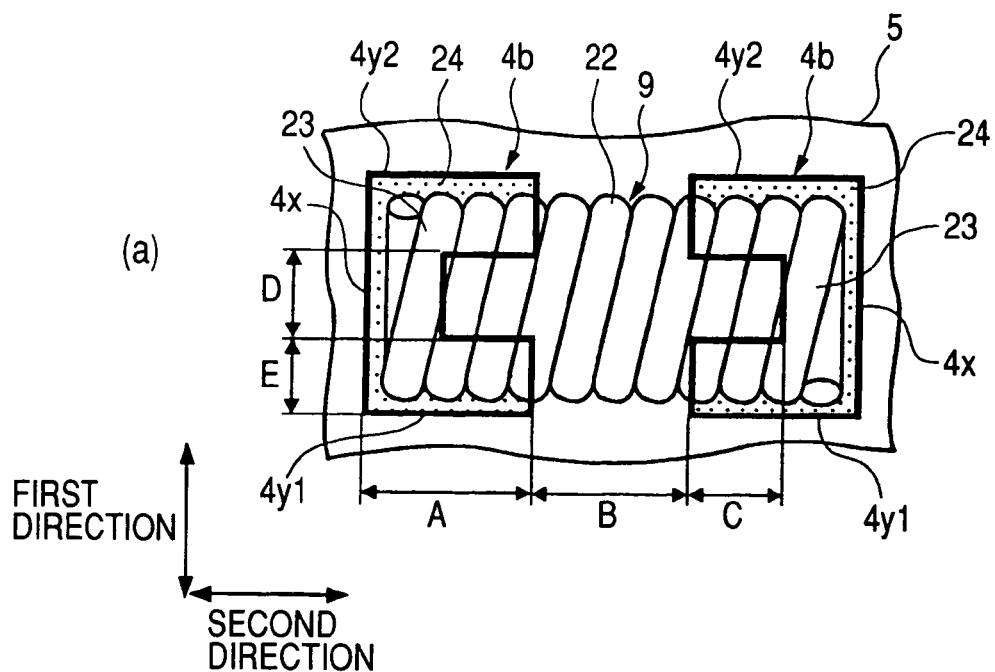
(a)
FIRST DIRECTION
SECOND DIRECTION
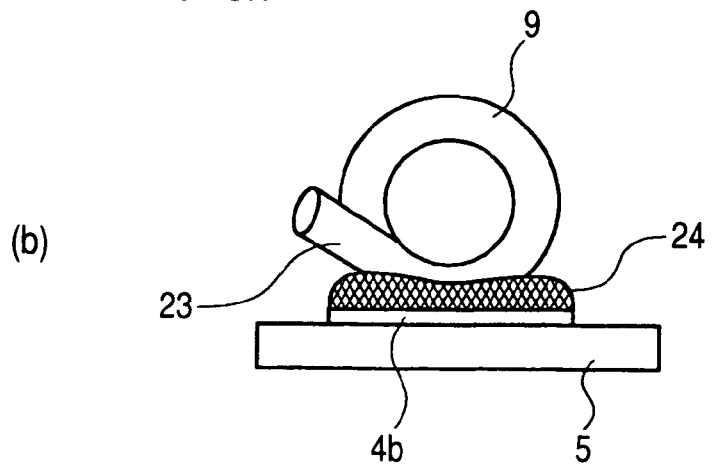
(b)
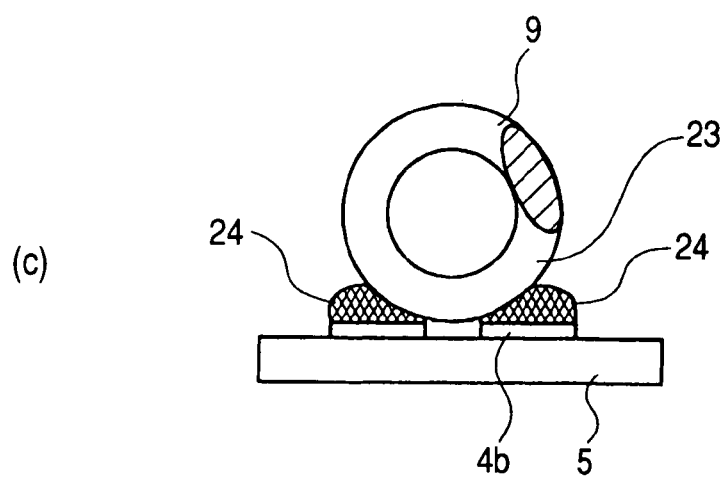
(c)

SEMICONDUCTOR DEVICE, AND METHOD AND APPARATUS FOR MANUFACTURING SEMICONDUCTOR DEVICE

TECHNICAL FIELD

The present invention relates to a semiconductor device, a manufacturing method therefor and a semiconductor manufacturing apparatus, and more particularly, for instance, to a manufacturing technique for a multi-stage high frequency power amplifying device (high frequency power amplifying module) in which a plurality of amplifiers (semiconductor amplifying elements) are connected in cascade in multiple stages as a semiconductor device, and a technique that can be effectively applied to a wireless communication device (electronic device) into which the high frequency power amplifying device is incorporated, such as a mobile telephone.

BACKGROUND ART

A high frequency power amplifying device for use in wireless communication devices, such as car telephones or mobile telephones, has a multi-stage configuration in which a plurality of amplifiers, each consisting of a semiconductor amplifying element (transistor), are connected in cascade in two, three or more stages. The amplifier of the final stage (final amplifying stage) of the multi-stage configuration constitutes the output stage, and the amplifiers of the preceding stages (amplifying stages) constitute drive stages. In addition, inductors are incorporated in a number of positions to regulate circuit impedance.

Required performance characteristics of high frequency power amplifying devices include high efficiency, high gain, compactness and low cost. In addition, portable devices in particular require consideration for the resistance of amplifying element of the final stage (semiconductor amplifying element) against a high voltage that may work on it as a result of reflection that would result from a substantial variation in the impedance of the antenna and consequent load mismatching.

FIG. 33 is a block diagram of the circuit configuration of a high frequency power amplifying device studied by the present inventors before their attempt at the present invention. This high frequency power amplifying device is a dual band device capable of amplification for two communication systems, including the Global System for Mobile Communication (GSM) and the Digital Cellular System (DCS).

This high frequency power amplifying device 1 has as its external electrode terminals a GSM input terminal (Pin GSM ①), a control terminal (Vapc ②), one source voltage terminal of a source voltage Vdd (Ydd1 ③), a GSM output terminal (Pout GSM ④), a DCS output terminal (Pout DCS⑤), the other source voltage terminal of the source voltage Vdd (Vdd-2 ⑥), a communication band switching terminal (Vct1 ⑦), a DCS input terminal (Pin DCS ⑧) and a ground voltage terminal (GND) (not shown).

The amplifying lines of both DCS and GSM are configured in three amplifying stages. The DCS amplifying line consists of amplifying stages denoted by 1st, 2nd and 3rd in the diagram (amp1, amp2 and amp3), while the GSM amplifying line consists of amplifying stages similarly denoted by 1st, 2nd and 3rd (amp4, amp5 and amp6). Each amplifying stage consists of a field effect transistor (FET) though not shown.

In this configuration, Pin DCS ⑧ is connected to amp1; Pout DCS ⑤, to amp3; Pin GSM ①, to amp4 and Pout GSM ④, to amp6.

Vapc ② is connected to a bias circuit 2, and amp1 through amp6 are controlled with signals inputted to this Vapc.

Vdd1 ① is connected to amp4 via a microstrip line MS3, to amp5 via a microstrip line MS4 and to amp6 via an inductor L2. Further to stabilize the high frequency performance, a capacitance C1, of which one end is grounded through GND, is externally connected to Vdd1 ③.

Vdd2 ⑥ is connected to amp1 via a microstrip line MS1, to amp2 via a microstrip line MS2 and to amp3 via an inductor L1. Further to stabilize the high frequency performance, a capacitance C2, of which one end is grounded through GND, is externally connected to Vdd2 ⑥.

Vct1 ⑦ is connected to a band select circuit 3. This band select circuit 3 is composed of three n-channel type field effect transistors (FET) Q8, Q9 and Q10, whose sources are grounded, and one resistor R1. The gate terminal of Q8 and Q9 are connected to Vct1 ⑦. The gate terminal of Q10 is connected to the drain terminal of Q9, which is connected to the output side of amp5 via a resistor R2. The drain terminal of Q9 is connected to Vdd2 ⑥ via the resistor R1. The drain terminal of Q8 is connected to the input side of amp3 via an inductor L3.

Band switching is accomplished with a signal supplied to Vct1 ⑦ to carry out amplification for DCS communication or for GSM communication.

In the circuitry shown in FIG. 33, a common power supply line is used by the GSM circuit chain and the DCS circuit chain. It has been found that, as a result of this, there is formed a feedback loop (indicated by bold arrows in FIG. 33) for leak signals from the 3rd FET to return to the 1st FET, inviting susceptibility to oscillation.

On the other hand, the inductors used according to the prior art are chip inductors. However, chip inductors have high DC resistances and accordingly constitute restraints on output and efficiency in high frequency power amplifying devices (high frequency power amplifier modules) for mobile telephones. Thus, chip inductors require a current capacity of 2 A or more when they are to be used on the power supply line of a high frequency power amplifying device, and therefore have to be produced to a special specification, which means a correspondingly high price and difficulty of urgent procurement.

Commercially available air core coils are too large in external dimensions to be mounted on a module which has a prescribed height limit. Thus, chip-shaped electronic parts such as chip resistors and chip capacitors incorporated into high frequency power amplifying devices are commonly known as "1005" products, measuring 1 mm in length and 0.5 mm in width, smaller than commercially available air core coils.

Moreover, conventional chip inductors are expensive, and their high prices constitute a constraint to cost reduction of hybrid integrated circuit devices. Whereas chip inductors are diverse in structure, the mainstream structures of those used in high frequency power amplifying devices comprise one consisting of a wire wound around a ceramic base member, a spiral one formed by stacking conductors, such as Ag and Ni over a ceramic base and another produced by plating the surface of a ceramic core to form a metal layer and spirally cutting this metal layer with a laser beam.

In view of these circumstances, the present applicants studied, with a view to reducing the size and cost and weakening the DC resistance, a coil formed by spirally winding a highly conductive metal wire, and proposed a new type of coil (coil inductor) (Japanese Patent Application No. 2000-367762).

This type of coil, to cite an example, has a structure consisting of a copper wire of 0.1 mm in diameter, whose surface is covered with an insulating film (e.g., polyethylene film), is spirally wound into a shape measuring 0.56 mm in outer diameter and 0.9 mm in length, both approximately. Before spirally winding the coil, the insulating film at both end portions of the copper wire is removed to a fixed length each, or these parts are covered with no insulating film from the outset. Therefore, one or more rounds of the coil not covered by the insulating film serve as electrodes. This coil is very light, weighing only about 0.0725 mg. Since this air core coil proposed by the present applicants is manufactured by winding a copper wire, the air coil of 8 nH in inductance has a D.C. resistance of about 20 m$\Omega$, much lower than the 100 m$\Omega$ D.C. resistance of a conventional chip inductor of 8 nH (for instance, a "1005" product structured by spirally cutting a small metal layer with a laser beam).

The air core coil proposed here of 8 nH in inductance is 20 m$\Omega$ in D.C. resistance, or ⅕ of that of the conventional inductor, with a corresponding cost advantage.

Applicants, intending to incorporate this air core coil into a high frequency power amplifying device, which also is a hybrid integrated circuit device, attempted assembly using a conventional bulk feeder.

However, the applicants have found that it is difficult to stably supply such extremely light coils (air core coils) with the conventional bulk feeder.

An example of bulk feeder, which also is a semiconductor manufacturing apparatus, is disclosed in *Matsushita Technical Journal*, Vol. 45, No. 4, August 1999, pp. 86-90. This literature describes a hopper type bulk feeder suitable for packaging of surface-mountable electronic parts such as laminated chip capacitors and thick film chip resistors.

FIG. 34 through FIG. 42 illustrate a conventional bulk feeder. As shown in FIG. 34, the conventional bulk feeder has a bulk accommodating case 10 for accommodating bulk, a hopper 11 arranged underneath this bulk accommodating case 10, and a conveyor rail 13 for guiding the bulk accepted through the hopper 11 toward a bulk feed section 12 at the tip.

The bulk accommodating case 10 is structured as a thin box, whose inner bottom constitutes slopes 14 for gathering the bulk from both sides toward the center. The hopper 11, arranged to pierce the center of these slopes 14 and to take out the bulk gathered on the inner bottom parts of the slopes 14 from the bulk accommodating case 10 in an aligned state is configured of a guide 16 having a frustum concave 15 at the upper end, and a feed shaft 18 consisting of an angular pipe and having a guide hole 17 for guiding one component at a time of the bulk through this guide 16 along the center axis, as shown in FIG. 35. The guide 16 is structured to oscillate up and down so that the bulk enter the guide hole 17 from the upper end of the feed shaft 18. It oscillates in an amplitude of, for instance, about three times the length of the bulk (one stroke: abbreviated to 1 St).

The guide hole 17 has a rectangular section as shown in FIG. 36. The feed shaft 18 measures 2.6 mm in diameter, and has at its center the rectangular guide hole 17 of 0.63 mm in width and 0.87 mm in length.

It was found that, when coils (air core coils) 9 each measuring 0.56 mm×0.85 mm were fed in bulk with such a bulk feeder, a number of feed faults would arise as shown in FIG. 35 and FIG. 36.

One is a feed fault A in which the air core coil 9 rides on the upper end of the feed shaft 18 on account of the wall thickness of the cylindrical feed shaft 18 and therefore fails to enter the guide hole 17.

Another is a feed fault B in which a gap 19 occurs between the slope of the frustum concave 15 and the outer circumference of the feed shaft 18 when the guide 16 has come down, and the air core coil 9 is caught in this gap 19.

Still another is a feed fault C in which the air core coil 9 measuring 0.53 mm×0.85 mm, because it has some dimensional fluctuations, is toppled sideways and caught on the way of the guide hole 17 measuring 0.63 mm×0.87 mm.

Also, as the conveyor rail 13 of the conventional bulk feeder has a seam D as shown in FIG. 34, the air core coil 9 may be caught by that seam and invite a feed fault.

On the other hand, the bulk feed section 12 is structured as shown in FIG. 37, and acts as illustrated in FIG. 37 through FIG. 42. Thus, as shown in FIG. 37, toward the tip of the conveyor rail 13, the upper side of the tip of the conveyor rail body 25 is a step lower, and a slider 26 is fitted to this lower portion to be able to reciprocate along the shifting direction of the air core coil 9.

A rail 27 provided with the guide hole 17 to guide the air core coil 9 extends to the stepped portion of the conveyor rail body 25. The conveyor rail body 25 has a stopper portion 28 for stopping the forward end of the air core coil 9 having entered the guide hole 17 of the rail 27 and moved on. This stopper portion 28 is in contact with the upper side of the air core coil 9, and its lower portion is a partially open space. This constitutes a vacuum suction passage 30$a$ for subjecting the air core coil 9 to vacuum suction to bring it into contact with the stopper portion 28.

The slider 26 is brought into contact on its left end face with a side of the stepped portion by a spring 29. The state in which the left end face of the slider 26 is in contact with the side of the stepped portion constitutes the position of the stopper portion 28 to position the air core coil 9, i.e. its positioning reference face.

A shutter 31 overlaps the slider 26, and is shiftable relative to the slider 26. The shutter 31 reciprocates in the shifting direction of air core coils 9, and spans a slightly longer range than the length of the leading one of the air core coils 9 moving in the guide hole 17 of the rail 27. Therefore, the tip of the rail 27 has a structure in which the part of the rail 27 over the upper face of the guide hole 17 is removed. The shutter 31 forms a vacuum suction passage 30$b$ between it and the slider 26. Holes are bored in the shutter 31, the slider 26 and the conveyor rail body 25 to form vacuum suction passages 30$c$, 30$d$ and 30$e$. When the slider 26 moves towards the left end and the shutter 31 hangs over the guide hole 17, these three holes overlap one another to subject the air core coils 9 to vacuum suction as indicated by thick arrows in FIG. 37 to bring the leading one of the air core coils 9 into contact with the stopper portion 28. This vacuum suction also aligns the succeeding air core coils 9 in the guide hole 17 as shown in FIG. 38.

As illustrated in FIG. 39, when the shutter 31 is opened towards the right hand side, i.e. away from the end of the guide hole 17, the leading air core coil 9 and the leading edge of the second air core coil 9 in a slight length are exposed. This opening action causes the vacuum suction passage 30$d$ to be blocked by the shutter 31, and therefore the vacuum suction stops. The shutter 31 is shifted by, for instance, as long as three times the length (3 St) of the air core coil 9. FIG. 40 shows an enlarged section of these relationships.

Then, a collet 32 shifts, holds the air core coil 9 by vacuum suction, and brings it to above the module substrate, and the air core coil 9 is mounted.

Incidentally, since air core coils are extremely light as mentioned above, they may be easily moved by a variation in air flow (air pressure) at the time of switching vacuum suction or by vibration, and the ends of consecutive air core coils 9 may overlap each other as shown in FIG. 44 for example. In this case, the collet 32 becomes unable to securely hold the air core coil 9 by vacuum suction and carry it, making it impossible to mount the air core coil 9 over the module substrate. If the vacuum suction force is increased to strengthen vacuum suction by the collet, that vacuum suction force may disturb the coil alignment, and therefore the vacuum suction force of the collet cannot be increased more than necessary, making its control delicate. FIG. 43 illustrates an undisturbed line of air core coils 9.

An object of the present invention is to provide a semiconductor device excelling in high frequency characteristics and permitting enhancement of output and efficiency and a reduction of manufacturing cost, and an electronic device into which the semiconductor device is incorporated.

Another object of the invention is to provide a high frequency power amplifying device excelling in high frequency characteristics and permitting enhancement of output and efficiency and a reduction of manufacturing cost, and a wireless communication device into which the high frequency power amplifying device is incorporated.

Another object of the invention is to provide a semiconductor device mounted with air core coils of low D.C. resistance, and an electronic device into which the semiconductor device is incorporated.

Another object of the invention is to provide a high frequency power amplifying device mounted with air core coils of low D.C. resistance, and a wireless communication device into which the high frequency power amplifying device is incorporated.

Another object of the invention is to provide a high frequency power amplifying device whose oscillation margin can be improved, and a wireless communication device into which the high frequency power amplifying device is incorporated and which excels in speech communicating performance.

Another object of the invention is to provide a semiconductor device manufacturing method permitting accurate and secure mounting of components fed in bulk on a wiring board.

Another object of the invention is to provide a semiconductor device manufacturing method permitting accurate and secure mounting of coils fed in bulk on a wiring board.

Another object of the invention is to provide a semiconductor manufacturing apparatus capable of achieving steady supply of components in bulk.

Another object of the invention is to provide a semiconductor manufacturing apparatus capable of achieving capable of achieving steady supply of coils in bulk.

The aforementioned and other objects and novel features of the present invention will become more apparent from the description in this specification and the accompanying drawings.

DISCLOSURE OF THE INVENTION

A typical aspect of the invention disclosed in this application will be briefly described below.

A high frequency power amplifying device of the following configuration is incorporated into a mobile telephone. The high frequency power amplifying device is in a dual band configuration having two amplifying lines. Each amplifying line has a multi-stage configuration in which a plurality of semiconductor amplifying elements are connected in cascade, and a coil with a low D.C. resistance (air core coil) is connected in series between the first terminal, the signal supplying terminal, and the source voltage terminal of the semiconductor amplifying element of the final amplifying stage. The air core coil is mounted on the module substrate of the high frequency power amplifying device.

For the supply of the source voltage, two source voltage terminals are provided. One of the source voltage terminals is connected to the first amplifying stage of one amplifying line and to the remaining amplifying stages of the other amplifying line, and the other, to the first amplifying stage of the latter amplifying line and to the remaining amplifying stages of the former amplifying line (this configuration is known as crossed connection).

The air core coil consists of a copper wire of 0.1 mm in diameter, with its surface covered with an insulating film, wound in a spiral form, and its two end portions which constitute electrodes are covered with no insulating film, measuring about 0.56 mm in maximum outer diameter and about 0.9 mm in overall length. This type of coil of 8 nH in inductance has a D.C. resistance of about 20 m$\Omega$, much lower than the 100 m$\Omega$ D.C. resistance of a conventional chip inductor of 8 nH in inductance.

Mounting of air core coils in the manufacturing process of the high frequency power amplifying device is accomplished by conveying the leading one of the air core coils, shifted to the bulk feed section of the bulk feeder and aligned, after being held by the collet by vacuum suction, to a prescribed position over the module substrate and fixed by melting solder provided in advance on the module substrate and the air core coil by temporary heating. Incidentally, the electronic components to be mounted on the module substrate are less tall than the air core coils. Thus they are 1 mm in length and 0.5 mm in width and height, or even smaller. The semiconductor chip on which the semiconductor amplifying element is formed is also thin. Therefore, the air core coils of 0.56 mm in diameter, larger than other components to be packaged, are mounted after all the others are mounted.

The bulk feeder, which also is a semiconductor manufacturing apparatus, consists of a bulk accommodating case, a hopper, a conveyor rail and a bulk feed section. Air core coils accommodated in the bulk accommodating case are gathered by the hopper to form a line, shifted within the conveyor rail and carried to the bulk feed section. In the bulk feed section, a vacuum suction mechanism (not shown) temporarily operates to let the air core coils reach the bulk feed section. While the vacuum sucking action of the vacuum suction mechanism is at halt, the shutter of the bulk feed section is opened, and the leading one of the exposed line of air core coils is held by the collet.

The hopper is configured of a cylindrical guide having a frustum concave at its top end, and a feed shaft penetrating this guide for guiding the bulk in tandem along the center axis. The guide oscillates up and down so that the bulk gather into the frustum concave of the guide and enter the guide hole of the feed shaft. The feed shaft is built thin in wall thickness to prevent the bulk from riding on and stopping it. The positional relationship is such that, in a state in which the guide is at its lowest, there can arise no gap between the outer circumference of the feed shaft and the frustum concave face of the guide in which the bulk could be caught. So that no air core coil can enter sideways into the guide hole of the feed shaft, the hole has a round section which is shorter than the overall length of the air core coil and slightly greater than the outer diameter of the air core coil. For this reason, the feed shaft is formed in a cylindrical shape.

The conveyor rail is formed of a single seamless member so that the bulk shifting along the guide hole may not be caught.

The bulk feed section has a stopper portion to position and stop the bulk shifting along the guide hole of the conveyor rail; a slider fitted to the conveyor rail to be able to reciprocate in the shifting direction of the bulk; a shutter, fitted to the slider to be able to reciprocate in the shifting direction of the bulk, for opening and closing the top face of the guide hole; vacuum suction passages provided in the conveyor rail, the guide and the shutter to cause the bulk in the guide hole to advance towards the stopper portion by vacuum suction and constituting part of the vacuum suction mechanism; and an opening/closing means for opening and closing the vacuum suction passages.

In the bulk feed section, in a state in which the top face of the upper end of the guide hole is blocked by the shutter, the opening/closing means acts to open the shutter to advance the bulk in the guide hole towards the stopper portion. Next, the shutter acts to open itself for a distance shorter than the length of a piece in the bulk to cause the opening/closing means to take a closing action. Then, the shutter takes an opening action together with the slider to give rise to a prescribed distance between the leading piece in the bulk and the following piece. Next, the shutter takes a further opening action to expose the leading piece in the bulk. In this state, the leading piece in the bulk is held by the collet by vacuum suction.

By the arrangement described above, (a) the air core coil has a lower D.C. resistance than the chip inductor does. Therefore, when used as an inductor connected to the final amplifying stage of a multi-stage amplifying line, it enables the DC loss to be reduced and the impedance to be increased with less loss. For this reason, it is made possible to reduce the feedback of high frequency signals from the final amplifying stage to the preceding amplifying stages, and to improve the oscillation margin. As a result, the oscillation margin in the RF module is improved, and accordingly speech communicating performance of the mobile telephone is enhanced.

(b) In the dual band configuration, since the source voltage supplied to the two amplifying lines is in crossed connection, the feedback of leak signals to the first amplifying stage from the subsequent amplifying stages (especially the final amplifying stage) through the power supply lines can be suppressed, and accordingly the oscillation margin can be improved. This improvement of the oscillation margin is further strengthened by the use of the air core coil mentioned in (a) above.

(c) As the air core coil is configured by winding a copper wire whose surface is covered with an insulating film in a dense spiral, its manufacturing cost is only about ⅕ to ½ of that of the conventional chip inductor. Therefore, the cost can be reduced to about ⅕ of the expensive chip inductor connected to the final amplifying stage. If air core coils according to the invention are used in place of the chip inductors used in other parts, their cost can be about halved. This can result in a cost saving for the high frequency power amplifying device. Likewise, the manufacturing cost of the mobile telephone (wireless communication device) into which this high frequency power amplifying device can also be reduced.

(d) As the air core coil measures 0.56 mm in maximum diameter and 0.9 mm in length, both approximately, its mounted length is less than that of the conventional chip inductor, which is 0.5 mm in both width and height and 1 mm in length.

(e) The mounting of the air core coil in the manufacture of the high frequency power amplifying device (semiconductor device manufacturing method) has the following advantages.

① Among the electronic components to be mounted over the module substrate, the air core coil is the highest, but it is packaged after all the other electronic components have been mounted. Therefore, the collet holding the air core coil by vacuum suction does not come into contact with the electronic components already mounted over the module substrate or damage other electronic components. This can mean an improved packaging yield.

② After the leading one of the air core coils, shifted to the bulk feed section bulk feeder and aligned in tandem, is held by the collet by vacuum suction, it is carried to a prescribed position over the module substrate and, though after that it is fixed by melting solder provided in advance on the module substrate and the air core coil by temporary heating, in the bulk feed section the leading air core coil is fed separately from the following air core coil. Accordingly, there can occur no error in vacuum suction holding by the collet which would otherwise occur as the following air core coil overlaps or is caught by the leading air core coil, resulting in accurate and secure packaging, which moreover can be carried out more efficiently. Therefore, the process is made less susceptible to packaging faults or machinery stopping, making it possible to reduce the packaging cost.

③ As the wall of the cylindrical feed shaft is thin in the hopper portion, the bulk will not ride on and stop the shaft, and the air core coil to the bulk feed section is made more secure, making possible stable feeding.

④ As the positional relationship in the hopper portion is such that, in a state in which the guide is at its lowest, there can arise no gap between the outer circumference of the feed shaft and the frustum concave face of the guide in which the bulk could be held, there is no possibility for an air core coil to be caught between the outer circumference of the feed shaft and the frustum concave face of the guide. Therefore, the air core coils can be prevented from deformation or any deformed air core coil from being mounted, making possible an improvement in packaging yield. It is also made possible to stably feed the bulk feed section with air core coils.

⑤ As the guide hole of the feed shaft has a large round section, no air core coil can clog the guide hole, making it possible to stably feed the bulk feed section with air core coils.

⑥ As the conveyor rail is formed of a single seamless member, no air core coil can be caught on the way of the guide hole, making it possible to stably feed the bulk feed section with air core coils.

BRIEF DESCRIPTION OF THE DRAWINGS

FIG. 12 show typical views of the state in which the coil is packaged.

FIG. 31 shows an enlarged plan of a coil of another structure.

FIG. 43 shows a typical view of coils aligned without being caught by one another in the bulk feed section.

FIG. 44 show a typical view of a state in which the leading coil and the coil behind it are caught by each other in the bulk feed section.

FIG. 47 variously illustrate the mounted state of a coil in this Embodiment 3.

BEST MODES FOR CARRYING OUT THE INVENTION

Preferred embodiments of the present invention will be described in detail below with reference to drawings. In all the drawings for describing the embodiments of the invention, constituent elements having the same functions are denoted by respectively the same reference signs, and their description is not repeated.

EMBODIMENT 1

FIG. 1 through FIG. 31 pertain to a semiconductor device (high frequency power amplifying device), which is a preferred embodiment of the invention (Embodiment 1) together with a manufacturing method therefor, and a wireless communication device (electronic device)

This Embodiment 1 described below is a case in which the invention is applied to a high frequency power amplifying device (hybrid integrated circuit device) as a semiconductor device. The high frequency power amplifying device, which is this Embodiment 1, is for dual band use, for instance a dual band high frequency power amplifying device built into a mobile telephone (wireless communication device), into which a GSM communication system and a DCS communication system are incorporated.

Figure 2:
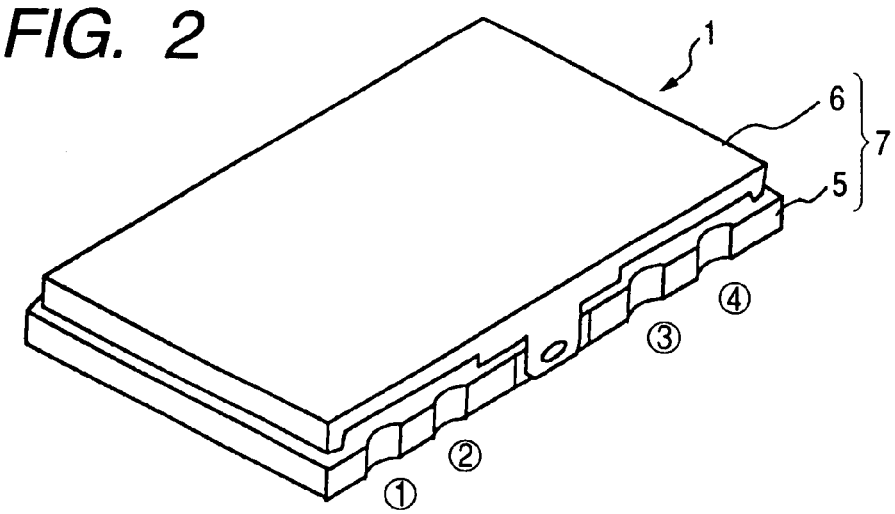
FIG. 2 is a perspective view showing the appearance of the high frequency power amplifying device, which is this Embodiment 1.
Figure 3:
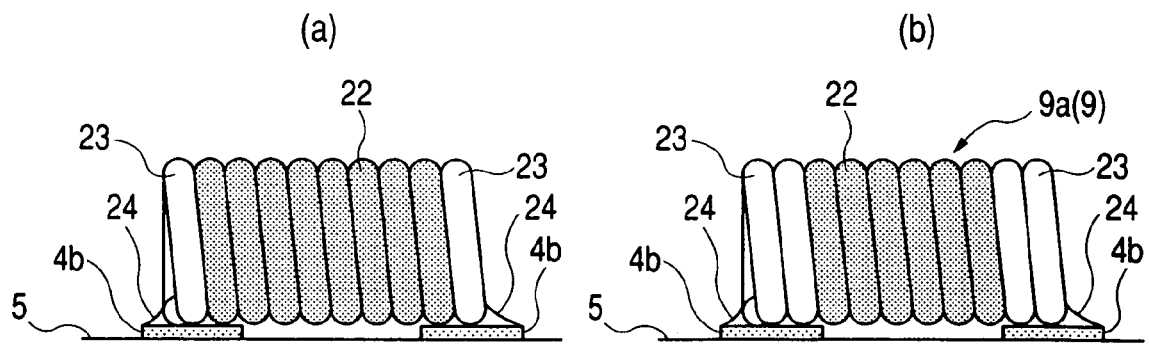
FIG. 3 shows a typical view of a coil mounted on the module substrate.

A high frequency power amplifying device (high frequency power amplifier module) 1 in this Embodiment 1 is a flat rectangular structure in external view as shown in FIG. 2. This high frequency power amplifying device 1 has a configuration in which a module substrate 5, consisting of a ceramic wiring board, and a cap 6 fitted on one side (main face side) of this module substrate 5, together constituting a package 7 of flat rectangular structure. The cap 6, made of a metal performing the role of an electromagnetic shield, is a press-molded item.

Figure 1:
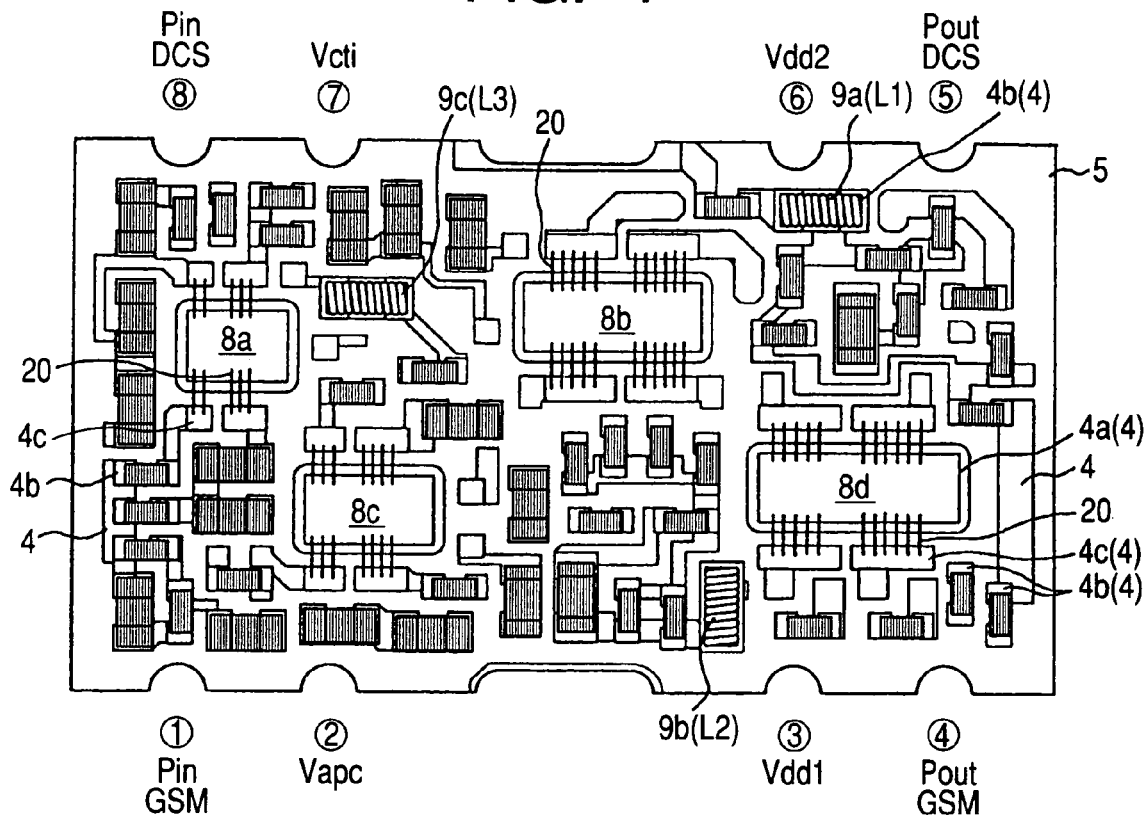
FIG. 1 is a plan showing the layout of electronic components mounted over a module substrate in a high frequency power amplifying device, which is an embodiment of the present invention (Embodiment 1).
Figure 4:
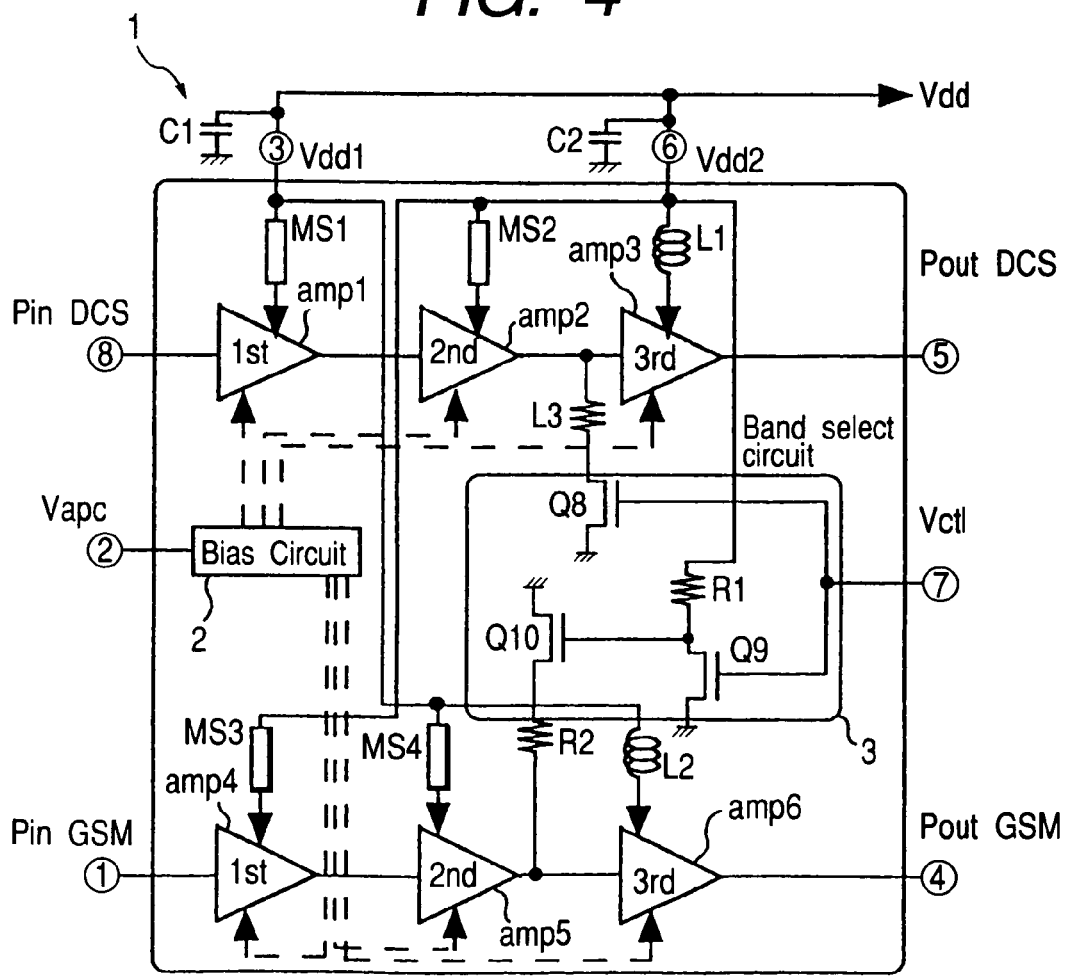
FIG. 4 is a block diagram showing the circuit configuration of the high frequency power amplifying device, which is this Embodiment 1.

FIG. 4 is a block diagram showing the circuit configuration of the high frequency power amplifying device, which is this Embodiment 1. This high frequency power amplifying device 1 has, as external electrode terminals, a GSM input terminal (Pin GSM ①), a control terminal (Vapc ②), one source voltage terminal for a source voltage Vdd (Vdd1 ③), a GSM output terminal (Pout GSM ④), a DCS output terminal (Pout DCS ⑤), the other source voltage terminal for the source voltage Vdd (Vdd2 ⑥), a communication band switching terminal (Vct1 ⑦), a DCS input terminal (Pin DCS ⑧), and a ground voltage terminal (GND) (not shown). The terminal arrangement is such that, as shown in FIG. 1, there are terminals ①, ②, ③ and ④ from left to right on the lower side (in the drawing) of the module substrate 5 and terminals ⑤ through ⑧ from right to left on the upper side.

The amplifying lines of both DCS and GSM are configured for amplification in three stages. The DCS amplifying line consists of amplifying stages denoted by 1st, 2nd and 3rd (amp1, amp2 and amp3), and the GSM amplifying line, of amplifying stages denoted by 1st, 2nd and 3rd (amp4, amp5 and amp6). Each amplifying stage is formed of a field effect transistor (FET) (not shown) consisting of a silicon substrate.

In this configuration, Pin DCS ⑧ is connected to amp1, and Pout DCS ⑤, to amp3. Pin GSM ① is connected to amp4, and Pout GSM ④, to amp6.

Vapc ② is connected to a bias circuit 2, and amp1 through amp6 are controlled with signals inputted to this Vapc ②.

Vdd1 ③ is connected to amp1 via a microstrip line MS1, to amp5 via a microstrip line MS4 and to amp6 via an inductor L2. Further to Vdd1 ③, a capacitance C1 of which one end is grounded at GND is externally connected to stabilize high frequency characteristics.

Vdd2 ⑥ is connected to amp4 via a microstrip line MS3, to amp2 via a microstrip line MS2, and to amp3 via an inductor L1. Further to Vdd2 ⑥, a capacitance C2 of which one end is grounded at GND is externally connected to stabilize high frequency characteristics.

Thus two terminals (Vdd1 ③ and Vdd2 ⑥) are made available for the source voltage, and one source voltage terminal supplies the source voltage to the first amplifying stage of one amplifying line and the second and third amplifying stages of the other amplifying line, while the other source voltage terminal supplies the source voltage to the first amplifying stage of the latter amplifying line and the second and third amplifying stages of the former amplifying line, i.e. in a so-called crossed connection. Therefore, the feedback of leak signals to the first amplifying stage from the subsequent amplifying stages (especially the final amplifying stage) through the power supply lines can be suppressed, and accordingly the oscillation margin can be improved.

The inductors L1 through. L3 of 8 nH in inductance are formed of air core coils having a D.C. resistance of 20 mΩ, a far lower D.C. resistance than the 100 mΩ-D.C. resistance of the conventional chip inductors of 8 nH in inductance.

Vct1 ⑦ is connected to a band select circuit 3. This band select circuit 3 is configured of three source-grounded n-channel type field effect transistors (FETs) Q8, Q9 and Q10 and one resistor R1. The gate terminals of Q8 and Q9 are connected to Vct1 ⑦. The gate terminal of Q10 is connected to the drain terminal of Q9, and its drain terminal is connected to the output side of amp5 via a resistance R2. The drain terminal of Q9 is connected to Vdd2 ⑥ via the resistor R1. The drain terminal of Q8 is connected to the input side of amp3 via the inductor L3. Band switching is accomplished with signals supplied to Vct1 ⑦ to perform amplification for either DCS communication or GSM communication.

FIG. 1 is a plan illustrating the layout of electronic components mounted over the module substrate 5 consisting of a low-temperature fired ceramic wiring board formed by stacking, for instance, glass ceramics.

As shown in FIG. 1, four semiconductor chips 8a through 8d, three air core coils 9a through 9c, and many unnumbered chip resistors and chip capacitors are mounted on the surface of the module substrate 5.

Conductors are selectively formed not only on the top and bottom faces of but also inside the module substrate 5, and these conductors constitute wiring 4. Part of this wiring 4 constitutes mounting pads 4a for fixing the semiconductor chips 8a through 8d, electrode fixing pads 4b for fixing chip type electronic components including chip resistors and chip capacitors or electrodes of the air core coils 9a through 9c, or wire bonding pads 4c for connecting one end each of wires 20 of which the other end each is connected to the electrodes (not shown) of the semiconductor chips 8a through 8d. On the bottom side of the module substrate 5 are formed surface-packaged electrodes by the wiring 4 to form the external electrode terminals ① through ⑧. These external electrode terminals are in a land grid array (LGA) structure.

The semiconductor chips 8a through 8d are fixed onto the concave bottom provided in the main face of the module substrate 5. In semiconductor chips which generate a large quantity of heat during operation, via holes are bored in the module substrate 5 underneath the chips and filled with the aforementioned conductors to transmit the heat to the back face of the module substrate 5.

To further elaborate on the semiconductor chips 8a through 8d, the 1st and 2nd semiconductor amplifying elements for DCS use are incorporated into the semiconductor chip 8a, and the 3rd semiconductor amplifying element for DCS use is incorporated into the semiconductor chip 8b. Further, the 1st and 2nd semiconductor amplifying elements for GSM use are incorporated into the semiconductor chip 8c, and the 3rd semiconductor amplifying element for GSM use is incorporated into the semiconductor chip 8d.

On the other hand, as one of the characteristics of the present invention, the inductors L1 through L3 in the high frequency power amplifying device 1 are formed of coils (the air core coils 9a through 9c) as shown in the block diagram of FIG. 4.

FIG. 3(b) illustrates the air core coil 9a (9) mounted over the module substrate 5. Each air core coil 9 comprises an inductor portion 22 whose surface is covered with an insulating film and electrodes 23 at both ends covered with no insulating film. This air core coil 9 has six winds in the inductor portion 22 and two winds in each of the electrodes 23. The air core coil 9 is packaged by fixing its electrodes 23 to the wiring 4b of the module substrate 5 with solder 24. Incidentally, the air core coil 9 shown in FIG. 3(a) has eight winds in the inductor portion 22 and one wind in each of the electrodes 23.

The air core coil 9 is so structured that, for example, a copper wire of 0.1 mm in diameter whose surface is covered with an insulating film (e.g. a polyethylene film) is spirally wound to an outer diameter of 0.56 mm and a length of 0.9 mm. Before the copper wire is spirally wound, the insulating film at its both ends is removed to a certain length, and the parts of the coil deprived of the insulating film constitute the external electrodes 23. The part of coil covered with the insulating film makes up the inductor portion 22. This air core coil 9 is very light, weighing only 0.00725 mg. As this coil is produced by winding a copper wire, its cost is about 1/7 of that of a conventional chip inductor (for instance, a chip inductor of which the current capacity is about 2.1 A, the inductance is 8 nH and the D.C. resistance is 100 mΩ). Compared with a chip inductor of a smaller current capacity, the cost is about ½.

Such a high frequency power amplifying device 1 is not only improved in oscillation margin but also reduced in transmission loss as will be detailed below.

(1) Measures Against Oscillation Margin

Figure 33:
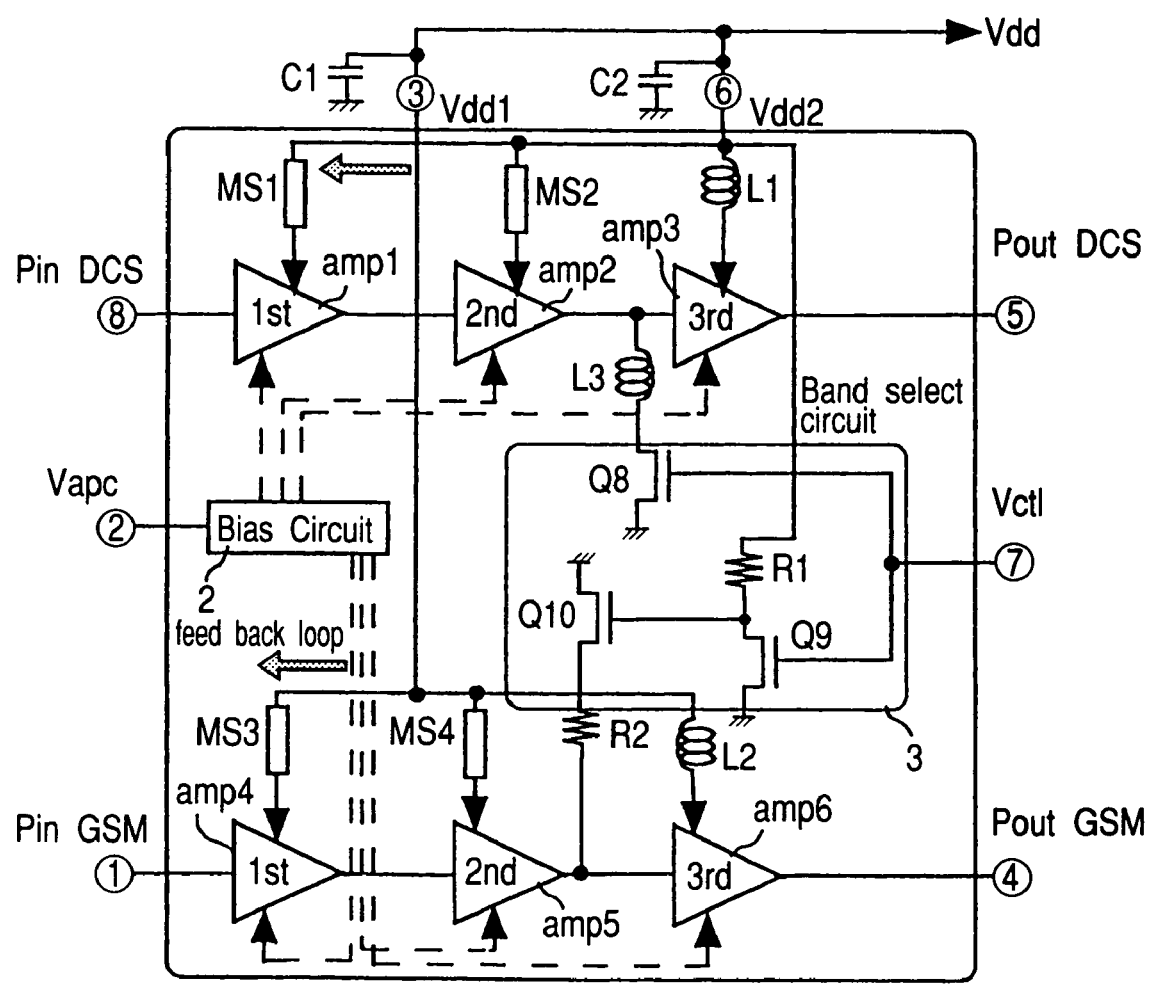
FIG. 33 is a block diagram showing the circuit configuration of a high frequency power amplifying device studied by the present inventors before the present invention.

In the circuit shown in FIG. 33, as the GSM and DCS circuit chains use a common power supply line, there is formed a feedback loop in which leak signals from the 3rd FET return to the 1st FET via the power supply line, resulting in susceptibility to oscillation.

By contrast, the circuit of this Embodiment 1 shown in FIG. 4 is provided with two source voltage terminals are provided (Vdd1 and Vdd2), and the adverse effect of this feedback loop is reduced by supplying power from a separate source voltage terminal to the 1st FET, whose amplification gain is the greatest, to suppress the feedback to the 1st FET, resulting in improvement in oscillation margin.

Furthermore, as the inductor to the power supply line part to the 3rd FET is formed of the air core coil 9 lower in D.C. resistance in the GSM and DCS amplifying lines, the D.C. loss is reduced, making it possible to decrease the power loss and increase the impedance. As a result, the feedback of RF signals from the 3rd FET to the 2nd FET can be reduced, adding to the oscillation margin improving effect of the aforementioned crossed connection.

(2) Reduction of Transmission Loss by Application of Air Core Coil to Power Supply Line In size reduction and multi-functionalization accompanying the rise in the integration level of circuits, it is required to increase the packaging density of components, and the strip line and the like should be laid out in inner layers of the substrate. However, laying out the power supply line in inner layers of the substrate entail the following problems.

① The high frequency transmission loss (RF) increases with the drop in characteristic impedance.

② If the strip line is elongated to reduce the RF loss, the D.C. loss will increase.

③ The elongated strip line would occupy a greater space, and thereby prevent the size of the module substrate 5, accordingly that of the high frequency power amplifying device 1, from being reduced.

Losses on the power supply line can be broadly classified into the D.C. loss due to the wiring resistance component and the RF loss due to the impedance component. The D.C. loss can be reduced by shortening the power supply line (the strip line), but this would entail a drop in the impedance of the power supply line and an increase in RF loss.

An explanation of losses on the power supply line might be relevant here.

(1) D.C. Loss

When a current flows along a power supply line, the voltage is reduced by the parasitic resistance component of the wiring conductor, and the voltage applied to the drain of the FET will drop, inviting decreases in output and efficiency. The loss (D.C. loss in dB) is given by the following equation.

$$\text{Loss}=10\ \log(Vdd \cdot Idd)-10\ \log\ \{[Vdd-(L/W)\cdot Rs \cdot Idd]\ Idd\} \quad \text{[Equation 1]}$$

$$\text{Voltage drop}=(L/W)\cdot Rs \cdot Idd \quad \text{[Equation 2]}$$

where L is the line length, W, the line width and Rs, the conductor resistance.

(2) RF Loss

For the analysis of the transmission loss dependent on the relationship between the impedance of the power supply line and the drain impedance of the FET, a simulator Microwave Design System (MDS) was used.

Where the input signal source is supposed to be the FET, the input can be calculated as being unmatched and the output as matched, and the calculation was conducted in terms of Ga (available power gain), on which the influence of the power supply line to the FET is discernible. Ga is given by the following equation.

$$Ga=|S21|^2 \cdot (1-|\Gamma s|^2)/\{1-|S22|^2+|\Gamma s|^2 \cdot [(|S11|^2-|D|^2)-2Re(S11-D \cdot S22^*)]\} \quad \text{[Equation 3]}$$

$$D=S11 \cdot S22-S12 \cdot S21 \quad \text{[Equation 4]}$$

$$RF\ \text{loss}\ (dB)=10\ \log(Ga) \quad \text{[Equation 5]}$$

where S11·S12·S21·S22 is an S parameter; S11, the input impedance; S12, the isolation; S21, the transmission gain; S22, the output impedance; S22*, the output impedance complex conjugate; Re, the real part; and γs, the input reflection coefficient.

Figure 5:
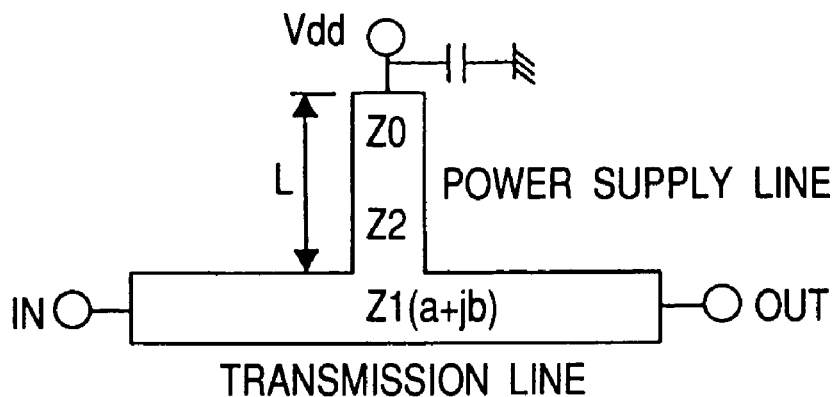
FIG. 5 is an equivalent circuit of a power supply line formed over the module substrate in the high frequency power amplifying device, which is this Embodiment 1.

In order to the reduce the RF loss on the power supply line, it is necessary to increase the impedance (Z2) of the power supply line in the equivalent circuit to the transmission line and the power supply line shown in FIG. 5. Referring to FIG. 5, a power supply line of length L is provided between the input end (IN) and the output end (OUT) of the transmission line, and Vdd is supplied to an end of the power supply line. In FIG. 5, Z0 denotes the characteristic impedance of the power supply line; Z1, the impedance of the connecting part of the transmission line to the power supply line; Z2, the impedance of the power supply line; and L, the length of the power supply line. The following equations are given in this equivalent circuit.

$$|Z1|=(a^2+b^2)^{1/2}$$ [Equation 6]

$$Z2=Z0(ZL+jZ0 \tan \beta L)/(Z0+jZL \tan \beta L)$$ [Equation 7]

Here, deriving from ZL (stub impedance)≈0:

$$Z2=jZ0 \tan \beta L$$ [Equation 8]

$$\beta=2\pi/\lambda$$ [Equation 9]

Although these results of calculation reveal that the power supply line impedance (Z2) is made open with respect to the fundamental wave by setting the length of the strip line to $\lambda/4$ and the impedance becomes infinitely large, but, because the openness does not become visible until signals transmitted over the power supply line are reflected by a short-circuiting face (bypass capacitor) and return, there arises a transmission loss and accordingly the loss is not absolutely zero. Therefore, designing of the power supply line should be considered in terms of both D.C. loss and RF loss, and a condition to reduce the losses should be designed.

Figure 6:
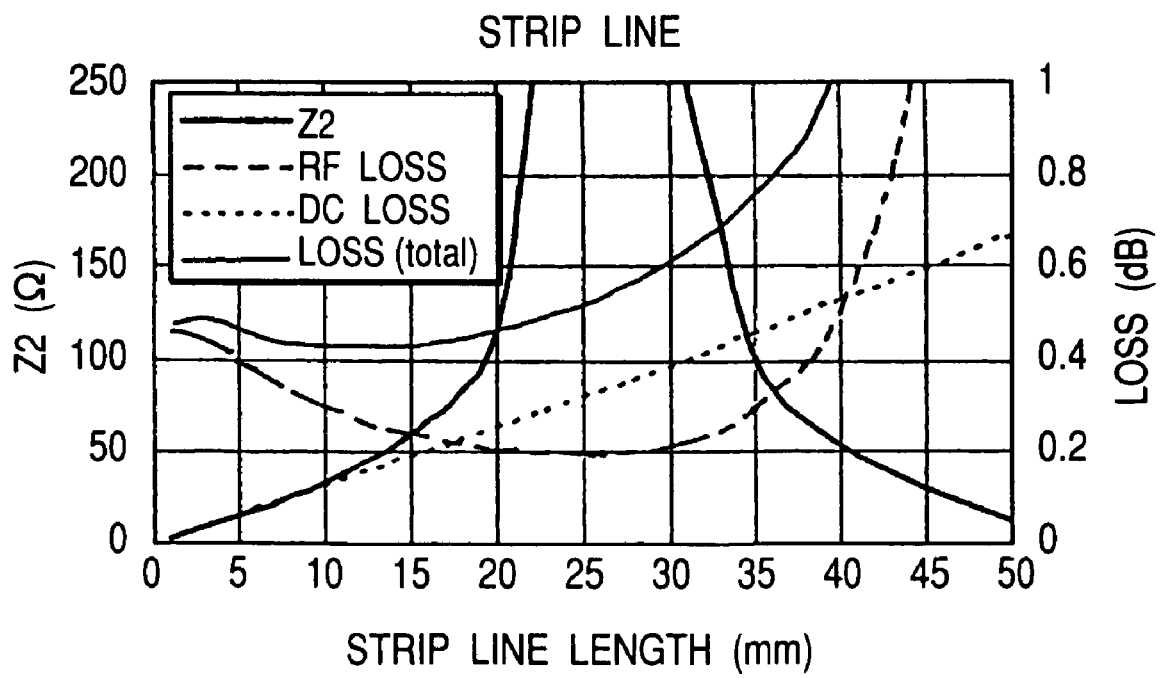
FIG. 6 is a graph showing the loss on the strip line.

FIG. 6 shows the relationship between Z2 of the strip line and the loss on the power supply line. It is seen that there is an optimal point between RF loss and D.C. loss. Thus, when the frequency f is 900 MHz, the line width W, 0.3 mm, the substrate thickness t (inner layer), 0.3 mm and the substrate inductance ∈r, 8.1, the optimal point is at a strip line length of 12 mm.

However, there is a problem that, where the strip line is arranged in an inner layer of the substrate, the transmission loss will be as great as approximately 0.4 dB, resulting in a heavy drop in power efficiency.

Figure 7:
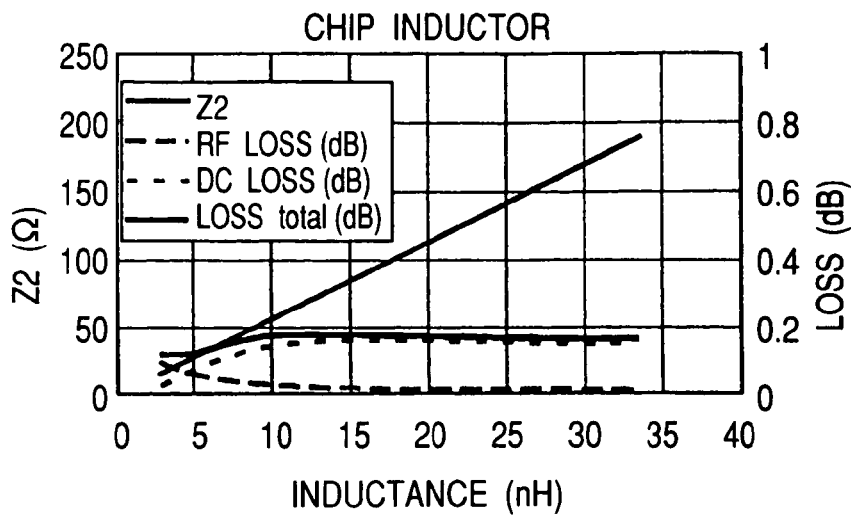
FIG. 7 is a graph showing the loss in the chip inductor.
Figure 8:
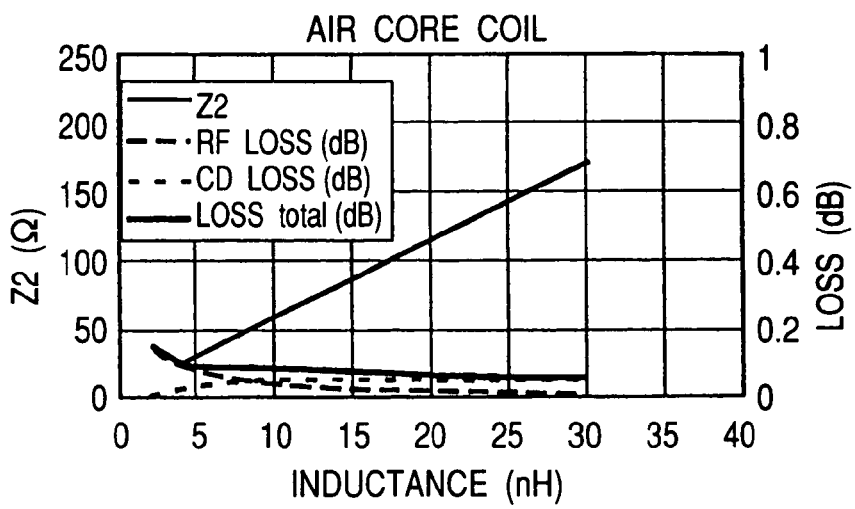
FIG. 8 is a graph showing the loss in the coil.
Figure 9:
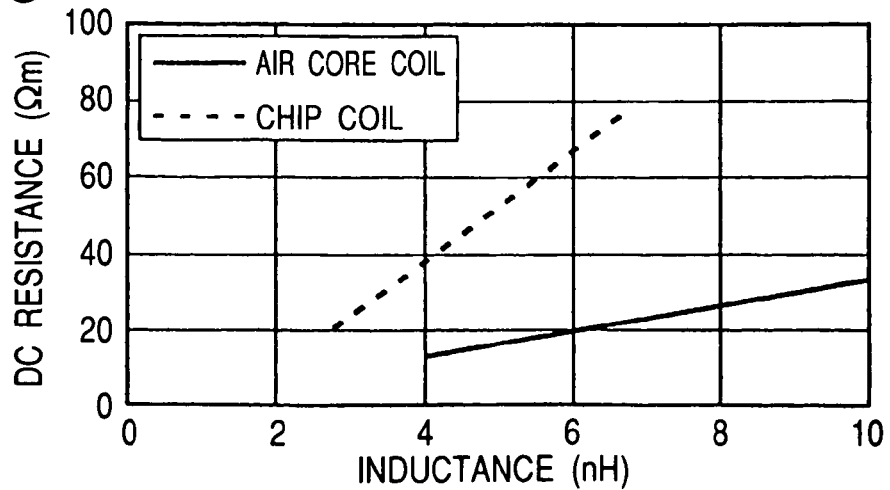
FIG. 9 is a graph showing the correlation between the D.C. resistance and the inductance in the air core coil and the chip coil.

The transmission losses in a case wherein a chip inductor or an air core coil is respectively used on the power supply line are shown in FIG. 7 and FIG. 8. The chip inductor can reduce the transmission loss to about ¼ compared with the inner-layer strip line, and the air core coil can further reduce the D.C. loss to about ½ compared with the chip inductor. The air core coil and the chip inductor are compared in terms of D.C. resistance in FIG. 9. The loss reduction by the application of the air core coil corresponds to an approximately +5% improvement in power efficiency over the inner-layer strip line.

Figure 10:
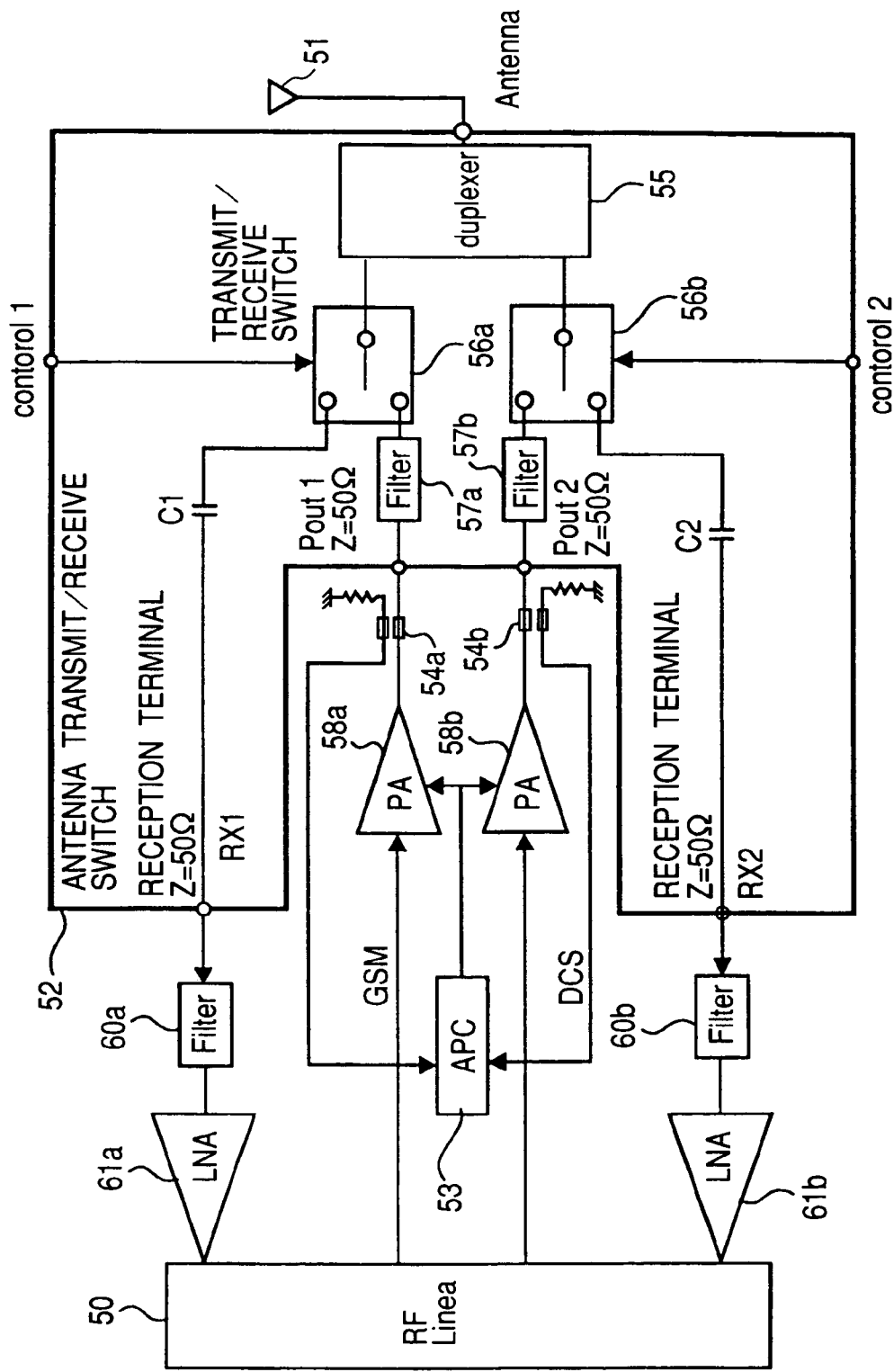
FIG. 10 is a block diagram showing a partial configuration of a mobile telephone into which the high frequency power amplifying device, which is this Embodiment 1, is incorporated.

Next will be described a mobile telephone (electronic device) into which the high frequency power amplifying device 1 is incorporated. FIG. 10 is a block diagram showing the system configuration of the mobile telephone (wireless communication device) into which the high frequency power amplifying device 1, which is this Embodiment 1, is incorporated. More specifically, it shows the system configuration of the mobile telephone (mobile communication terminal).

FIG. 10 is a block diagram showing part of a dual band wireless communication apparatus, the part ranging from a high frequency signal processing IC (RF linear) 50 to an antenna 51. Incidentally in FIG. 10, two separate amplifying lines of the high frequency power amplifying device are shown, one for GSM use and the other for DCS use, and their amplifiers are shown as power amplifiers (PAs) 58a and 58b.

The antenna 51 is connected to the antenna terminal (marked "Antenna") of an antenna transmit/receive switch 52. The antenna transmit/receive switch 52 has terminals Pout 1 and Pout 2 to which the outputs of PAs 58a and 58b are inputted, reception terminals RX1 and RX2, and control terminals control 1 and control 2.

Signals for GSM use from the high frequency signal processing IC 50 are fed to the PA 58a and outputted to Pout 1. The output of the PA 58a is detected by a coupler 54a, and the resultant detection signal is fed back to an automatic power control circuit (APC circuit) 53. The APC circuit 53, operating in accordance with the detection signal, controls the PA 58a.

Similarly, signals for DCS use from the high frequency signal processing IC 50 are fed to the PA 58b and outputted to Pout 2. The output of the PA 58b is detected by a coupler 54b, and the resultant detection signal is fed back to the APC circuit 53. The APC circuit 53, operating in accordance with the detection signal, controls the PA 58b.

The antenna transmit/receive switching unit 52 has a duplexer 55. This duplexer 55 has terminals, of which one is connected to the antenna terminal Antenna, and one of the other two terminals is connected to a transmit/receive switch 56a for GSM use, while the other is connected to a transmit/receive switch 56b for DCS use.

The contact a of the transmit/receive switch 56a is connected to Pout 1 via a filter 57a. The contact b of the transmit/receive switch 56a is connected to the reception terminal RX1 via the capacitance C1. The transmit/receive switch 56a is switched in electrical connection to the contact a or the contact b by a control signal inputted to the control terminal control 1.

The contact a of the transmit/receive switch 56b is connected to Pout 2 via a filter 57b. The contact b of the transmit/receive switch 56b is connected to the reception terminal RX2 via the capacitance C2. The transmit/receive switch 56b is switched in electrical connection to the contact a or the contact b by a control signal inputted to the control terminal control 2.

Between the reception terminal RX1 and the high frequency signal processing IC 50 are successively connected a filter 60a and a low noise amplifier (LNA) 61a. Also, between the reception terminal RX2 and the high frequency signal processing IC 50 are successively connected a filter 60b and a low noise amplifier (LNA) 61b.

This wireless communication apparatus makes possible GSM communication and DCS communication.

Figure 34:
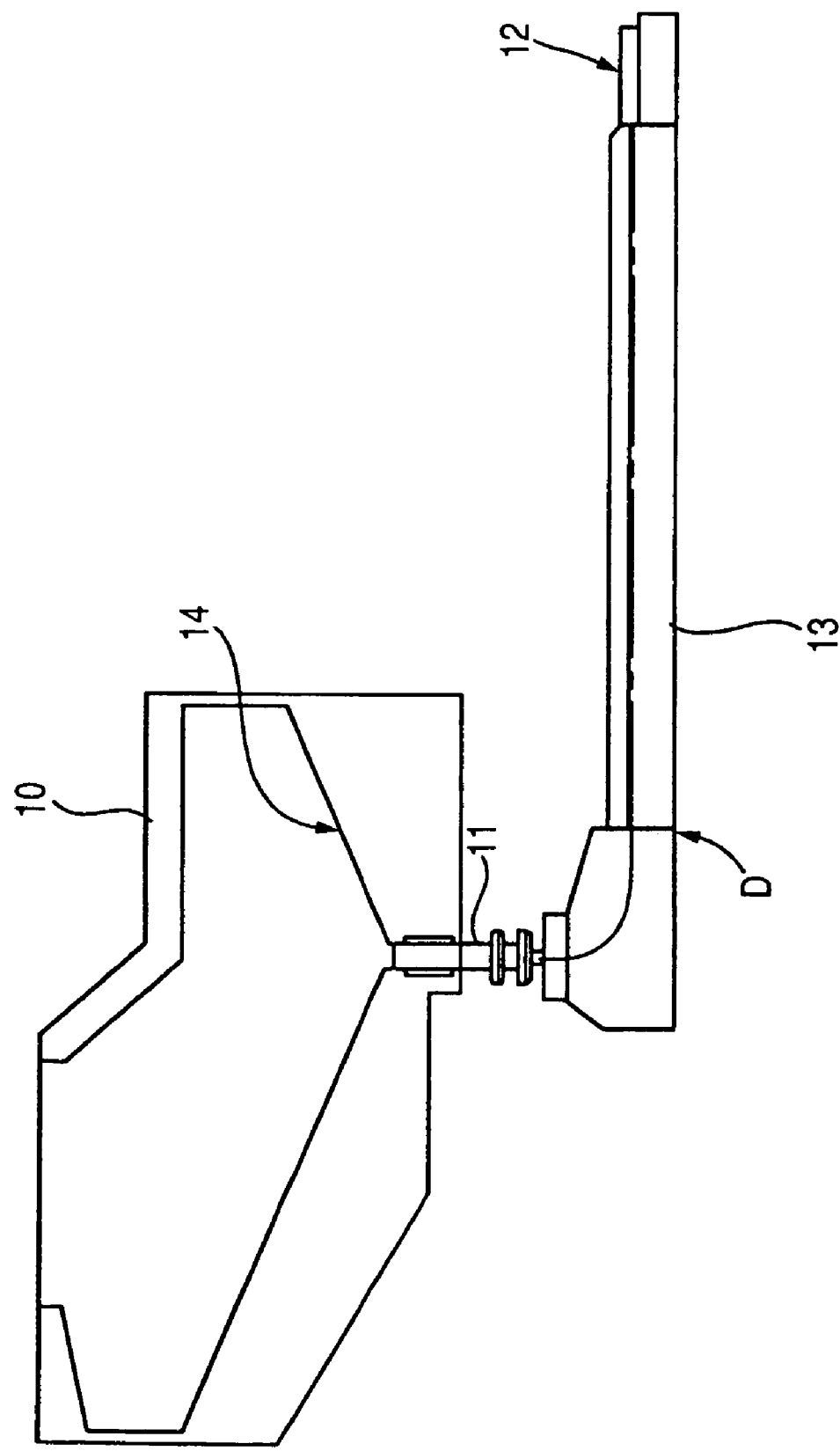
FIG. 34 shows a typical view of a bulk feeder according to the prior art.
Figure 35:
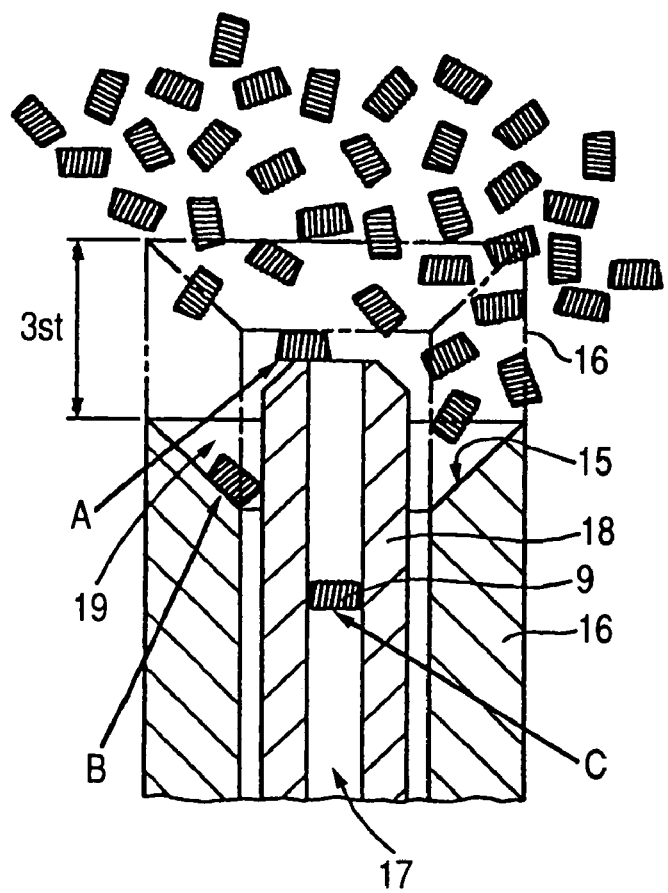
FIG. 35 shows a typical section of the hopper portion of bulk feeder according to the prior art.
Figure 36:
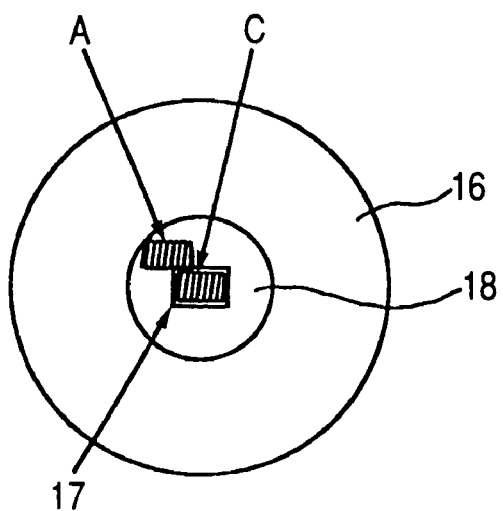
FIG. 36 shows a plan of the hopper portion according to the prior art.
Figure 37:
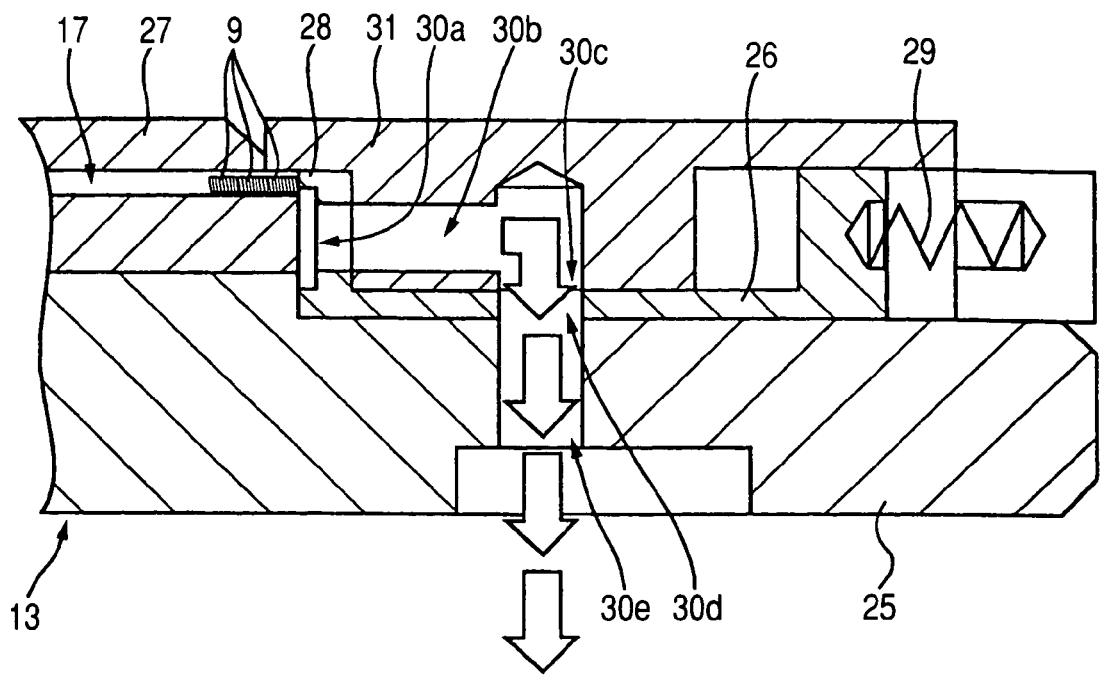
FIG. 37 shows an enlarged section of the bulk feed section of the bulk feeder according to the prior art in a state under vacuum suction.
Figure 38:
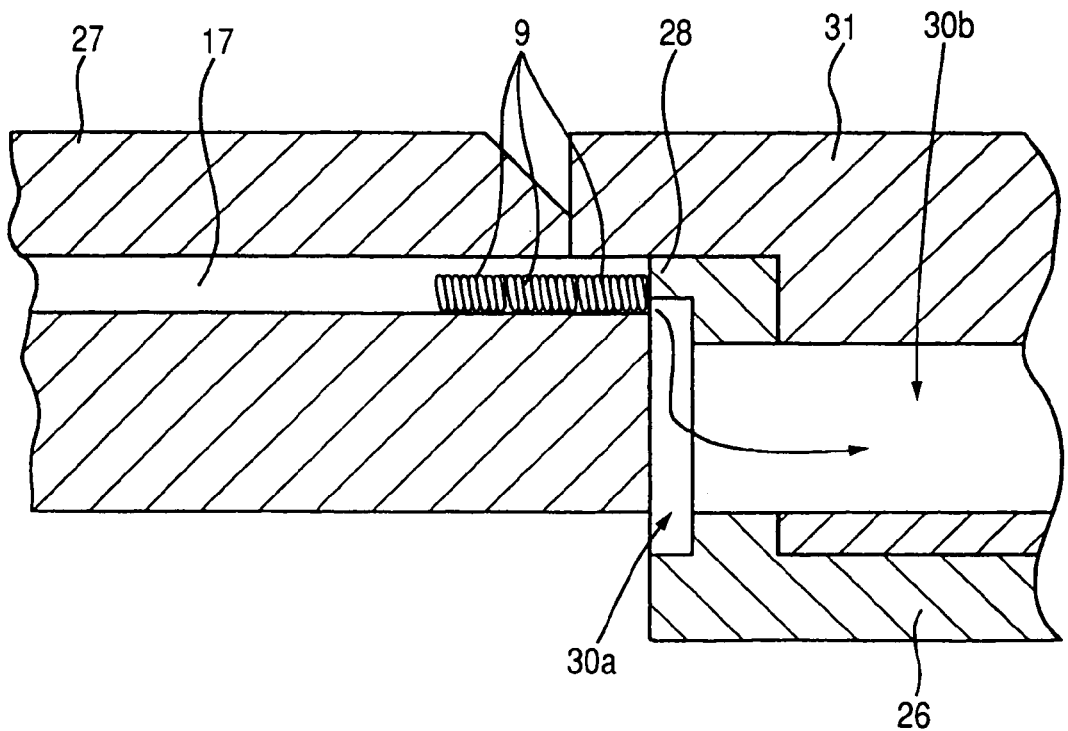
FIG. 38 shows a further enlarged section of part of FIG. 37.
Figure 39:
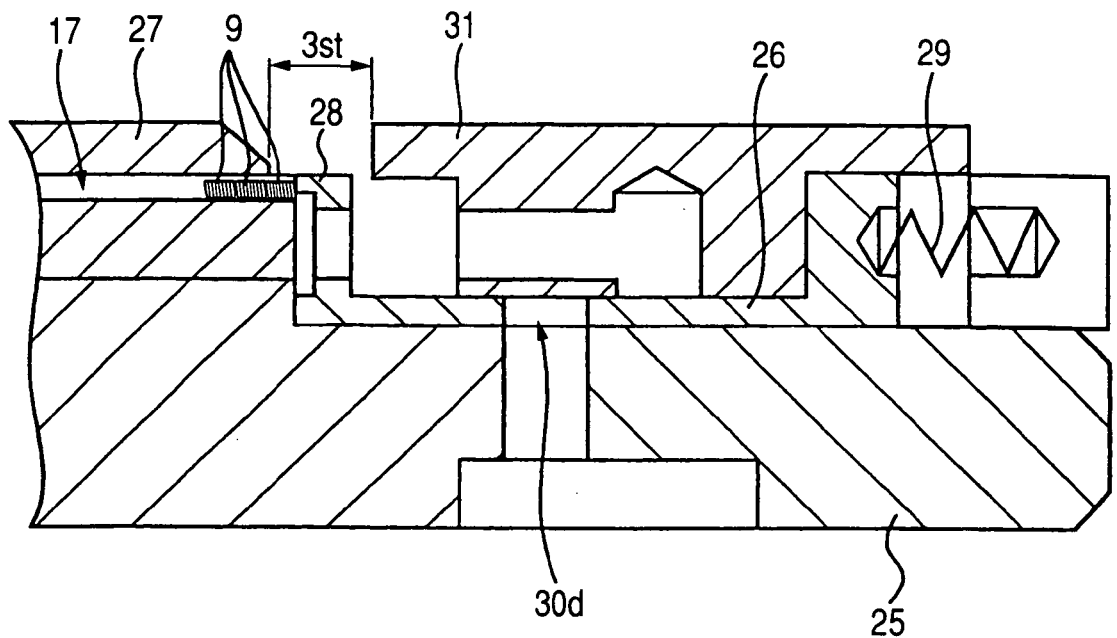
FIG. 39 is an enlarged sectional view of the bulk feed section according to the prior art in a state in which the shutter is open.
Figure 40:
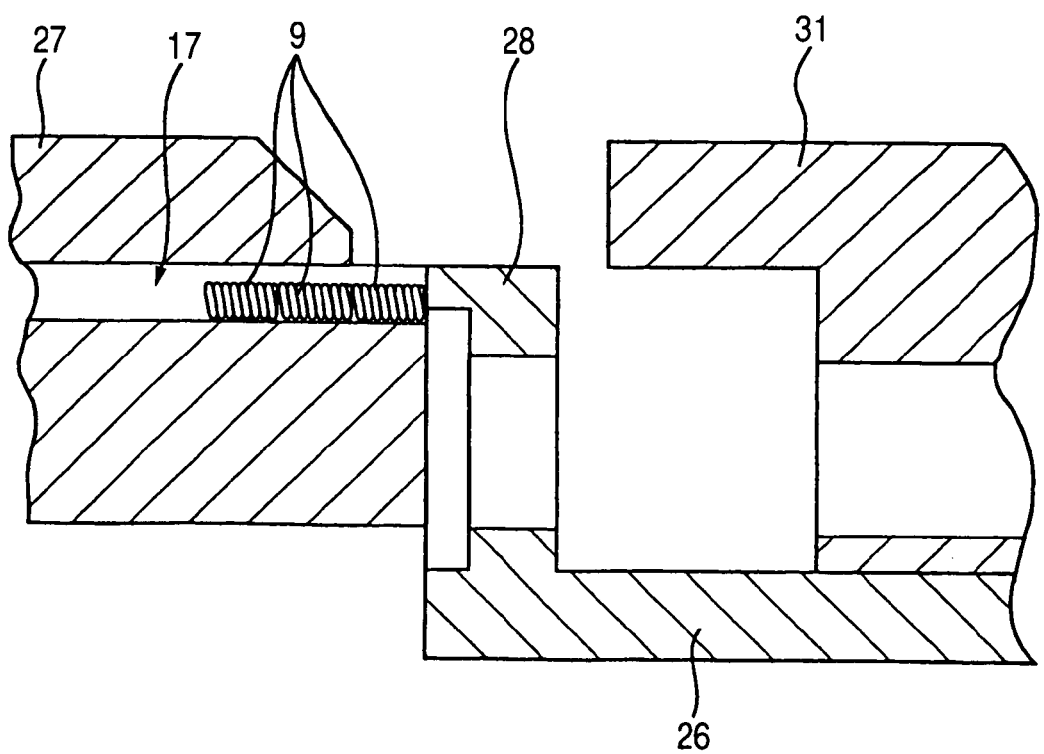
FIG. 40 shows a further enlarged section of part of FIG. 39.
Figure 41:
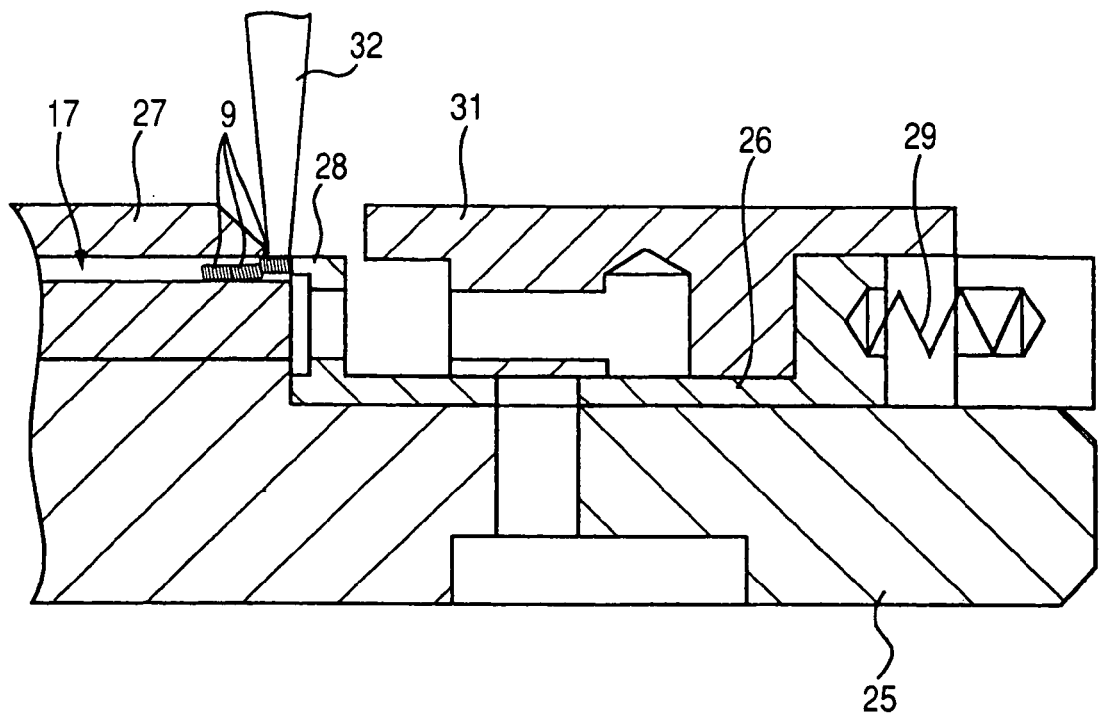
FIG. 41 shows an enlarged section of a state in the bulk feeder according to the prior art in which a coil from the bulk feed section is held by a collet.
Figure 42:
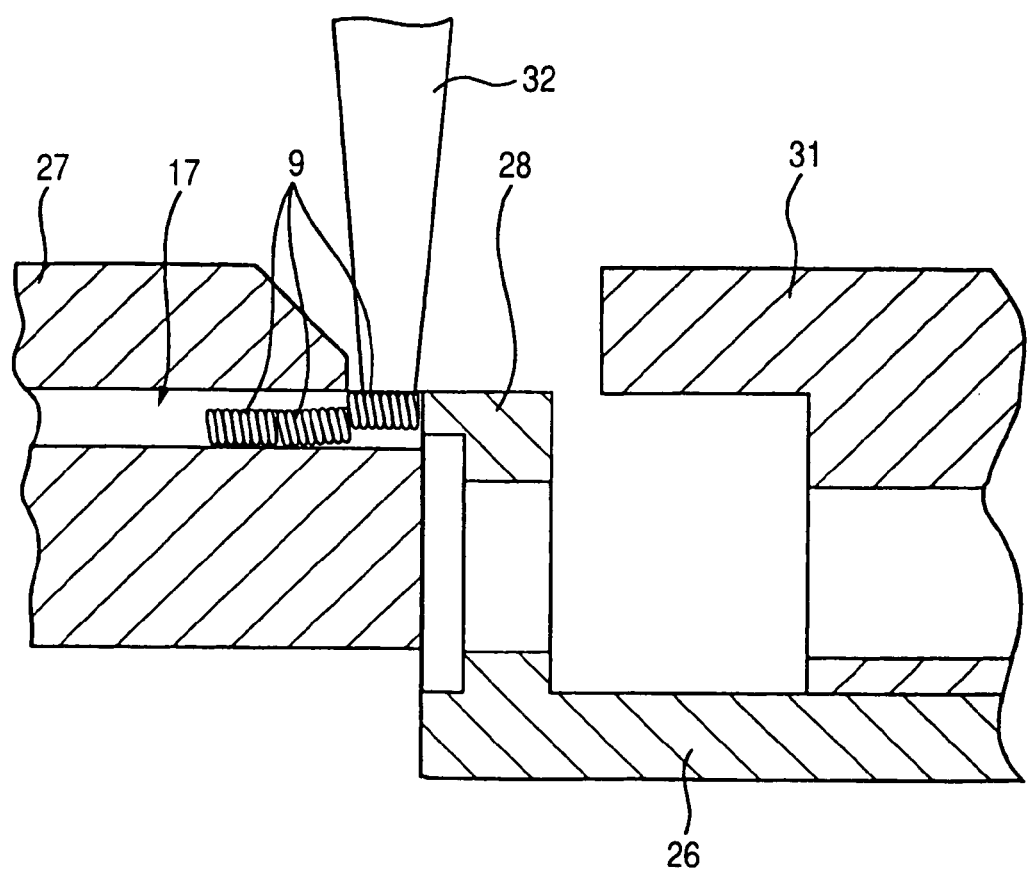
FIG. 42 shows a further enlarged section of part of FIG. 41.

Next will be described the technique of packaging air core coils 9 in the manufacture of the high frequency power amplifying device 1. In packaging air core coils 9, a bulk feeder 21 shown in FIG. 11, which also is a semiconductor manufacturing apparatus, is used. The bulk feeder 21 of this Embodiment 1 is an improved version of the bulk feeder shown in FIG. 34, enabled to stably feed air core coils 9.

The bulk feeder 21, though similar to the conventional one in that it has the bulk accommodating case 10, the hopper 11, the conveyor rail 13 and the bulk feed section 12, is improved for stable feeding of air core coils by, ① in the hopper 11 part, restraining the stopping of air core coils 9 on the feed shaft 18, restraining air core coils 9 from being rolled between the feed shaft 18 and the frustum concave 15, and restraining air core coils 9 from clogging the guide hole 17 in the feed shaft 18.

② In the conveyor rail 13, the guide hole 17 is formed of a single member in order to prevent air core coils 9 from being caught by any seam.

③ In the bulk feed section 12, to prevent the leading one of the air core coils 9 proceeding in tandem from being entangled with the second air core coil 9, there is introduced a means to separate the leading air core coil 9 from the following air core coil 9 at a stage before it is held by the collet 32.

Figure 11:
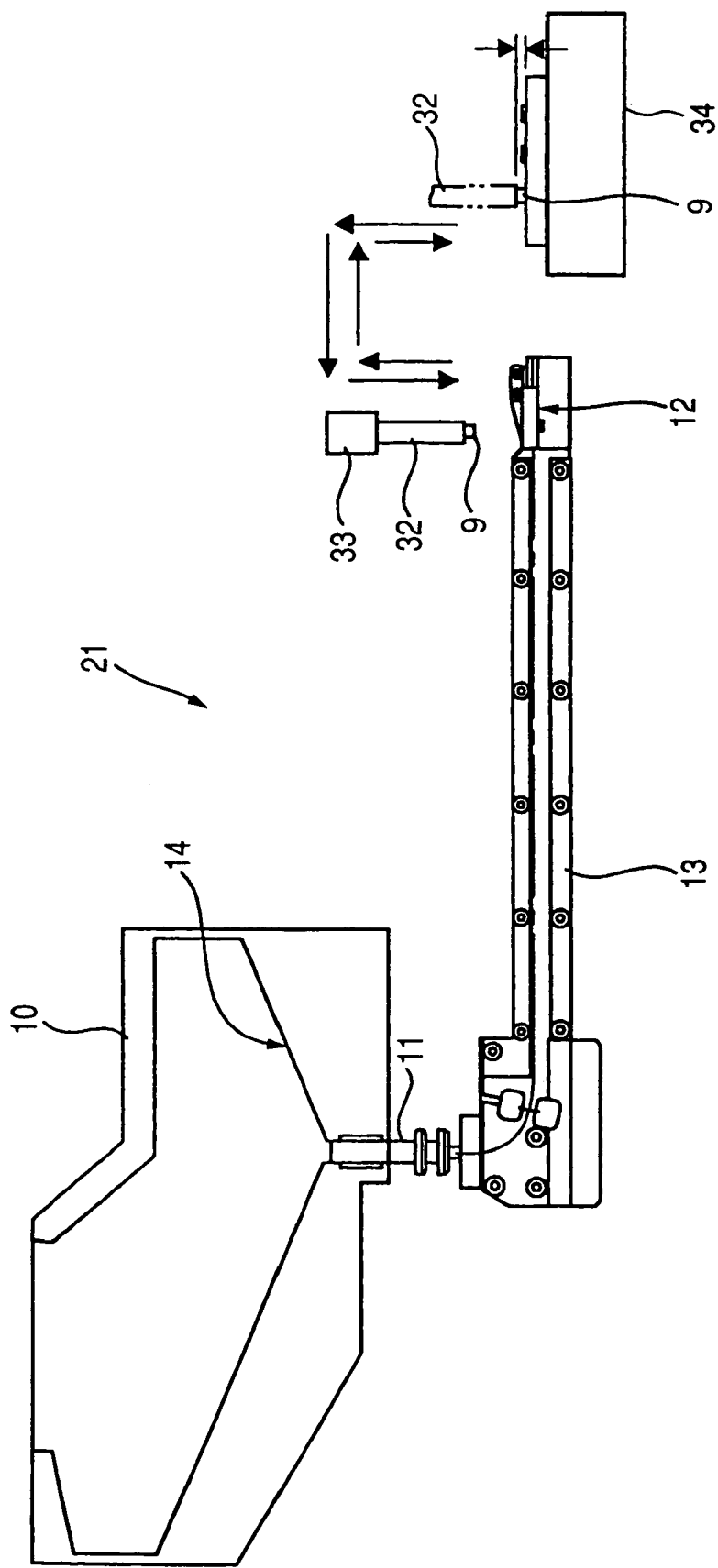
FIG. 11 shows a typical view of a state in which the coil is packaged on the module substrate in the high frequency power amplifying device, which is this Embodiment 1, by using a bulk feeder, a collet and so forth pertaining to the invention.

The method of packaging air core coils 9 using such a bulk feeder 21 (semiconductor device manufacturing method) is executed, as shown in FIG. 11, by moving the collet 32 fitted to the tip of a moving arm 33 between the bulk feed section 12 and a table 34 on which the module substrate 5 is mounted as indicated by arrows. In this process, after the leading air core coil 9 is separated from the following air core coil 9 in a mechanism to be described afterwards, the air core coil 9 is held by the collet 32 by vacuum suction.

This packaging of this air core coil 9 is carried out after mounting other electronic components than the air core coil 9, such as chip resistors and chip capacitors. If the air core coil 9 were packaged earlier, when the electronic components which are less in mounted height than the air core coil 9 are packaged, the collet might come into contact with the packaged air core coil 9. This contact might give rise to, for instance, a crack or division in the solder 24 part connecting the electrodes 23 of the air core coil 9 to the electrode fixing pads 4b. The purpose is to prevent this kind of trouble from occurring.

FIGS. 12(a) through 12(c) show typical views of the state in which the air core coil 9 is packaged. After the air core coil 9 fed from the bulk feed section 12 of the bulk feeder 21 is held on the sucking face at the lower end of the collet 32 by vacuum suction, it is carried to the air core coil fitting position over the module substrate 5 as shown in FIG. 12(a). The sucking face of the collet 32 has an arced section to match the outer circumference of the cylindrical air core coil.

Next, as shown in FIG. 12(b), the pair of electrodes 23 of the air core coil 9 are positioned over the pair of electrode fixing pads 4b of the module substrate 5 so that each electrode be superposed over the other pad, and the air core coil 9 is mounted over the module substrate 5 in that position.

Then, the solder 24 provided in advance over the electrode fixing pads 4b is temporarily melted by reflowing to fix the electrodes 23 on the solder 24, and the packaging is thereby completed as shown in FIG. 12(c).

Next will be described the bulk feeder 21 with reference to FIG. 11 through FIG. 25. Whereas FIG. 11 and others are partial, simplified drawings, the following description will mainly focus only on improvements over the conventional bulk feeder.

As shown in FIG. 11, the bulk feeder 21 of this Embodiment 1 has the bulk accommodating case 10 for accommodating bulk, the hopper 11 provided underneath this bulk accommodating case 10, and the conveyor rail 13 for guiding the bulk, taken in from this hopper 11, to the bulk feed section 12 at the tip.

The bulk accommodating case 10 is structured in a thin box shape, with its inner bottom constituting slopes 14 for gathering the bulk from both sides toward the center. At the center of these slopes 14 is arranged the hopper 11 vertically penetrating the central part. This hopper 11 is so structured that the bulk gathered in the inner bottom part of the slopes 14 be aligned in tandem to be taken out of the bulk accommodating case 10. Regarding this Embodiment 1, a case of feeding air core coils in bulk will be described.

Figure 13:
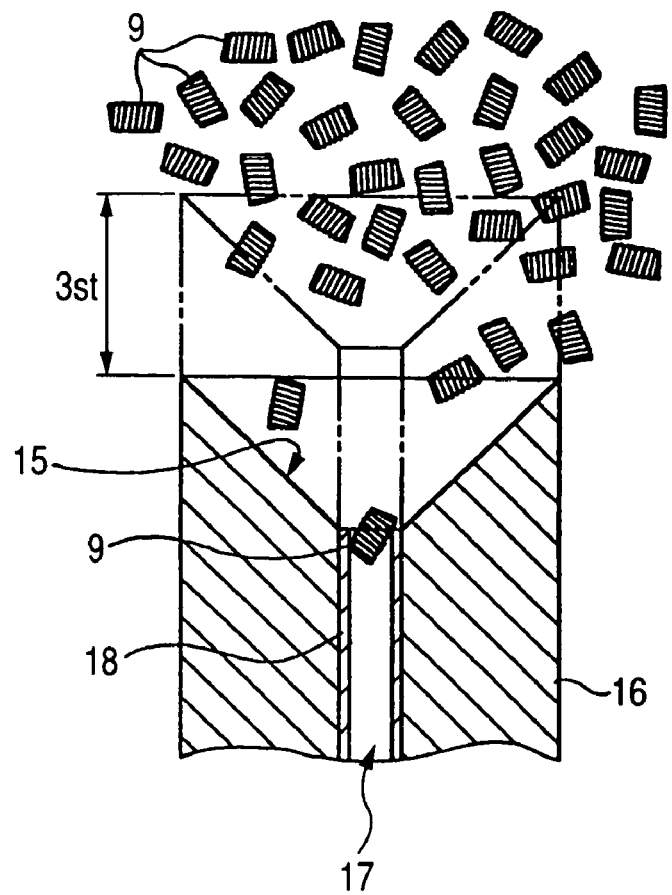
FIG. 13 shows a typical sectional view of the hopper portion in the bulk feeder.
Figure 14:
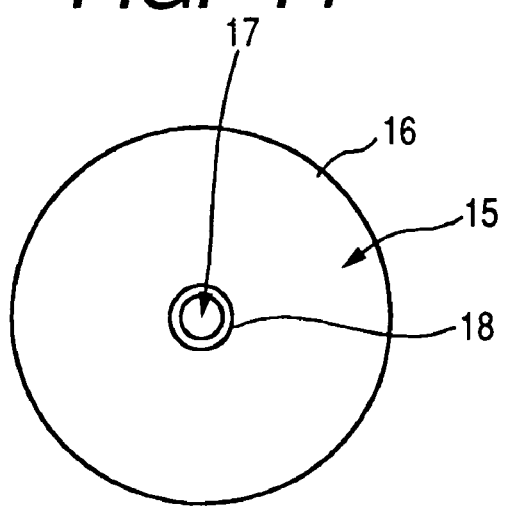
FIG. 14 is a plan of the hopper.

As shown in FIG. 13 and FIG. 14, the hopper 11 is configured of a guide 16 having the frustum concave 15 at the top end, and the feed shaft 18 having the guide hole 17 piercing this guide 16 and guiding the air core coils 9 aligned in tandem (a state in which the air core coils 9 are aligned with the electrode at the rear end of an air core coil 9 being in contact with the electrode at the fore end of the immediately following air core coil 9) along the center axis. The feed shaft 18 is formed in a cylindrical shape and has at its center the guide hole 17 with a round section. The air core coil 9 measures 0.56 mm in maximum outer diameter and 0.9 mm in length.

Then in this Embodiment 1, in order not to let any air core coil topple sideways in the guide hole 17 and block the hole, the diameter of the guide hole 17 is set smaller than the 0.9 mm length of the air core coil 9 and greater than the 0.56 mm maximum outer diameter of the air core coil 9. For instance, the guide hole 17 is 0.68 mm in bore, so that the guide hole 17 cannot be blocked by any air core coil 9 turned sideways.

Further as shown in FIG. 13, the guide 16 vertically oscillates in a stroke three times as great as the length (0.9 mm) of the air core coil 9, and guides the air core coil 9 in the bulk accommodating case 10 to the center of the frustum concave 15. In this oscillation, the top end of the feed shaft 18 is structurally prevented from protruding into the frustum concave 15 of the feed shaft 18. The drawing illustrates a state in which the guide 16 is at its bottom dead center and the top end of the feed shaft 18 coincides with the bottom of the frustum concave 15.

This arrangement eliminates the trouble with the prior art that the air core coil 9 is held between the outer circumference of the feed shaft 18 and the surface of the frustum concave 15, and prevents the air core coil 9 from being deformed or the apparatus from running into trouble which might be caused by the squeezing due to such holding.

Figure 15:
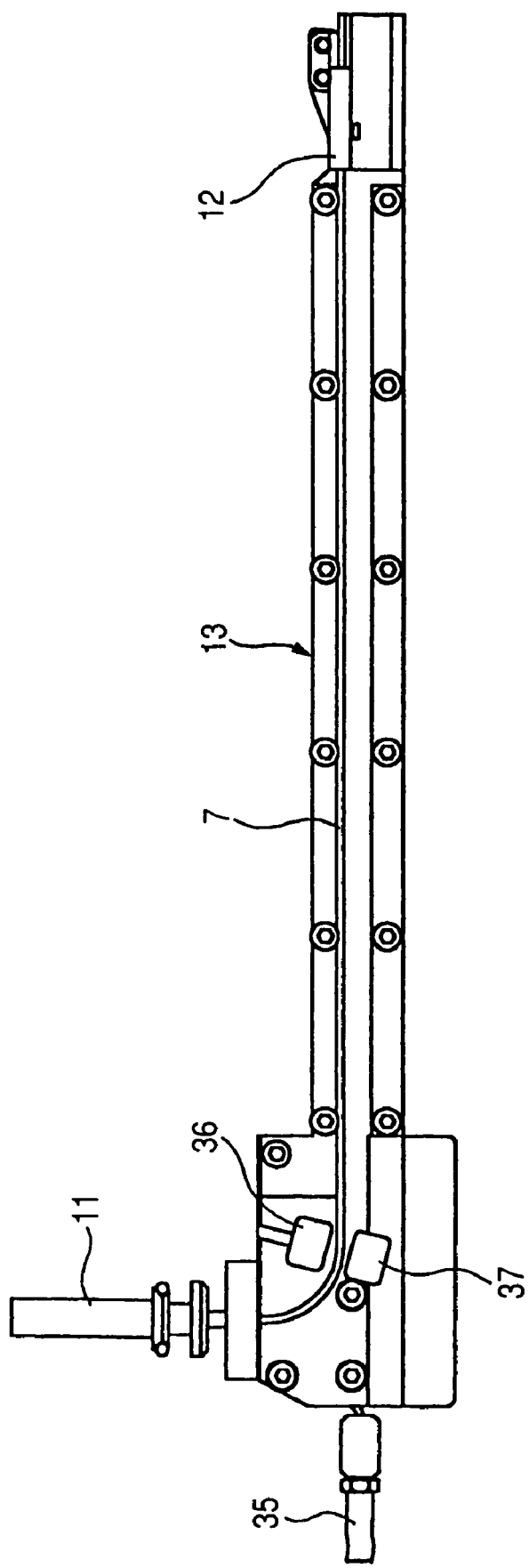
FIG. 15 shows a typical front view of a coil conveyor rail, continuous to the hopper, for carrying the coil.
Figure 16:
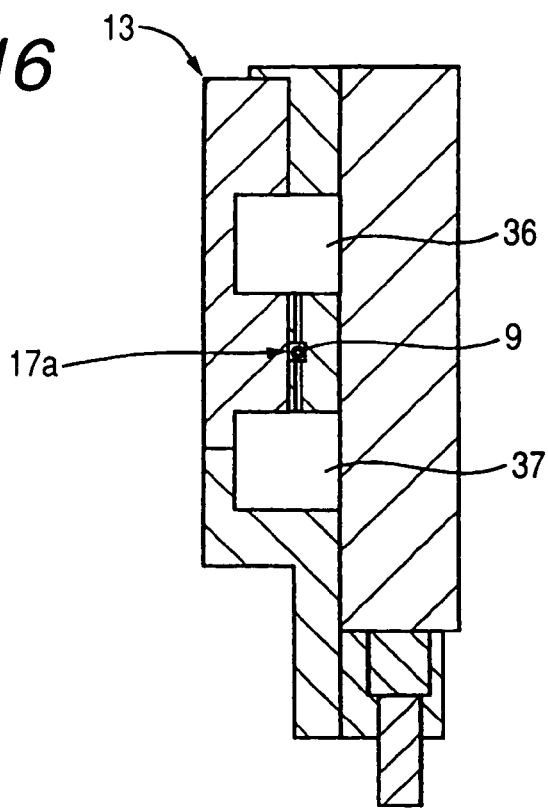
FIG. 16 shows a section of the detecting portion of the coil in the hopper.

FIG. 15 shows an enlarged typical view of the conveyor rail 13. The conveyor rail 13 is also provided with a guide hole 17a communicating to the guide hole 17 of the feed shaft 18. This guide hole 17a, as typically illustrated in FIG. 15, is formed by providing a groove in a prescribed member and blocking this groove. The tip of the conveyor rail 13 constitutes the bulk feed section 12, and the guide hole 17a from the feed shaft 18 to the bulk feed section 12 is formed of a single member. The conveyor rail 13 is formed by combining a plurality of members. Though description of these members will be dispensed with, they are combined, for instance, as shown in FIG. 16. A vacuum suction passage is formed of a pipe in the part shown in FIG. 16, but its illustration is also dispensed with.

Since the bulk feeder 21 of this Embodiment 1 has no seam which would catch the air core coil 9 on the way of the conveyor rail 13, the air core coil 9 is smoothly transferred by the guide hole 17a to the bulk feed section 12. This transfer is accomplished by a vacuum suction mechanism (not shown). To the left end of the conveyor rail 13 is fitted a pipe 35 leading to the vacuum suction mechanism. This pipe 35 passes inside the lower part of a conveyor rail body 25 constituting the conveyor rail 13 to extend to the bulk feed section 12, and communicates to a vacuum suction passage to be described afterwards. The pipe carries out vacuum suction from the bulk feed section 12 side to transfers the air core coil 9 towards the bulk feed section 12.

Therefore as each air core coil 9 is transferred by vacuum suction, air core coils 9 before and behind are in close contact with each other, which may invite intertwisting of their ends.

Figure 17:
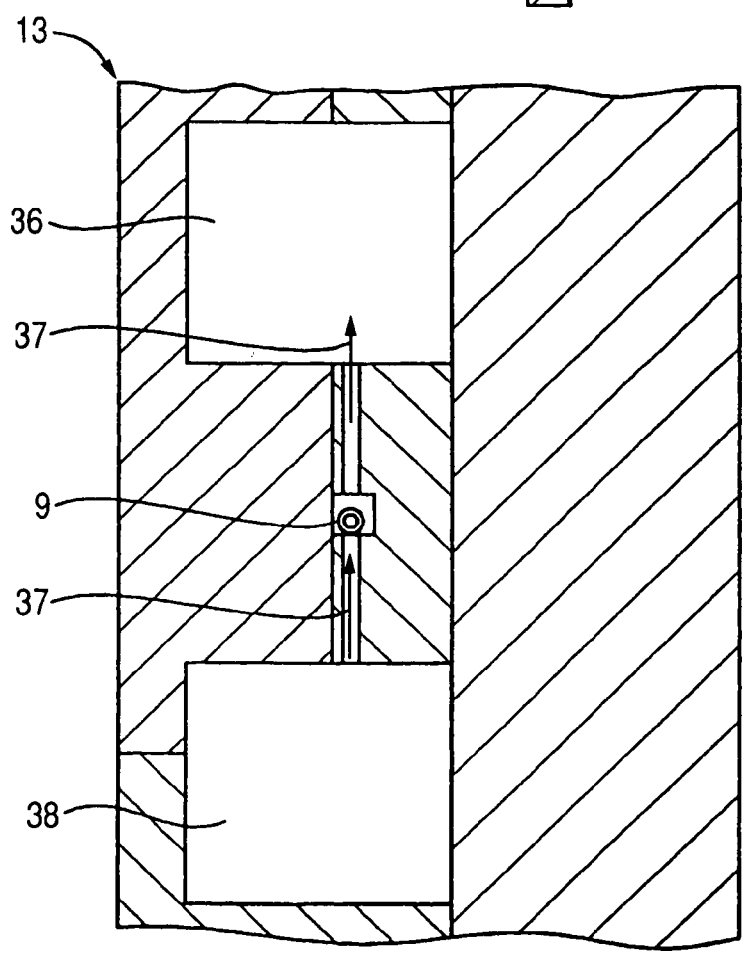
FIG. 17 shows an enlarged section of part of FIG. 16.

FIG. 15 through FIG. 17 illustrate a light emitting element 36 for detecting the passing air core coils 9 in part of the guide hole 17a and a light receiving element 38 for receiving a light 37 emitted by that light emitting element 36. When the feed shaft is filled with air core coils 9 to this sensor position, the vertical movement of the hopper is stopped to prevent any more coil from entering the feed shaft.

Figure 18:
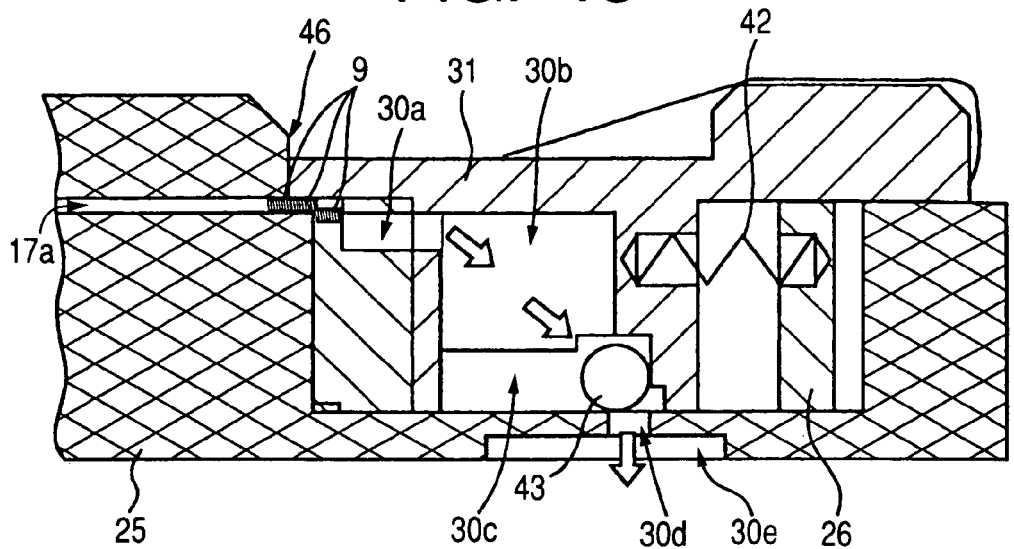
FIG. 18 shows an enlarged section of the bulk feed section at the tip of the coil conveyor rail in a state of vacuum suction.

The bulk feed section 12 is structured as shown in FIG. 18, and operates as illustrated in FIG. 18 through FIG. 25. The bulk feed section 12, as shown in FIG. 18, has a step lower concave in the upper side of the tip of the conveyor rail body 25 towards the tip of the conveyor rail 13, and the slider 26 is fitted in this concave to be able to reciprocate in the transferring direction of air core coils 9. The stroke of that reciprocation is, for instance, about half (0.5 St) of the length of the air core coil 9 (see FIG. 23).

Figure 19:
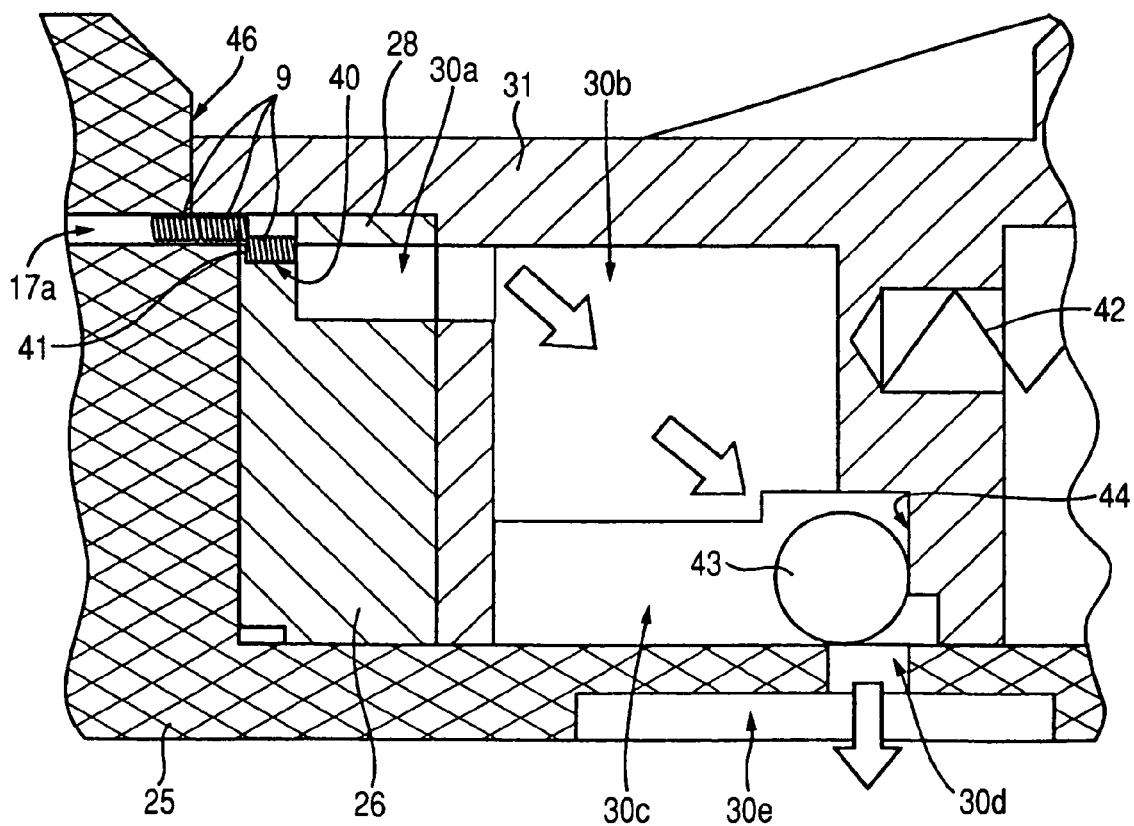
FIG. 19 shows a further enlarged section of part of FIG. 18.

The guide hole 17a guiding the air core coil 9 extends to the left end of the slider 26. As shown in FIG. 19, at the left end of the slider 26, there is provided a receptacle 40 that can accommodate one air core coil 9. At one end of this receptacle 40, i.e. the right end farther from the edge of the guide hole 17a, there is provided a stopper portion 28, and a projection 41 is provided at the left end, closer to the edge of the guide hole 17a.

The stopper portion 28 has a reference face for defining the fore end position of the leading air core coil 9 having proceeded within the guide hole 17a and dropped into the receptacle 40. The projection 41 performs the role of so pushing from behind the leading air core coil 9 that it may move ahead without fail when the slider 26 shifts (ahead) in the direction of going away from the edge of the guide hole 17a as described above (for the projection 41, see FIG. 23).

In the slider 26, the stopper portion 28 comes into contact with the upper side of the fore end of the air core coil 9, and its lower part is a partially open space. This space constitutes the vacuum suction passage 30a for bringing the air core coil 9 into contact with the stopper portion 28 under vacuum suction.

This Embodiment 1 uses a configuration of positioning the guide hole 17a a step lower in accordance with the idea that the leading air core coil 9 can be separated from the following air core coil 9 and the two air core coils 9 can be prevented from catching each other by shifting the leading air core coil 9 in a direction crossing its proceeding direction. Further on the basis of the idea of separating the leading air core coil 9 from the following air core coil 9 and thereby preventing them from catching each other, the slider 26 is positioned 0.5 St ahead.

Therefore, according to the idea of separating the leading air core coil 9 from the following air core coil 9 and thereby preventing them from catching each other, the configuration may as well be such that the projection 41 is not provided, the receptacle 40 is arranged directly on the extension of the guide hole 17a and only the stopper portion 28 is provided. Thus it is a configuration in which the bottom of the guide hole 17a and the face of the receptacle 40 supporting the air core coil 9 is on the same plane. This is another configuration in which the present invention can be implemented.

In this Embodiment 1, since the receptacle 40 is a step lower than the guide hole 17a, the leading air core coil 9 moving ahead to the receptacle 40 under vacuum suction drops into the receptacle 40 and is positioned as its fore end comes into contact with the stopper portion 28. This causes the leading air core coil 9 to separate from the following air core coil 9.

The slider 26 is structured as a frame, and a shutter 31 is fitted spanning inside this frame and over the top face of this slider 26. Between the portion of the shutter within the frame of the slider 26 and the slider is a spring 42, whose elasticity is utilized to keep the shutter 31 pressed toward the edge of the guide hole 17a all the time.

The portion of the shutter 31 toward its left end blocks the top side of the tip of the guide hole 17a. Therefore, when the shutter 31 moves rightwards (ahead), a number of air core coils 9 towards the tip of the guide hole 17a are exposed and, depending on the length of their forward motion, the air core coil 9 (the leading air core coil 9) on the receptacle 40 of the slider 26 may also be exposed.

Vacuum suction passages 30b, 30c, 30d and 30e are also provided in the shutter 31 and the conveyor rail body 25. The vacuum suction passage 30d is a hole having a round section, and a sphere 43 rolling on the concave bottom of the conveyor rail body 25 can enter and block this hole, i.e. the vacuum suction passage 30d. As shown in FIG. 18 and FIG. 19, when the shutter 31 recedes and comes closest to the left end, a sphere controlling face 44 provided on the shutter 31 causes the sphere 43 to move leftwards (back), with the result that the sphere 43 comes off the hole and vacuum suction takes place. The thick arrows in the figures indicate the flow of air for vacuum suction.

Figure 20:
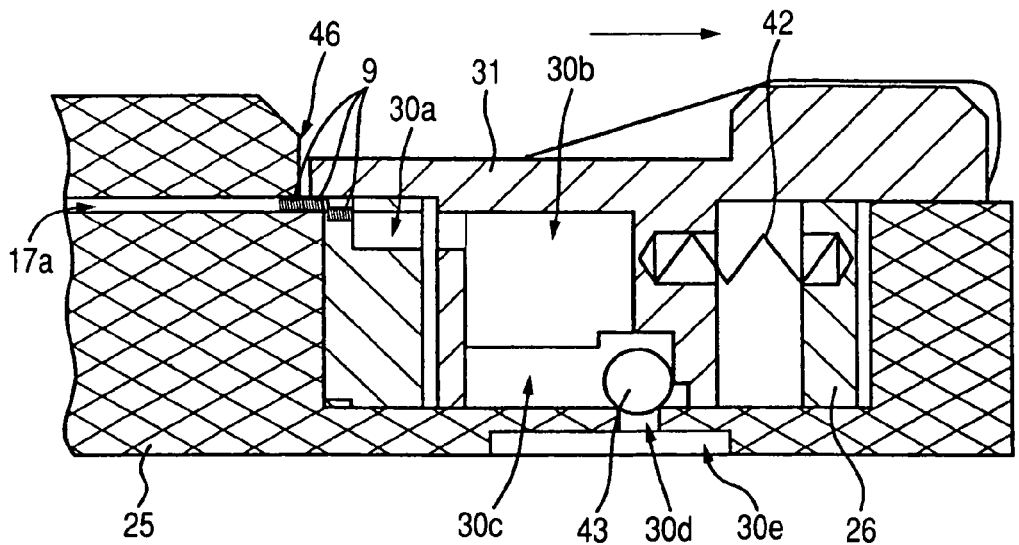
FIG. 20 shows an enlarged section of the bulk feed section in a state in which vacuum suction is stopped.
Figure 21:
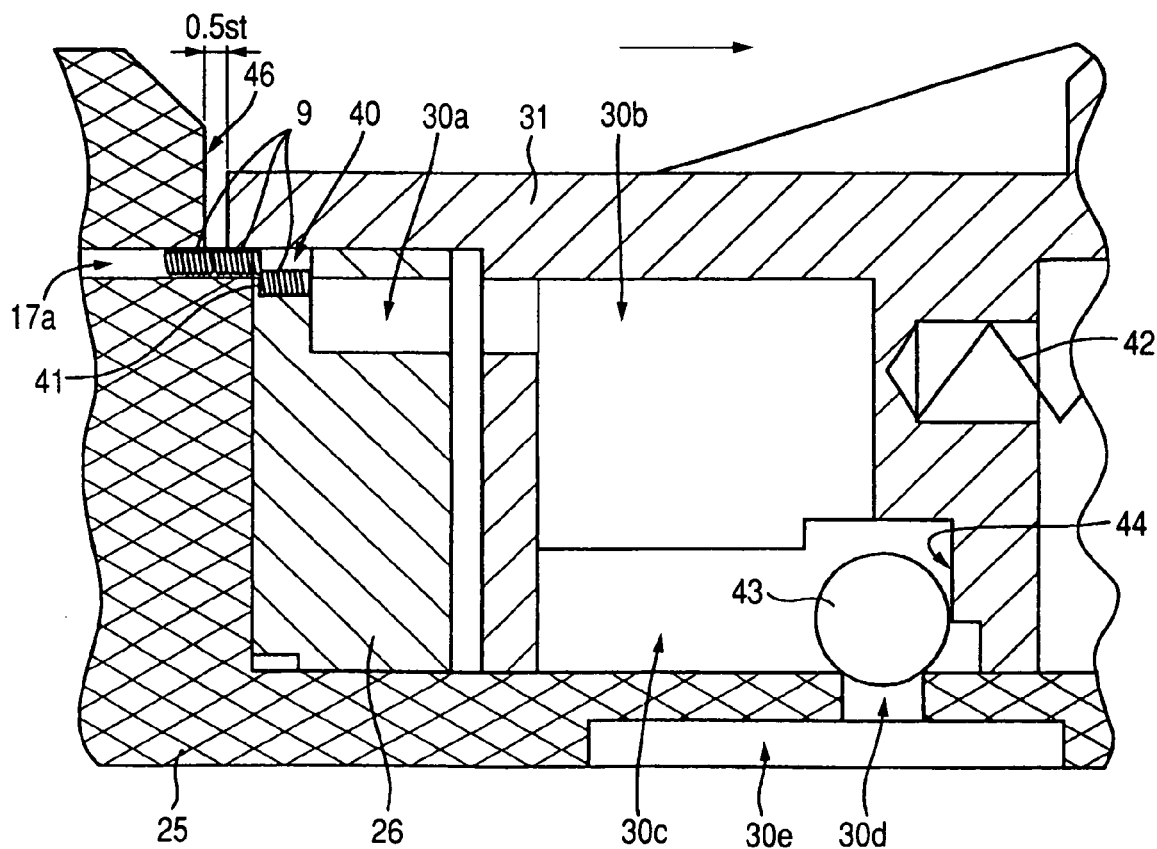
FIG. 21 shows a further enlarged section of part of FIG. 20.

As shown in FIG. 20 and FIG. 21, when the shutter 31 moves rightwards (ahead) by 0.5 St, the sphere controlling face 44 comes rightwards off the hole, with the result that the sphere 43 is moved by the vacuum suction force to partly enter the hole, blocks the vacuum suction passage 30d, and stops the vacuum sucking action. When the vacuum sucking action stops, the adhesive force between the air core coils 9 due to the vacuum suction is eliminated. Incidentally, the vacuum suction passage 30e communicates with the pipe 35 of the vacuum suction mechanism, and the vacuum suction also aligns the following air core coil 9 in the guide hole 17.

Next will be described the method by which air core coils 9 are fed in this bulk feed section 12. In the state in which air core coils 9 begin to be fed, both the slider 26 and the shutter 31 are recessed leftwards as shown in FIG. 18 and its enlarged version, FIG. 19. In this state, vacuum suction is performed as indicated by thick arrows, and the air core coils 9 in the guide hole 17a are aligned in tandem, with the leading air core coil 9 being in contact with the stopper portion 28. In these drawings, and in other illustrations too, three leading air core coils 9 will be shown. The leading air core coil 9 enters the receptacle 40 and, as shown in FIG. 19, the leading air core coil 9 and the following air core coil 9 are freed from intertwisting with each other.

Next, as indicated by arrows in FIG. 20 and its enlarged version, FIG. 21, the shutter 31 proceeds rightwards to stop vacuum suction. The proceeding length for this vacuum suction stopping is about half the length of the air core coil 9, i.e. 0.5 St. As the shutter 31 moves ahead, the sphere 43 is free from the control by the sphere controlling face 44, and turned by the vacuum suction force to block the vacuum suction passage 30d. In this process, the distance between the left end of the shutter 31 and the end of the conveyor rail body 25 part covering the guide hole 17a, i.e. the opening end 46, becomes 0.5 St, and the previously hidden top side of the air core coil 9 is exposed. However, the leading air core coil 9 over the receptacle 40 is blocked by the shutter 31.

Figure 22:
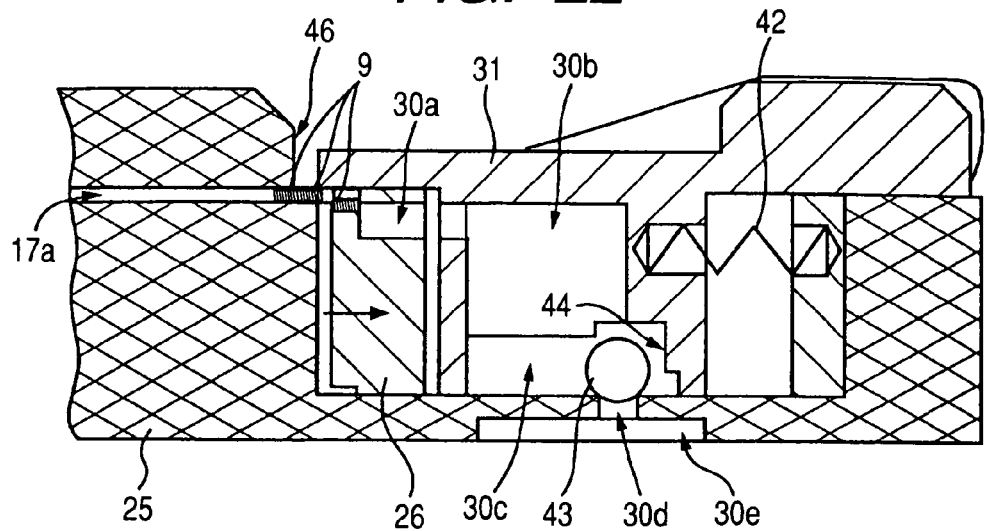
FIG. 22 shows an enlarged section of the bulk feed section in a state in which the leading coil is separated from the other coils.
Figure 23:
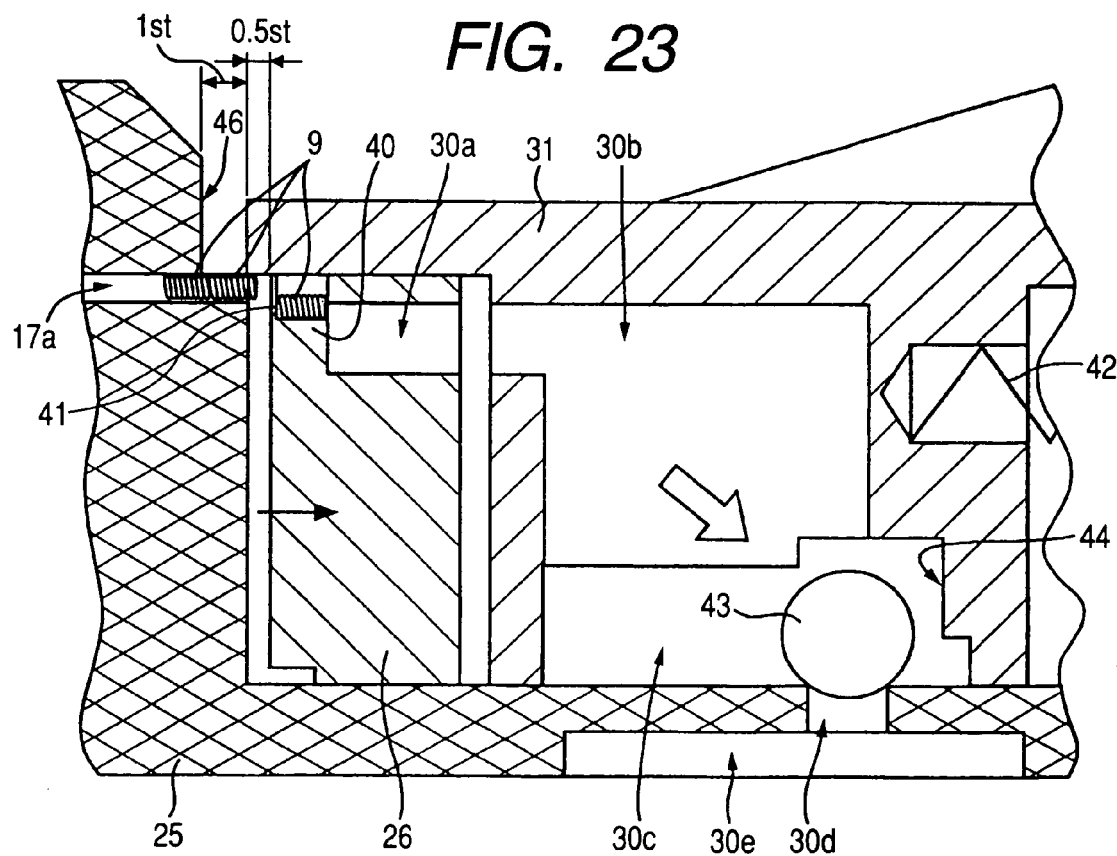
FIG. 23 shows a further enlarged section of part of FIG. 22.

Next, as indicated by arrows in FIG. 22 and its enlarged version, FIG. 23, the slider 26 proceeds rightwards. This proceeding length is about half the length of the air core coil 9, i.e. 0.5 St. The shutter 31, as it is riding on the slider 26, also moves by 0.5 St, and the distance between the left end of the shutter 31 and the end of the conveyor rail body 25 part covering the guide hole 17a, i.e. the opening end 46, becomes 1 St. Even though the slider 26 moves, the leading air core coil 9 proceeds by a distance of an independent carriage as vacuum suction is stopped, and the following (second) air core coil 9 remains as it is in the guide hole 17a. This completely separates the leading air core coil 9 and the following air core coil 9 from each other. Also in this state, the leading air core coil 9 over the receptacle 40 is blocked by the shutter 31.

Figure 24:
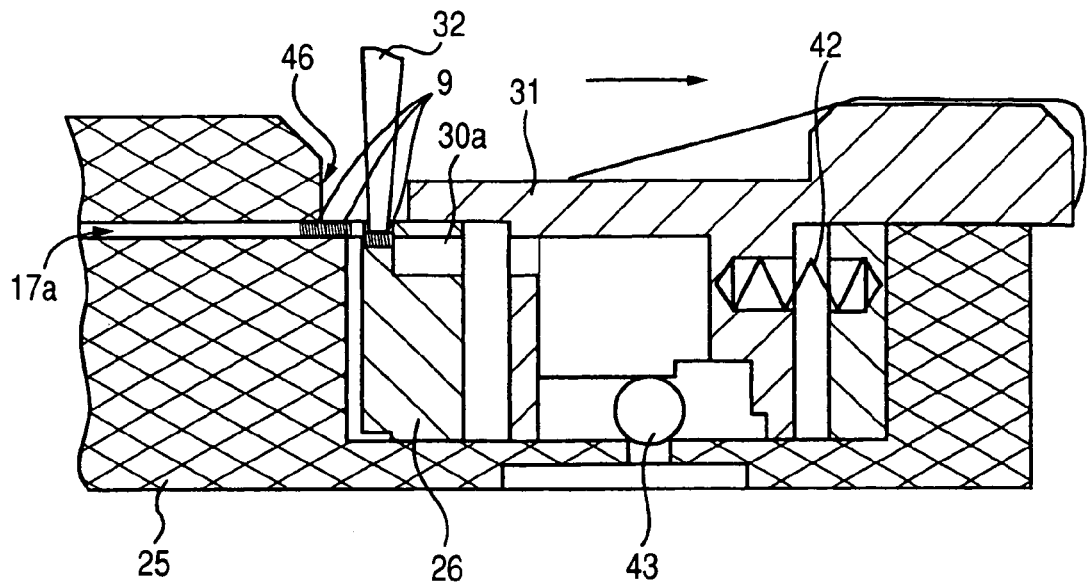
FIG. 24 shows an enlarged section of the coil at the tip of the bulk feed section in a state of being held by the collet.
Figure 25:
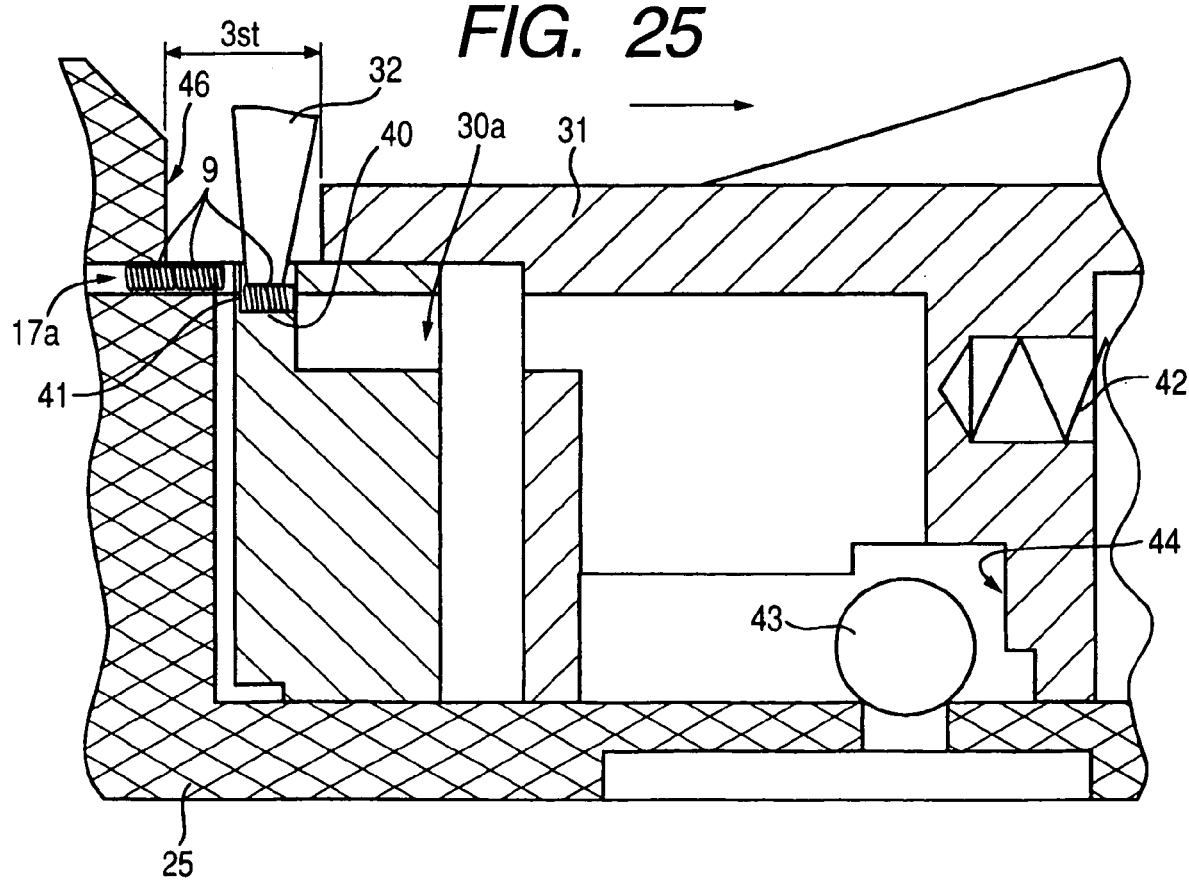
FIG. 25 shows a further enlarged section of part of FIG. 24.

Then, as indicated by arrows in FIG. 24 and its enlarged version, FIG. 25, the shutter 31 moves ahead. The purpose of this forward motion is to expose the leading air core coil 9 over the receptacle 40 blocked by the shutter 31, and the distance between the left end of the shutter 31 and the opening end 46 after the forward motion may be, though not particularly limited to, 3 St.

In this state, the collet 32 comes to hold the air core coil 9 over the receptacle 40 by vacuum suction. In this case, since the air core coil 9 is intertwisted with no other air core coil 9, it is accurately and securely held by the collet 32. The collet 32, as shown in FIG. 11 and FIGS. 12(a) through 12(c), carries and feeds the air core coil 9 over the module substrate 5.

Figure 26:
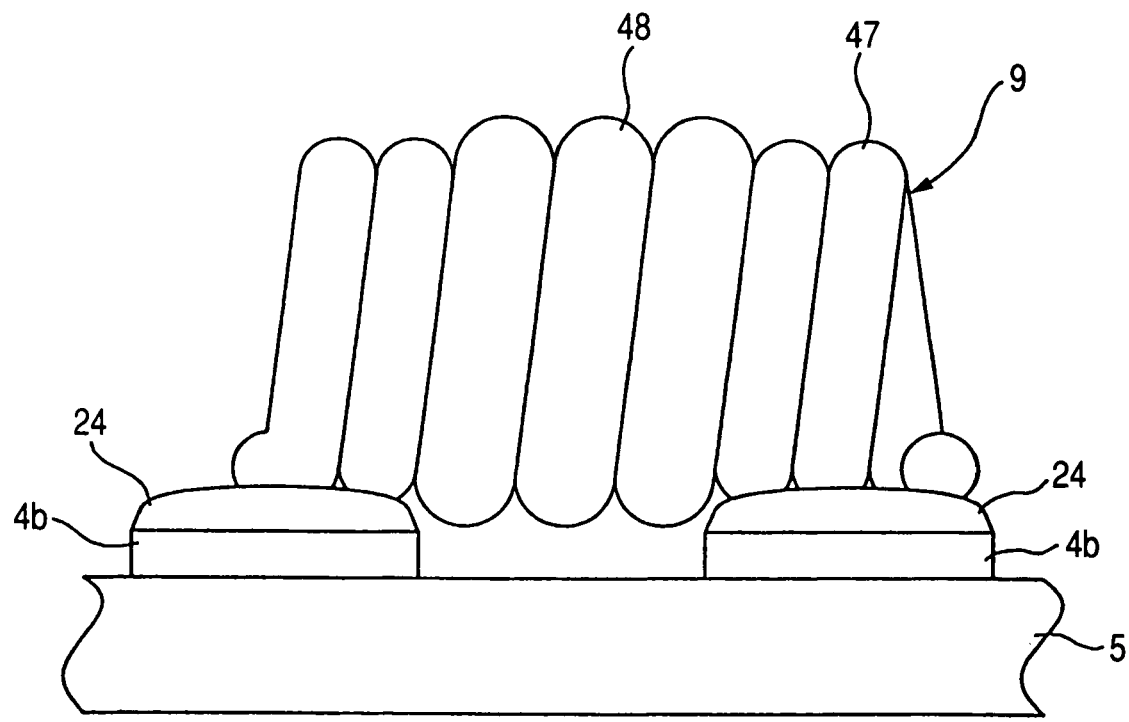
FIG. 26 shows an enlarged typical view of a coil of another structure in a state of being mounted over the module substrate.
Figure 27:
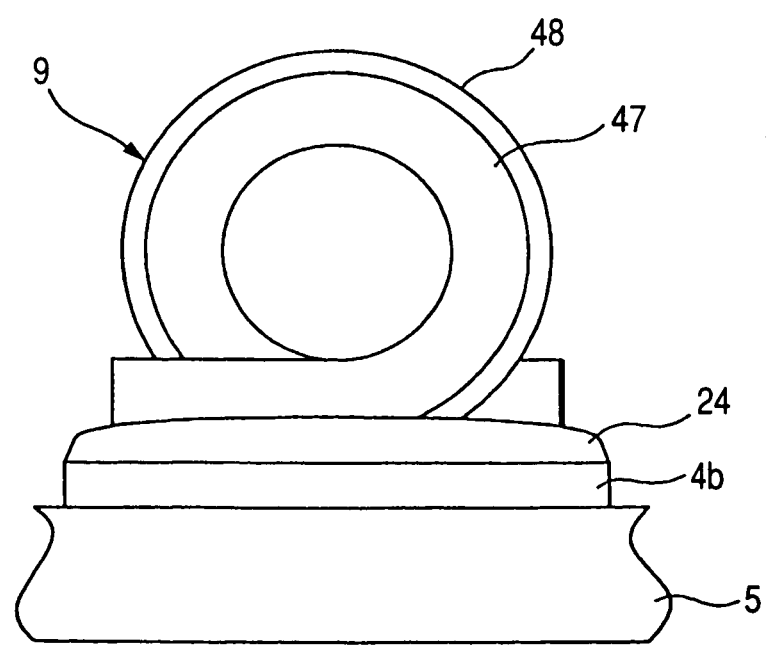
FIG. 27 shows an enlarged typical side view of the coil and so forth in FIG. 26.
Figure 28:
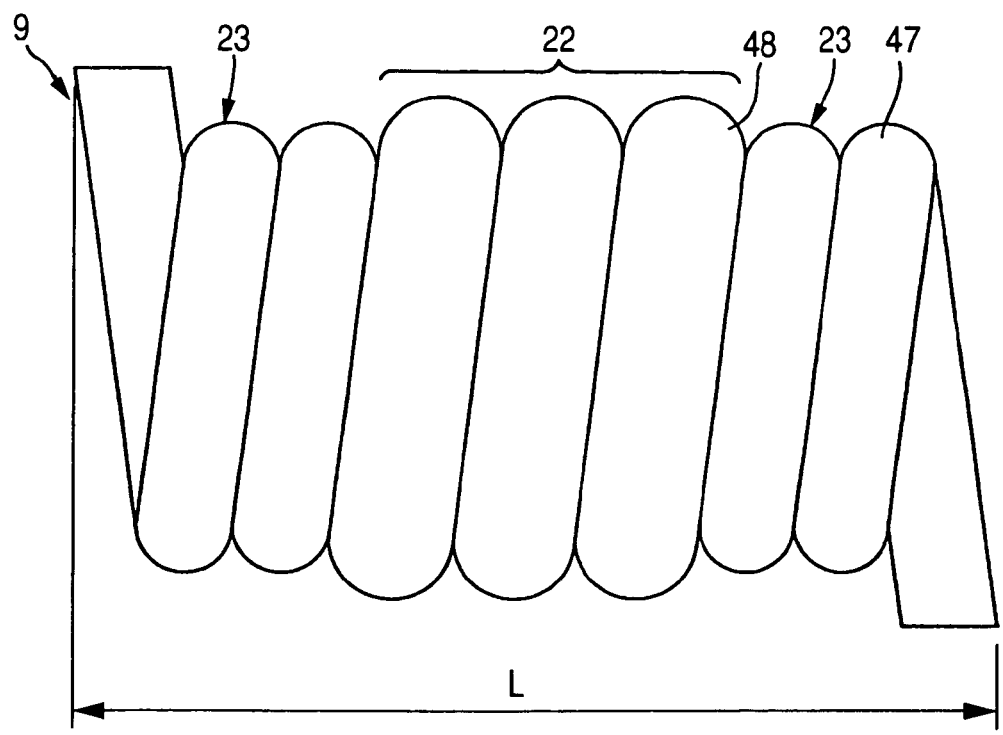
FIG. 28 shows an enlarged plan of the coil shown in FIG. 26.
Figure 29:
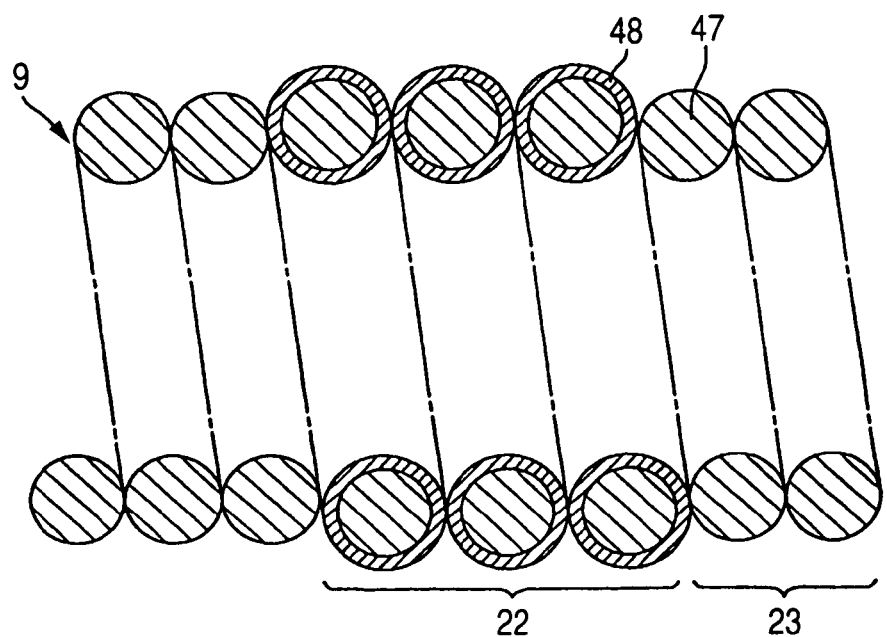
FIG. 29 shows an enlarged section of the coil shown in FIG. 26.
Figure 30:
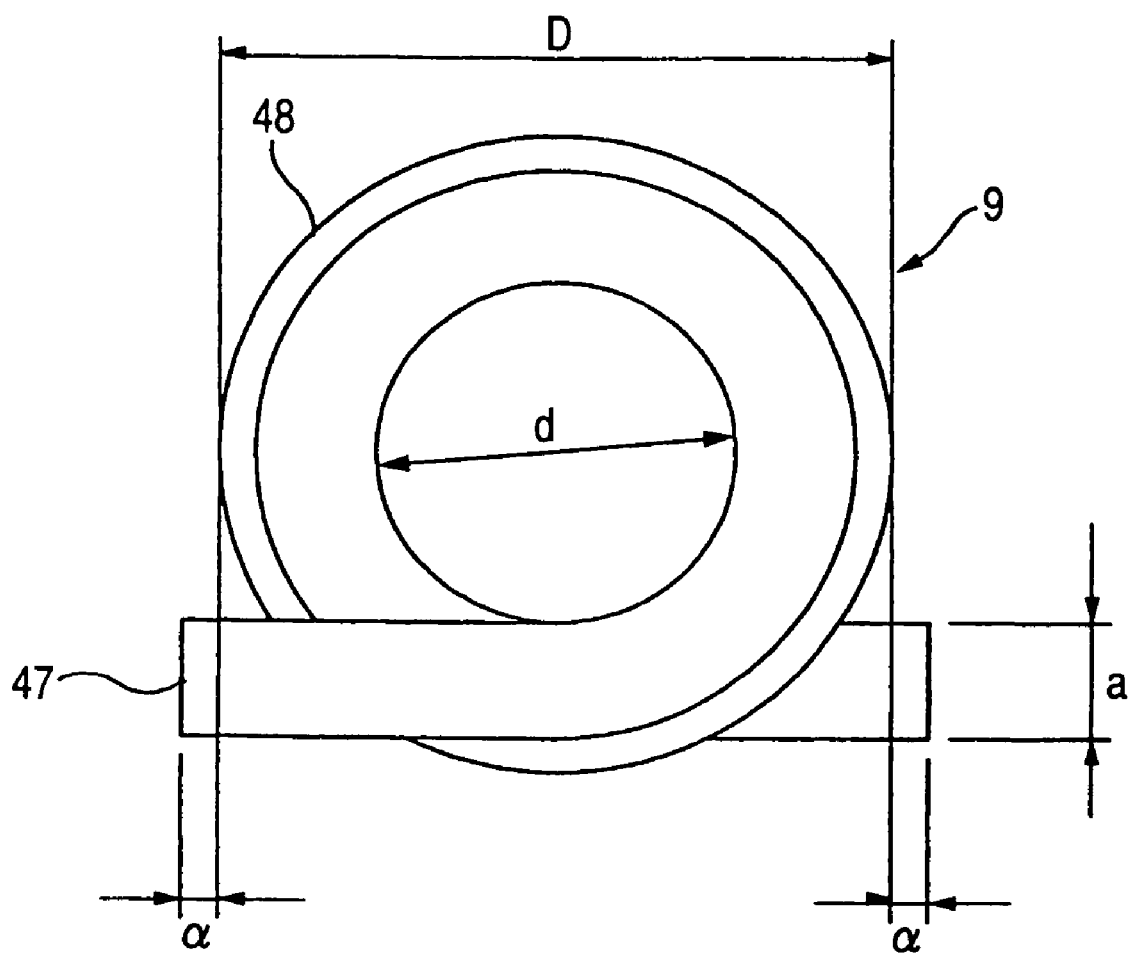
FIG. 30 shows an enlarged profile of the coil shown in FIG. 26.

FIG. 26 and FIG. 27 show the air core coil 9 of another structure in a state of being mounted over the module substrate 5 by the bulk feeder of this Embodiment 1, and this mounted air core coil 9 is shown in FIG. 28 through FIG. 30. As shown in FIG. 29, this air core coil 9 is produced by spirally winding a copper wire 47 whose surface is partly covered with an insulating film 48 of polyethylene or the like so that the winds be in contact with each other. As shown in FIG. 30, the diameter a of the copper wire 47 is, for instance, 0.1 mm and the bore d of the coil, for instance, 0.3 mm. As a result, the maximum diameter D of the coil is, for instance, 0.56 mm. The protruding length α of the ends of the coil from, the maximum diameter D of the coil ranges from about 0 through 30 μm. Further, as shown in FIG. 29, the (overall) length of the air core coil 9 is about 0.8 mm.

In this air core coil 9, three winds constitute an inductor portion 22 and electrodes 23 at both ends consist of about two winds each. The inductance or the connection lengths of the electrodes can be varied by altering the pertinent number of winds. FIGS. 31(a) and 31(b) respectively show the air core coils 9 of which the inductor portion 22 consists of two winds and one wind.

This Embodiment 1 has the following advantages.

(1) The air core coil 9 is lower in D.C. resistance than a chip inductor. Therefore, when used as an inductor to be connected to the final amplifying stage of a multi-stage amplifying line, it can contribute to reducing the D.C. loss and increasing the impedance. For this reason, the feedback of high frequency signals from the final amplifying stage to the preceding amplifying stages can be reduced, and the oscillation margin can be improved. A mobile telephone into which a high frequency power amplifying device of this Embodiment 1, improved in oscillation margin, is ameliorated in speech communication performance. To cite an example of using the coil of this Embodiment 1, the output is enhanced by +0.1 dB and the power efficiency, by about +1%, while the loss on the power supply line can be reduced by 0.1 dB.

(2) Since the source voltage fed to two amplifying lines in the dual band configuration is in crossed connection, the feedback of leak signals to the first amplifying stage from subsequent amplifying stages (especially the final amplifying stage) via the power supply line can be suppressed, and accordingly the oscillation margin can be improved. The oscillation margin is further improved by the use of the air core coil stated in (1) above.

(3) Since the air core coil 9 is configured by spirally and densely winding the copper wire 47 whose surface is covered with the insulating film 48, its manufacturing cost is very low, from about 1/7 to 1/2 of that of a conventional chip inductor. Accordingly, the cost can be reduced to 1/7 compared with the expensive chip inductor connected to the final amplifying stage. If chip inductors used in other parts are replaced with air core coils according to the invention, the cost can be reduced to 1/2. This can result in a corresponding reduction in the cost of the high frequency power amplifying device. Therefore, the manufacturing cost of a mobile telephone (wireless communication device) into which this high frequency power amplifying device is incorporated can be reduced likewise.

(4) As the air core coil 9 measures about 0.56 mm in maximum outer diameter and 0.9 mm in length, its packaged length is shorter than that of the chip inductor of 0.5 mm in width and height and 1 mm in length.

(5) Mounting of the air core coil 9 using the bulk feeder 21 in the manufacture of the high frequency power amplifying device has the following advantages.

① Among the electronic components to be mounted over the module substrate 5, the air core coil 9, which is the tallest, is packaged after the mounting of the other electronic components. Therefore, the collet 32 which holds the air core coil 9 by vacuum suction comes into contact with none of the electronic components already mounted over the module substrate 5, and can have no adverse effect on the mounting of these other electronic components, resulting in an enhanced packaging yield.

② The leading one of the air core coils 9 transferred to the bulk feed section 12 of the bulk feeder 21 and aligned in tandem, after being held by the collet 32 by vacuum suction, is carried to a prescribed position over the module substrate 5, followed by melting of the solder 24 provided in advance on the module substrate 5 and the air core coil 9 by temporary heating, no faulty holding by the collet 32 by vacuum suction, which could be caused by catching of the following air core coil 9 by the leading air core coil 9, can occur because the leading air core coil 9 is fed separated from the following air core coil 9 in the bulk feed section, resulting in accurate and secure packaging and in efficient mounting operation. Therefore, faulty mounting or machinery stop can scarcely occur, making possible a reduction in mounting cost.

③ In the hopper portion, as the wall thickness of the cylindrical feed shaft 18 is thinner, there is no possibility of any air core coil 9 (fed in bulk) to ride on the upper end of the feed shaft 18 and to stop it, resulting in steady feeing of air core coils 9 to the bulk feed section.

④ In the hopper portion, the positional relationship is such that, in a state in which the guide 16 is at its lowest, there can arise no gap between the outer circumference of the feed shaft 18 and the frustum concave 15 of the guide 16 in which the bulk could be caught, with the result that no air core coil 9 can be caught between the outer circumference of the feed shaft 18 and the frustum concave 15 of the guide 16. Therefore, the air core coils 9 can be prevented from deformation, and no deformed air core coil 9, if any, can be packaged, making possible an enhanced packaging yield. It is also made possible to stably feed air core coils 9 to the bulk feed section.

⑤ As the guide hole 17 of the feed shaft 18 has a large round section, no air core coil 9 can clog the guide hole 17, making it possible to stably feed air core coils 9 to the bulk feed section.

⑥ As the conveyor rail 13 is formed of a single seamless member, no air core coil 9 can be caught on the way of the guide hole 17a, making it possible to stably feed air core coils 9 to the bulk feed section.

⑦ Since the leading air core coil 9 moving in the guide hole 17a enters the receptacle 40 of the slider 26 in the bulk feed section 12 of the bulk feeder 21 and, after the slider 26 operates to separate the leading air core coil 9 from the following air core coil 9, the shutter 31 opens to ready the leading air core coil 9 for feeding, the leading air core coil 9 is accurately and securely held by the collet 32 by vacuum suction. Therefore, air core coils 9 can be accurately and securely mounted (package).

⑧ The advantages stated in ① through ⑦ above make it possible for electronic components including air core coils 9 to be stably mounted by using the bulk feeder 21 and so forth of this Embodiment 1.

(6) It is possible to provide a high frequency power amplifying device (hybrid integrated circuit device) excelling in high frequency characteristics, enabling the output and efficiency to be enhanced and the manufacturing cost to be reduced, and a mobile telephone (electronic device) into which this high frequency power amplifying device (hybrid integrated circuit device) is incorporated can be provided. Also, as the high frequency power amplifying device is improved in oscillation margin, the speech communication performance of the mobile telephone is ameliorated.

(7) It is possible to provide a high frequency power amplifying device (hybrid integrated circuit device) into which air core coils lower in D.C. resistance are packaged and a mobile telephone (electronic device) into which this high frequency power amplifying device (hybrid integrated circuit device) is incorporated.

(8) It is possible to provide a bulk feeder 21 capable of packaging air core coils 9 or the like in bulk over a wiring board accurately and securely.

To add, the bulk feeder according to the invention is also able to feed other items than air core coils, which would be otherwise liable to be intertwisted between units being transferred as air core coils would be. Obviously it can also feed chip components such as chip resistors and chip capacitors.

EMBODIMENT 2

Figure 32:
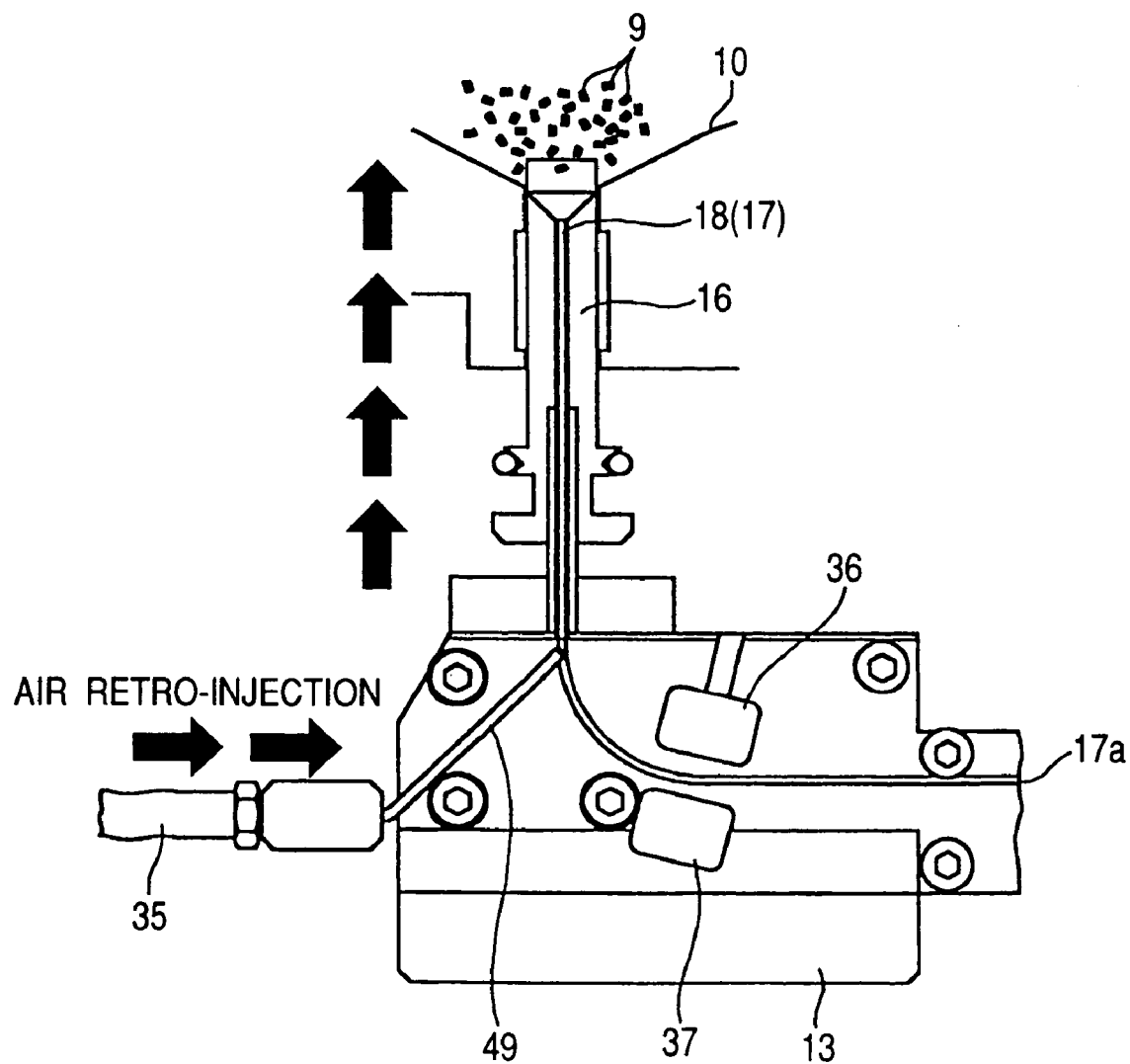
FIG. 32 shows a partial typical view of part of a bulk feeder, which is another embodiment of the invention (Embodiment 2).

FIG. 32 shows a partial typical view of part of the bulk feeder 21, which is another preferred embodiment of the invention (Embodiment 2). As shown in FIG. 32, there is provided an air feed path 49 communicating with the pipe 35. This air feed path 49 communicates to the guide hole 17 of the feed shaft 18 and, as shown in FIG. 32, blows air into guide hole 17. This enables any clogging of the guide hole 17 with an air core coil 9 to be easily eliminated.

EMBODIMENT 3

FIG. 45 through FIG. 54 pertain to the manufacture of a high frequency power amplifying module, which is another preferred embodiment of the invention (Embodiment 3).

This Embodiment 3 concerns a technique by which coils (air core coils) can be mounted over a module substrate without deviation in positioning.

In mounting an air core coil, electrodes at the both ends of the air core coil are superposed over electrode fixing pads on the module substrate, followed by fixing of the electrode portions onto the electrode fixing pads by reflowing solder applied in advance over the surfaces of the electrode fixing pads. It was found that, in this fixing process, there might occur a faulty phenomenon that the air core coil 9 deviates from its due position as shown in FIG. 52(c). Even if the electrodes 23 of the air core coil 9 are correctly superposed over the electrode fixing pads 4b provided on the surface of the module substrate 5, positional deviation may occur during the subsequent reflowing process, resulting in the deviation of the electrodes 23 from the electrode fixing pads 4b as shown in FIG. 52(c). Coils whose deviation is equal to or more than ⅓ of the coil diameter account for as many as 7% of the total. Of this air core coil 9, two winds at each end constitute an electrode 23 and the winds in-between make up the inductor portion 22 whose surface is covered with an insulator.

Figure 53:
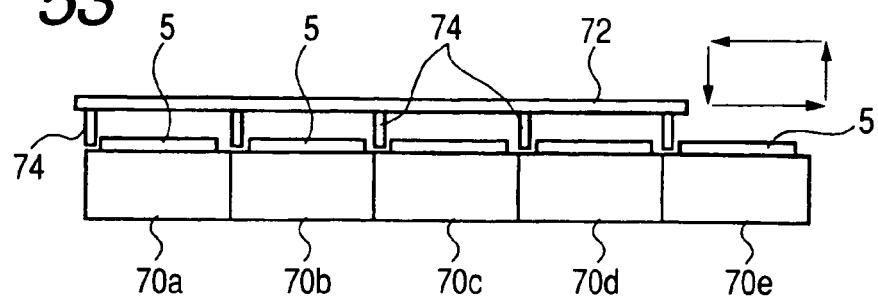
FIG. 53 shows a typical front view of a reflowing furnace for use in this Embodiment 3.
Figure 54:
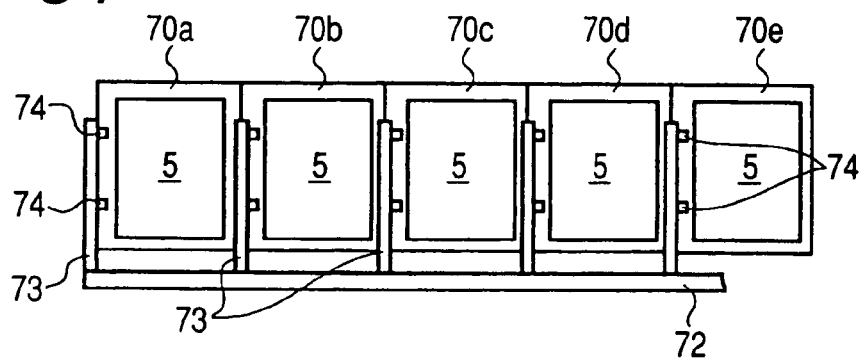
FIG. 54 schematically shows a typical plan of the reflowing furnace.

Reflowing of the solder 24 (dotted parts) is accomplished by using a reflowing furnace shown in FIG. 53 and FIG. 54. This reflowing furnace has a structure in which five heating tables (heat blocks) 70a through 70e for mounting the object of heating are arranged in a row.

On one side of the row of heat blocks is arranged a linking arm 72 of a transfer mechanism, which is partly shown in the drawing. This linking arm 72, as indicated by a group of arrows in FIG. 53, moves in a rectangle formed by downward, right forward, upward and left backward directions.

Further, as shown in FIG. 54, arms 73 protrude from the inner side of the linking arm 72 to match the heat blocks, and two transfer claws 74 protrude downwards from each of these arms 73.

Therefore, the rectangular movement of the linking arm 72 causes the object of heating, i.e. the module substrate 5, over the heat blocks 70a through 70e to be transferred by one pitch at a time. The feeding of the module substrate 5 to the first heat block 70a is accomplished by a loader (not shown) From the final heat block 70e, the module substrate 5 is discharged by the transfer claws 74 to an unloader section.

In the heat blocks 70a through 70e, the first three heat blocks 70a through 70c are heat blocks for preheating, whose heating temperature successively rises, for instance, from 70° C. to 130° C. and 195° C. The fourth heat block 70d is for regular heating, and is maintained, for instance, at 275° C. to be able to melt the solder 24 (Pd—SnSb) having a melting point of 238° C. The final heat block 70e is for post heating, kept, for instance, at 150° C. to gradually cool the module substrate 5 consisting of a ceramic wiring board.

Therefore, the module substrate 5 sequentially moved by the transfer claws 74 from one to another of zones each consisting of a heat block is successively raised in temperature, and undergoes solder reflowing over the fourth zone, i.e. the fourth heat block 70d for regular heating.

It was found, however, that such a reflowing process caused the electrodes 23 of the air core coil 9, formed of a copper wire, to be oxidized by the heating, the wetting performance of the solder to deteriorate, and the surface tension of the solder to repel the coil to invite positional deviation. Thus, as shown in FIG. 52(a), when the electrodes 23 of the air core coil 9 are superposed over the electrode fixing pads (lands) 4b of the module substrate 5 and then subjected to reflowing, those whose surfaces are oxidized become more difficult to be wetted by the molten and swollen solder as shown in FIG. 52(b). The electrodes 23 are instead repelled by the solder, and the air core coil 9 rolls down as if falling on a slope, resulting in the positional deviation shown in FIG. 52(c).

Figure 45:
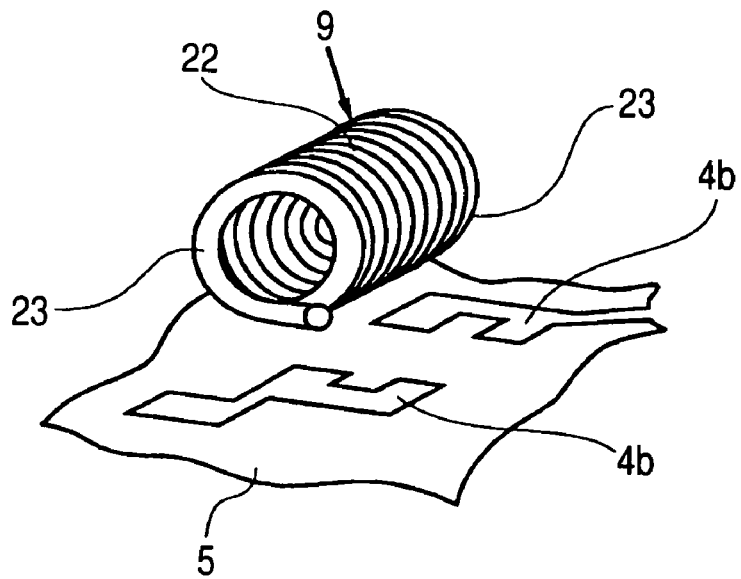
FIG. 45 shows a typical perspective view of the correlation between a coil and electrodes for fixing the coil in a high frequency power amplifying module, which is another embodiment of the invention (Embodiment 3).

In view of this finding, the present inventor patterned the electrode fixing pads 4b provided on the surface of the module substrate 5 in a U shape as shown in FIG. 45, so that the cylindrical air core coil 9 may not roll.

Figure 46:
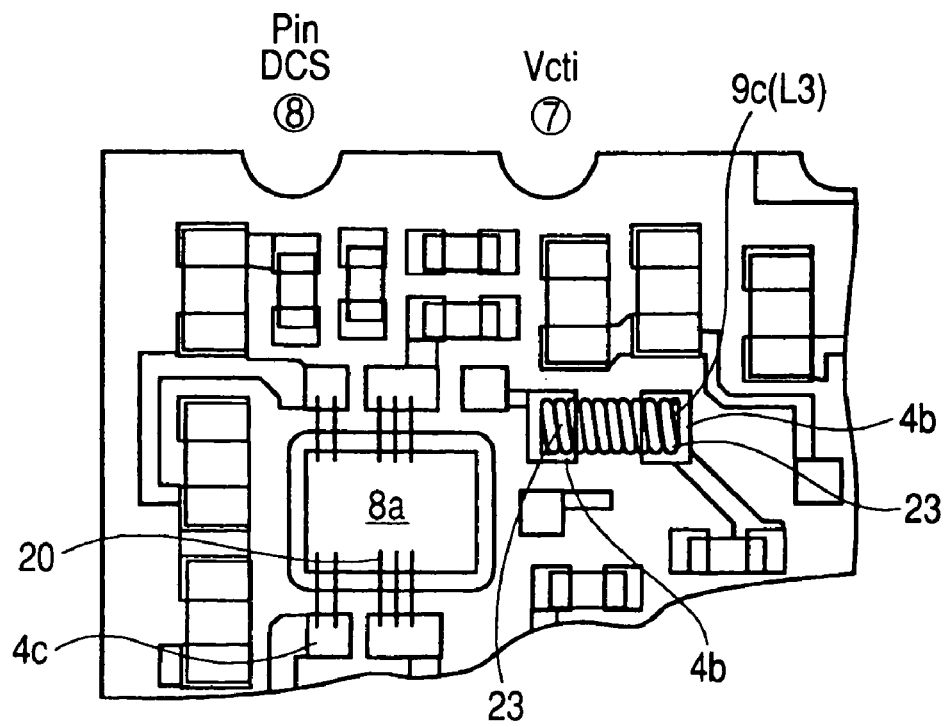
FIG. 46 shows a plan of part of the high frequency power amplifying module, which is this Embodiment 3.

The high frequency power amplifying module of this Embodiment 3 differs from the high frequency power amplifying module of Embodiment 1 only in the pattern of the electrode fixing pads 4b for fixing the electrodes 23 of the air core coil 9, but the same as Embodiment 1 in other respects. FIG. 46 shows a plan of part of the high frequency power amplifying module of this Embodiment 3.

Further, FIG. 47 show the mounted state of the coil in this Embodiment 3. FIG. 47(a) is a typical plan showing the opposite arrangement of the U-patterned electrode fixing pads 4b, over which the electrodes 23 at the both ends of the air core coil 9 are fixed with the solder 24 (dotted parts in the drawing). FIG. 47(b) shows a profile and FIG. 47(c), a section.

It might be relevant here to describe the structure of mounting the air core coil, which serves as an inductor. Over the main face of the module substrate 5 are formed a plurality of wiring lines. The module substrate 5 also has the electrode fixing pads 4b connected to those wiring lines and electrically connected to the electrodes 23 of the air core coil 9. Since there are two electrode fixing pads 4b, one may also be called a first electrode, and the other, a second electrode.

Each of the first and second electrodes has, in a planar view, a pattern comprising a first portion 4x extending in a first direction, a second portion 4y1 extending from one end of the first portion 4x in a direction substantially perpendicular to the first direction, and a third portion 4y2 extending from the other end of the first portion 4x in the second direction as shown in FIG. 47(a). Of the pair of electrode fixing pads 4b for fixing a single air core coil 9, the first and the second electrodes are so arranged that the second and third portions of each electrode face each other.

The inductor, i.e. the air core coil 9, has a coiled shape formed by spirally winding a wire whose surface is covered with an insulating film a plurality of rounds. The wire has at its two end portions exposed from the insulating film to constitute the electrodes 23. The spiral part, whose surface is covered with the insulating film, of the wire constitutes the inductor portion 22 while the two end portions make up the electrodes 23. One of the electrodes 23 is soldered onto the first electrode, and the other of the electrodes 23, to the second electrode.

The second portion 4y1 and the third portion 4y2 of each of the first and second electrodes extend to the insulating film-covered wire portions of the inductor. This arrangement ensures fixing of the electrodes 23 to the electrode fixing pads 4b with the solder 24.

Further, the second portion 4y1 and the third portion 4y2 of each of the first and second electrodes are separated in the first direction so that the air core coil 9 may not roll off.

Even if the structure is such that the second portion 4y1 and the third portion 4y2 extend in parallel or form a prescribed angle to each other, it can effectively prevent the air core coil 9 from rolling off. In order to prevent the air core coil 9 from rolling off and invite positional deviation, each of the electrode fixing pads 4b may as well be configured of the second portion 4y1 and the third portion 4y2 alone, with no first portion 4x.

Figure 48:
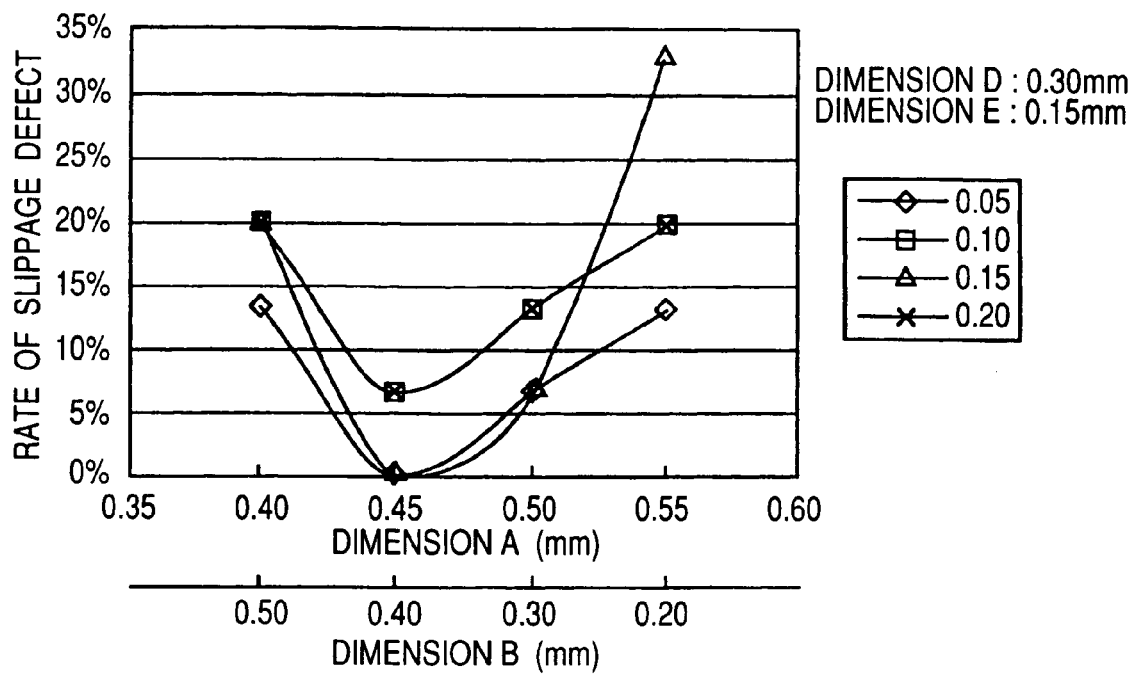
FIG. 48 is a graph showing the dependence of deviations in coil mounting on dimensional variations in different parts of the electrodes.
Figure 49:
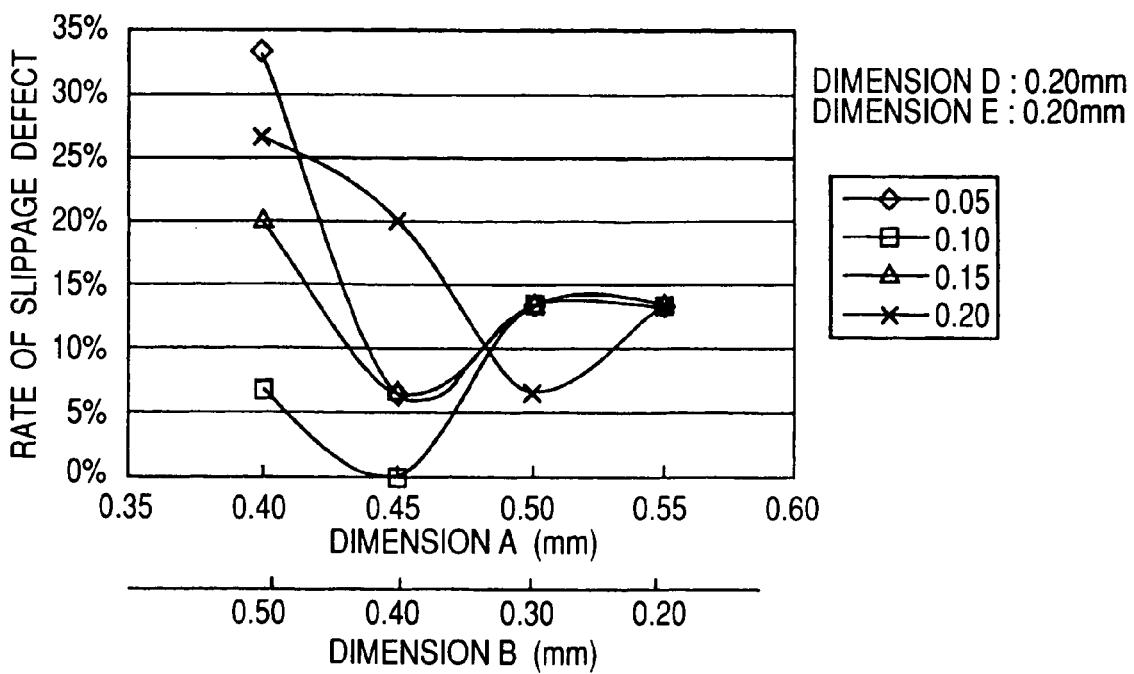
FIG. 49 is another graph showing the dependence of deviations in coil mounting on dimensional variations in different parts of the electrodes.

At the same time, the present inventor studied the dimensional dependence of the U-shaped electrode fixing pads 4b. The results of the study are shown in the graphs of FIG. 48 and FIG. 49. As shown in FIG. 47(a), the lengths of the second portion 4y1 of the first electrode and the second electrode are represented by A; the spacing between the first electrode and the second electrode, by B; the length of the second portion 4y1 protruding from the first portion 4x, by C; the length of the second portion 4y1 in the first direction, by E; and the spacing between the second portion 4y1 and the third portion 4y2, by D.

The graph of FIG. 48 shows the correlation among dimensions A and B and the rate of deviational fault when D is set to 0.30 mm and E, to 0.15 mm. The graph represents cases in which dimension C is 0.05 mm (the curve marked with ◇), 0.10 mm (the curve marked with □), 0.15 mm (the curve marked with Δ) or 0.20 mm (the curve marked with x). The curve of 0.10 mm and that of 0.20 mm are identical with each other.

The graph reveals that, irrespective of dimension C, the rate of fault is the lowest when dimension B is 0.40 mm and dimension A, 0.45 mm, both approximately. Alternatively, when dimension C is 0.05 mm or 0.15 mm, the deviational fault rate can be reduced to 0% when dimension B is 0.40 mm and dimension A, 0.45 mm, both approximately.

The graph of FIG. 49 is a similar one to the foregoing, with dimension D set to 0.20 mm and dimension E, to 0.20 mm.

Figure 50:
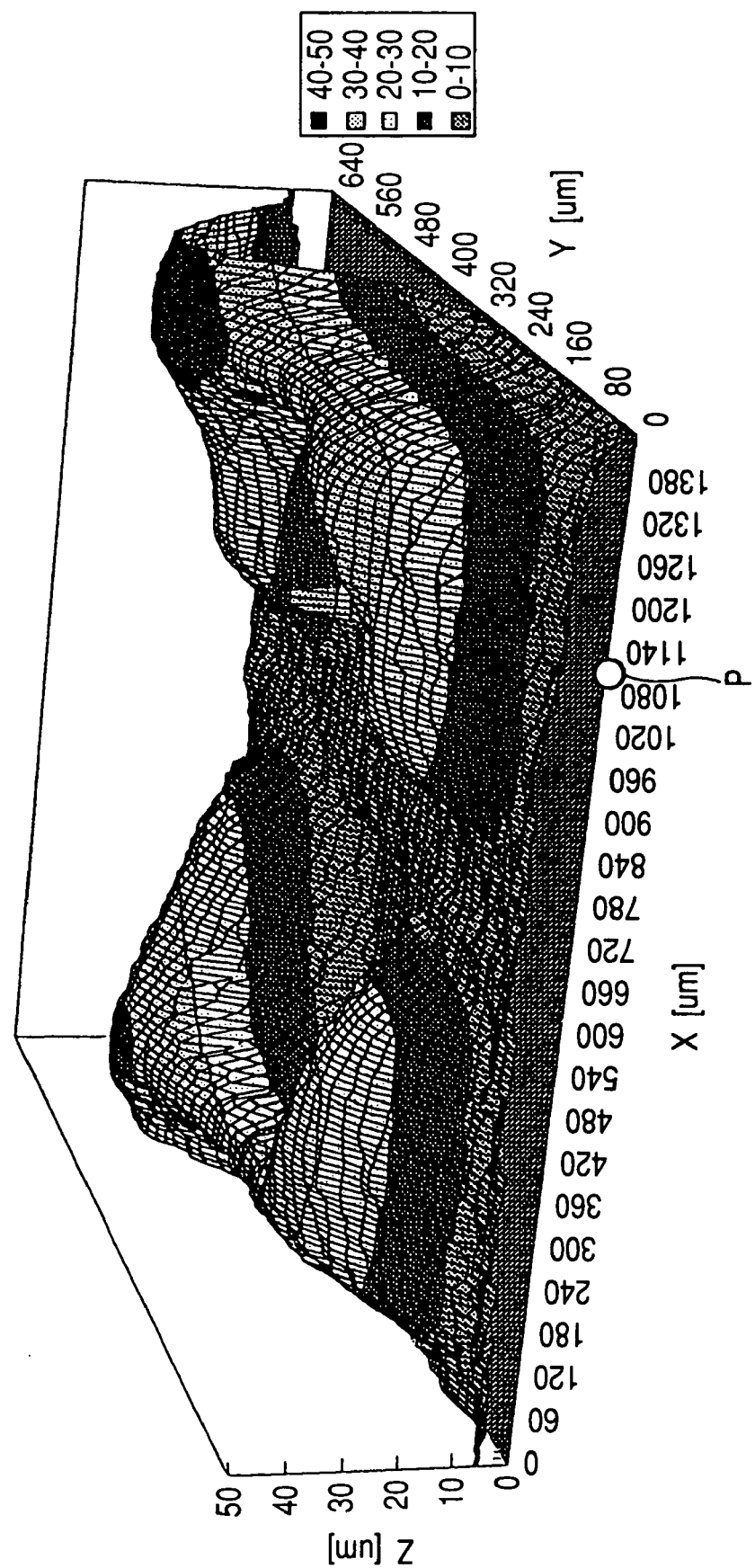
FIG. 50 shows a three-dimensional view of a state in which solder applied to electrodes on the module substrate is remelted.
Figure 51:
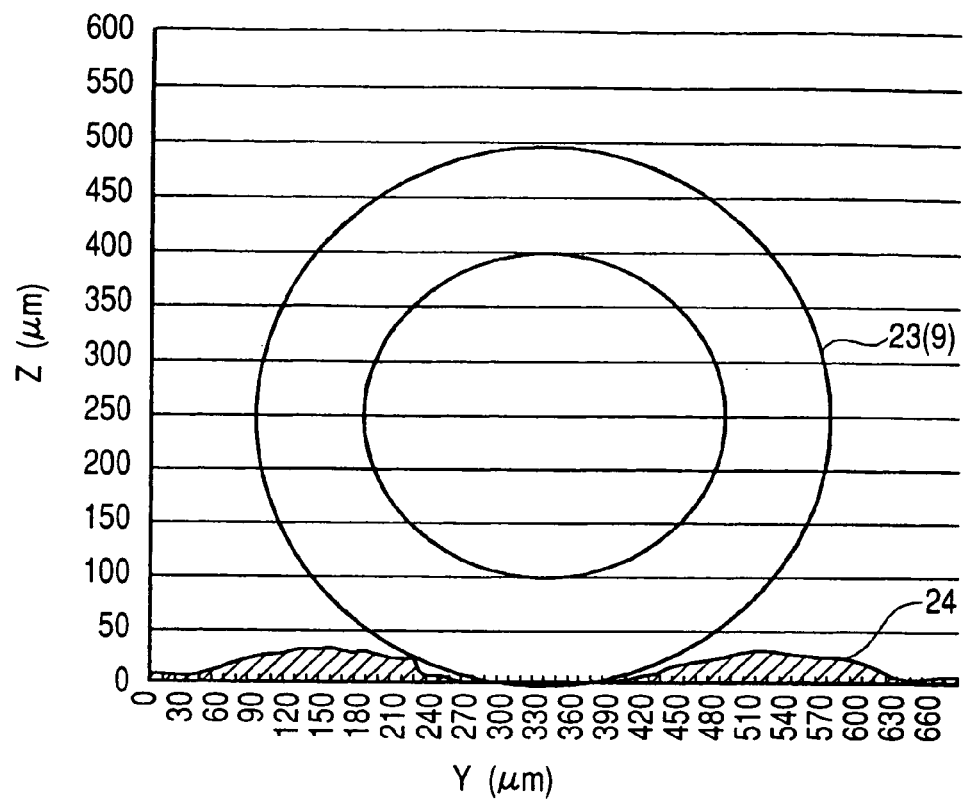
FIG. 51 shows a sectional view of the state in which solder applied to the electrodes on the module substrate is remelted.
Figure 52:
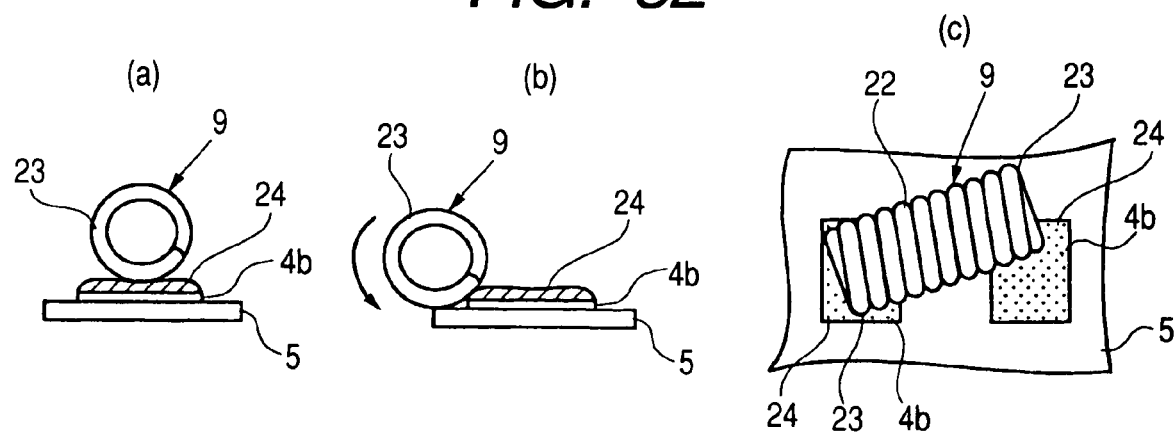
FIG. 52 illustrate a faulty case in which a coil is fixed to rectangular electrodes by reflowing.

FIG. 50 is a three-dimensional diagram depicting the state in which solder applied to the mutually opposite first and second electrodes (U-shaped electrodes) over the module substrate is remelted. FIG. 51 shows a sectional view of the 1110 μm position (P) in FIG. 50. It is vividly seen that surface variations of the solder 24 follow the outer diameters of the electrodes 23 of the air core coil 9.

The positioning of the center of the coil between such twin peaks of the solder 24 prevents the air core coil 9 from rolling off because it is stopped by the peaks of the solder on both sides of the electrodes 23 even if the electrodes 23 are subjected to the repelling force of the surface tension of the solder, and accordingly the mounting position of the air core coil 9 can be prevented from deviation. The faulty mounting rate of the air core coil 9 in this Embodiment 3 can be restrained to 1% or less.

In this Embodiment 3, the air core coil 9 is mounted over the module substrate 5 by using the reflowing furnace shown in FIG. 53 and FIG. 54. In these illustrations of the reflowing furnace, depiction of the air core coil 9 is dispensed with.

In the reflowing furnace, the module substrate 5 is intermittently fed over the heat blocks 70a through 70e by a transferring mechanism, and the air core coil 9 is reflow-mounted by preheating and regular heating. For instance, the transfer time is 3 seconds, and the module substrate 5 stays at halt over each heat block for 50 seconds. From the first through third zones, the heating temperature is successively raised, and in the fourth zone the solder 24 is remelted by regular heating. In the fifth zone, the temperature is gradually lowered to prevent the module substrate 5 consisting of a ceramic wiring board from being destroyed or damaged.

In this manner, satisfactory mounting of the air core coil 9 is made possible, with the electrodes 23 being prevented from coming off the electrode fixing pads 4b as shown in FIG. 46 and FIG. 47(a).

EMBODIMENT 4

Figure 55:
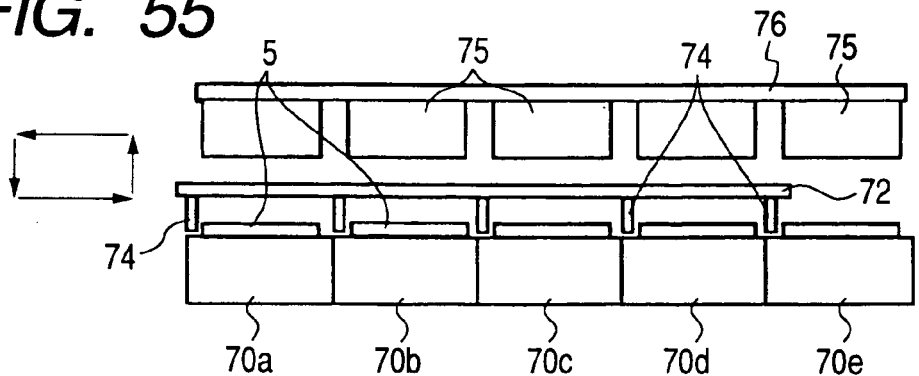
FIG. 55 schematically shows a typical front view of a reflowing furnace for mounting a coil in a high frequency power amplifying module, which is another Embodiment of the invention (Embodiment 4).
Figure 56:
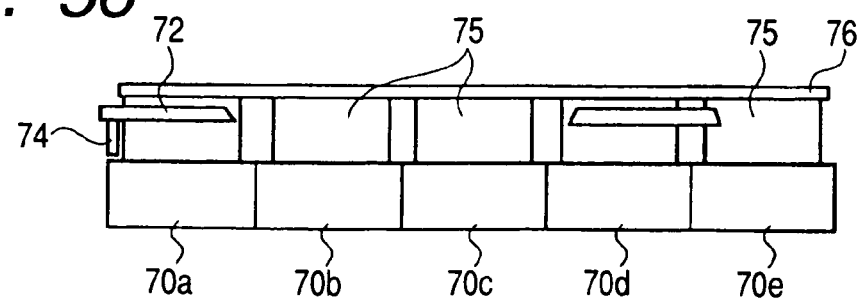
FIG. 56 shows a typical front view of the reflowing furnace in a state in which reflowing is carried out in a nitrogen ambience.

FIG. 55 through FIG. 58 pertain to the manufacture of a high frequency power amplifying module, which is another preferred embodiment of the present invention (Embodiment 4). FIG. 55 schematically shows a typical front view of a reflowing furnace; FIG. 56, a typical front view of the reflowing furnace in a state in which reflowing is carried out in a nitrogen ambience; and FIG. 57, a typical sectional view of a state in which reflowing is carried out in the nitrogen ambience.

Figure 58:
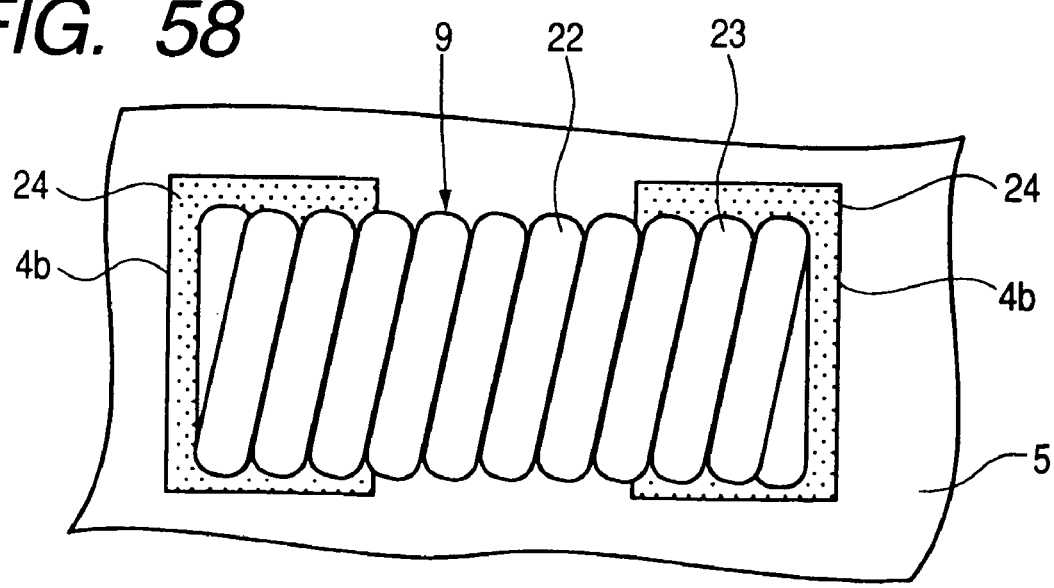
FIG. 58 shows a typical plan of a coil properly mounted by reflowing in a nitrogen ambience.

In this Embodiment 4, the electrode fixing pads 4*b* for mounting the electrodes 23 of the air core coil 9 are, as shown in FIG. 58, rectangular instead of being U-shaped. However, in order to prevent the surface of the electrodes 23 of the air core coil 9 from being oxidized by heating, the reflowing is carried out in an ambience of inert gas. For instance, nitrogen ($N_2$) gas is used as the inert gas.

For this reason, the reflowing furnace has, as shown in FIG. 55, inert gas supply boxes 75 capable of covering the module substrate 5 from above so that the module substrate 5 can be placed in a nitrogen ambience during the reflowing process except when the module substrate 5 is being transferred. A number of such inert gas supply boxes 75 are made ready to match the different zones, and are supported by a lifting arm 76. This lifting arm 76 is hollow inside, and has a configuration that permits injection of nitrogen gas from the ceiling of each inert gas supply box 75. For greater mechanical strength, a separate nitrogen gas supply pipe may be provided in addition to the lifting arm 76.

Figure 57:
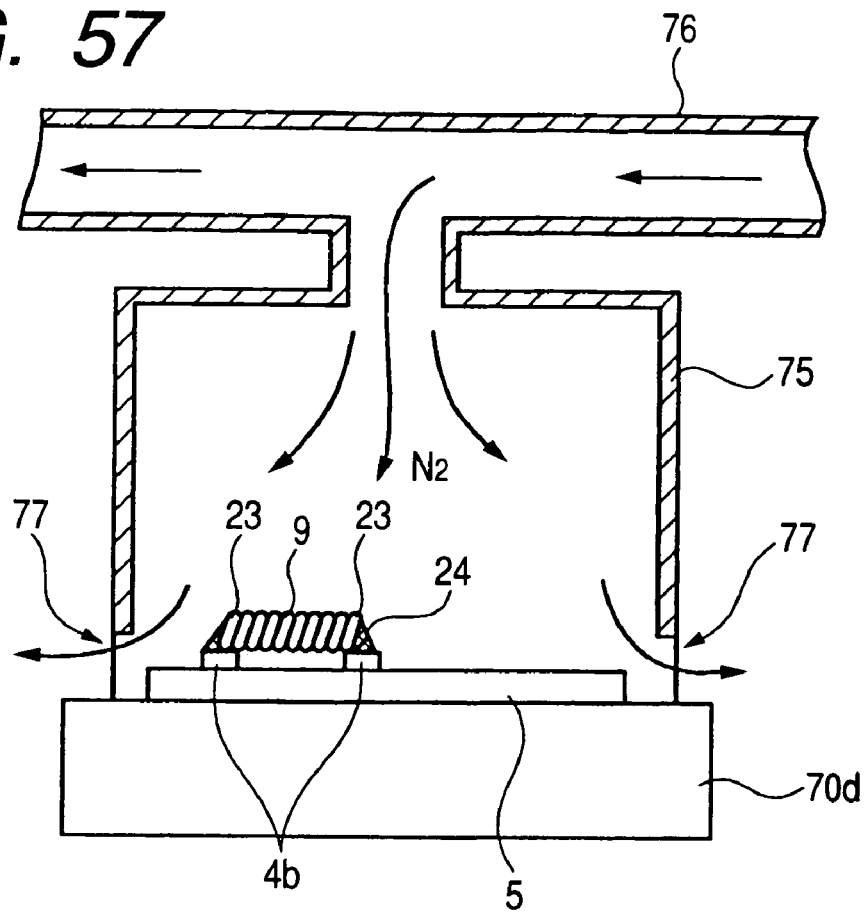
FIG. 57 shows a typical sectional view of a state in which reflowing is carried out in the nitrogen ambience.

When the module substrate 5 is transferred by the transfer claws 74, the lifting arm 76 is positioned upwards so that the arm and the claws may not interfere with each other, and when the transfer claws 74 is at halt at the left end, the arm comes down as shown in FIG. 56 and FIG. 57, and blows the nitrogen gas blown out of the hollow part of the lifting arm 76 against the main face of the module substrate 5. The electrodes 23 at the both ends of the air core coil 9 mounted over the main face of the module substrate 5 are fixed in the nitrogen gas ambience with the solder 24 applied to the surfaces of the electrode fixing pads 4*b* of the module substrate 5. For instance, the module substrate 5 is transferred for 3 seconds, and is heated in the nitrogen gas ambience for 50 seconds.

As a result, the copper surfaces of the electrodes 23 of the air core coil 9 becomes hardly oxidizable. Therefore, as the electrodes 23 are not repelled but wetted by the molten solder, the air core coil 9 is fixed to the electrode fixing pads 4*b* without positional deviation. FIG. 58 shows a state in which the electrodes 23 of the air core coil 9 are fixed to the electrode fixing pads 4*b* by the solder 24. The air core coil 9 is formed in 10 winds, of which six constitute the inductor portion 22 and two each, one or the other of the electrodes 23, though it is not limited to this configuration.

To add, though the bottom edges of the inert gas supply box 75 may be in direct contact with either the upper faces of the heat blocks or the main face the module substrate 5, they partly need prescribed gaps 77 to let nitrogen gas leak out (see FIG. 57).

The faulty mounting rate of the air core coil 9 in this Embodiment 4 can be restrained to 1% or less.

Although the invention by the present inventor has been described in specific terms with reference to the preferred embodiments thereof, it goes without saying that the invention is not limited to these embodiments, but can be modified in various ways without deviating from its essentials.

While the invention is applied to high frequency power amplifying devices of three-stage configurations in the foregoing embodiments, it can be similarly applied to high frequency power amplifying devices of other configurations. For instance, it can be applied with similar advantages to a two-stage high frequency power amplifying module consisting of the first stage semiconductor amplifying element and the final stage semiconductor amplifying element.

Although the foregoing description mainly referred to the application of the invention by the present inventor to a mobile telephone, which is the background area of the intended utilization of the invention, the application is not limited to this area, but can as well be applied to other electronic devices and other semiconductor devices (hybrid integrated circuit devices).

INDUSTRIAL APPLICABILITY

As hitherto described, the high frequency power amplifying device pertaining to the present invention can be used as a power amplifier for various wireless communication devices including mobile communication terminals, such as mobile telephones. The invention can also provide a wireless communication device permitting stable speech communication. Furthermore, the invention can contribute to reducing the manufacturing costs of high frequency power amplifying devices and wireless communication devices by enhancing the manufacturing yields of high frequency power amplifying modules and wireless communication devices.

The inveniton claimed is:

1. A semiconductor device comprising:
    a module substrate having on its main face a plurality of wiring lines; and
    a plurality of electronic components including an inductor mounted over said main face of said module substrate,
    wherein said plurality of electronic components are electrically connected to one another by said plurality of wiring lines to constitute a high frequency power amplifying circuit,
    wherein said inductor has a shape of an air core coil comprised of a wire whose surface is covered with an insulating film and which is spirally wound in a plurality of rounds,
    wherein both ends of said air core coil are positioned on said main face of said module substrate, and both electrodes of said air core coil are fixed to said wiring lines of said module substrate with solder,
    wherein said wire has at its end parts exposed from said insulating film, and
    wherein the plurality of wiring lines of said module substrate are electrically connected in the parts of said wire exposed from said insulating film.

2. The semiconductor device according to claim 1, wherein said coil is formed by spirally and densely winding a copper wire of about 0.1 mm in diameter to an inner diameter of about 0.3 mm and its both ends constitute electrodes each comprised of one to a plurality of winds of copper wire where said insulating film is absent.

3. An electronic device formed by incorporating the semiconductor device according to claim 1.

4. A semiconductor device comprising:
    a module substrate having on its main face a plurality of wiring lines, and a first electrode and a second electrode electrically connected to said plurality of wiring lines; and a plurality of electronic components including an inductor mounted over said main face of said module substrate wherein said inductor has a shape of an air core coil comprised of a wire whose surface is covered with an insulating film and which is spirally wound in a plurality of rounds, wherein both ends of said air core coil are positioned on said main face of said module substrate, and both electrodes of said air core coil are fixed to said wiring lines of said module substrate with solder, wherein said wire has at its both ends parts exposed from said insulating film, each of said first and second electrodes has, in a planar view, a first portion extending in a first direction, a second portion extending from one end of said first portion in a direction substantially perpendicular to said first direction, and a third portion extending from the other end of said first portion in said second direction, wherein said first and second electrodes are so arranged that the second and third portions of each electrode face each other, wherein said inductor is so arranged that its part exposed from said insulating film is positioned over said first electrode and second electrode, wherein said inductor is joined to said first and second electrodes with solder, and wherein the second and third portions of each of said first and second electrodes extend to the wire part of said inductor covered with the insulating film.

5. The semiconductor device according to claim 4, wherein the second and third portions of each of said first and second electrodes are separated in said first direction.

6. The semiconductor device according to claim 4, wherein said inductor is formed by spirally and densely winding a copper wire of about 0.1 mm in diameter to an inner diameter of about 0.3 mm and its both ends constitute electrodes each comprised of one to a plurality of winds of copper wire where said insulating film is absent.

* * * * *